United States Patent
Ooishi et al.

(10) Patent No.: US 6,636,110 B1
(45) Date of Patent: *Oct. 21, 2003

(54) INTERNAL CLOCK GENERATING CIRCUIT FOR CLOCK SYNCHRONOUS SEMICONDUCTOR MEMORY DEVICE

(75) Inventors: Tsukasa Ooishi, Hyogo (JP); Narumi Sakashita, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 4 days.

(21) Appl. No.: 09/300,850

(22) Filed: Apr. 28, 1999

(30) Foreign Application Priority Data

May 1, 1998 (JP) .......................... 10-122272

(51) Int. Cl.[7] ................................ H01L 25/00
(52) U.S. Cl. .................................. 327/565; 327/295
(58) Field of Search .................. 327/2, 141, 161, 327/163, 261, 270, 295, 565

(56) References Cited

U.S. PATENT DOCUMENTS

| | | | | |
|---|---|---|---|---|
| 5,122,693 A | * | 6/1992 | Honda et al. ............... 307/480 |
| 5,307,381 A | * | 4/1994 | Ahuja ......................... 375/107 |
| 5,319,755 A | | 6/1994 | Farmwald et al. .......... 710/104 |
| 5,656,963 A | * | 8/1997 | Masleid et al. ............. 327/297 |
| 5,822,573 A | * | 10/1998 | Saeki et al. ................. 713/503 |
| 5,838,204 A | * | 11/1998 | Yao ............................. 331/1 R |
| 5,880,998 A | * | 3/1999 | Tanimura et al. ....... 365/189.05 |
| 6,069,508 A | * | 5/2000 | Takai .......................... 327/153 |
| 6,259,288 B1 | * | 7/2001 | Nishimura ................... 327/156 |

FOREIGN PATENT DOCUMENTS

JP          9-6463         1/1997

* cited by examiner

Primary Examiner—Timothy P. Callahan
Assistant Examiner—Cassandra Cox
(74) Attorney, Agent, or Firm—McDermott, Will & Emery

(57) ABSTRACT

To input buffers included in a peripheral pad group inputting an external signal and a DQ pad group for data input/output, clock signals from a synchronizing circuit are transmitted through a clock distributing circuit having a plurality of clock transmission nodes arranged in a shape of a tree. The synchronizing circuit accomplishes phase synchronization between a signal from a node nearest to the clock distributing circuit with an external clock signal. Thus, a skew in clock signals applied to the input and output buffers can be eliminated.

27 Claims, 26 Drawing Sheets

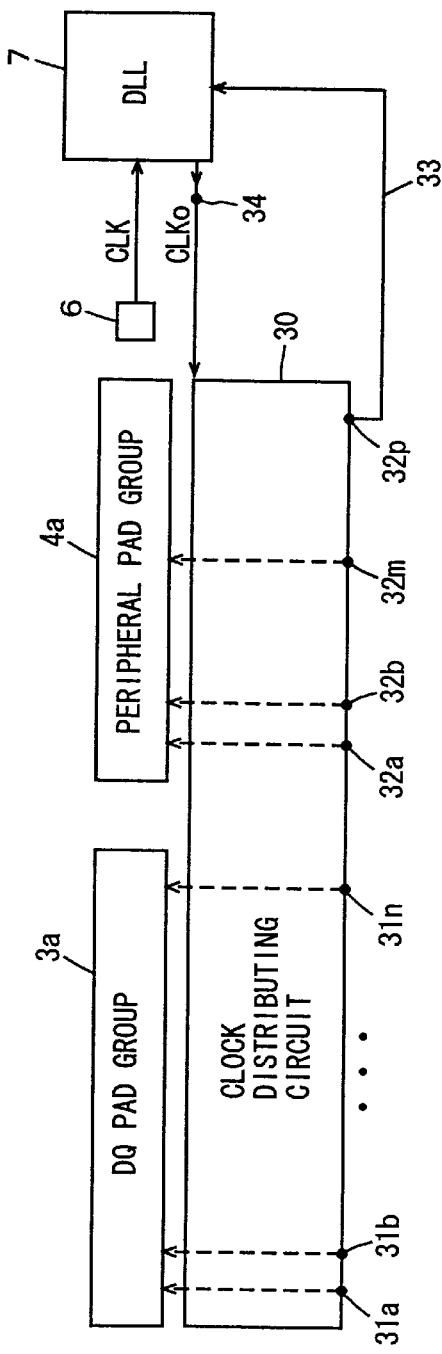
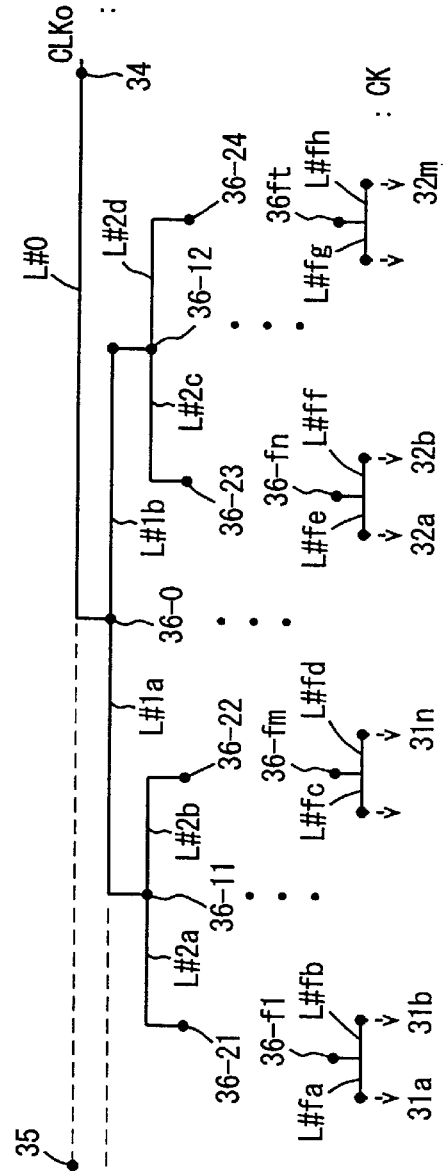

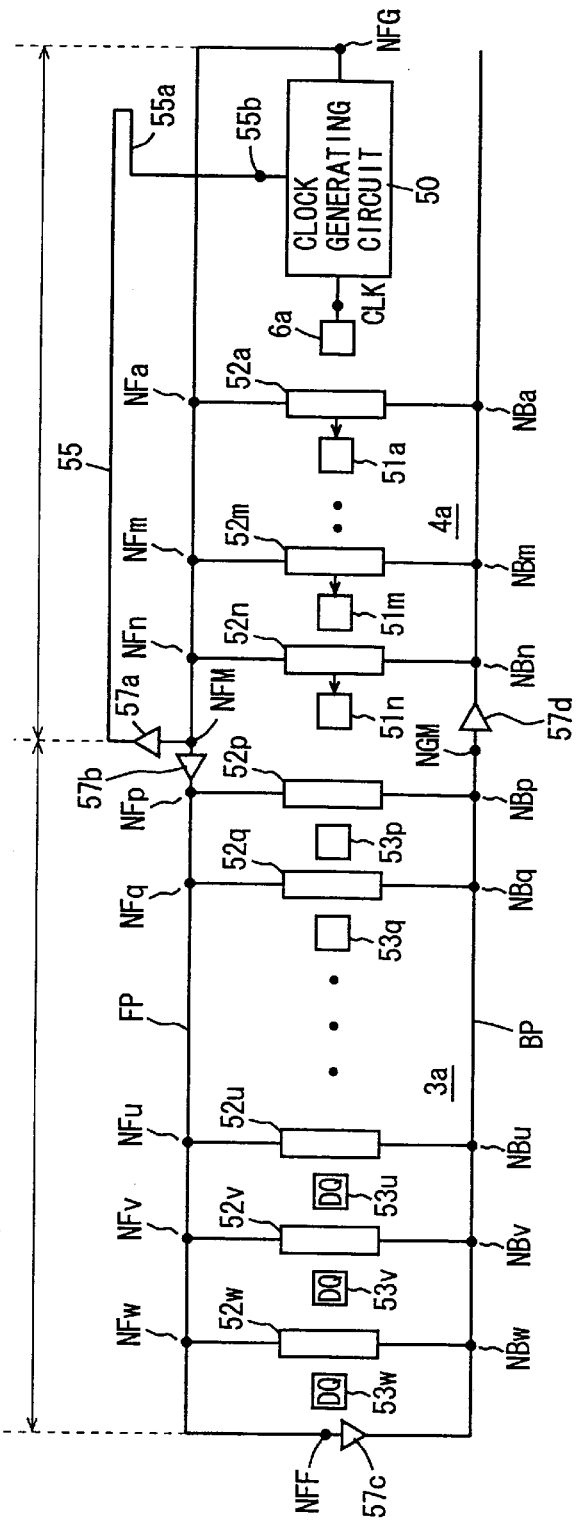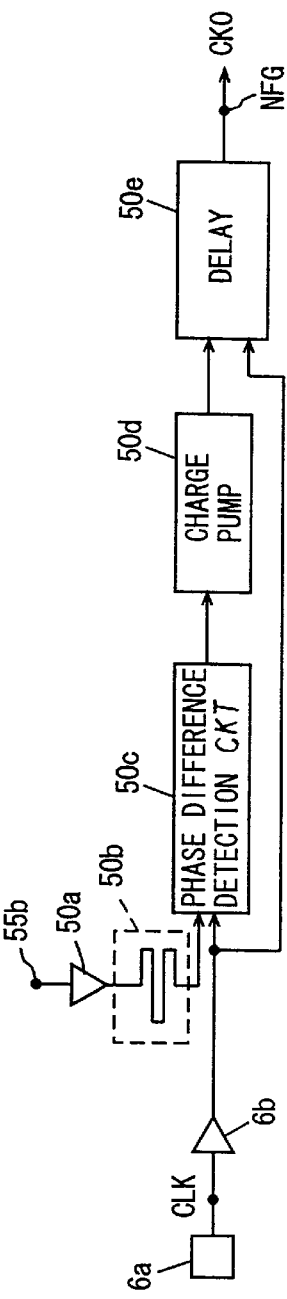
FIG. 11A
FIG. 11B

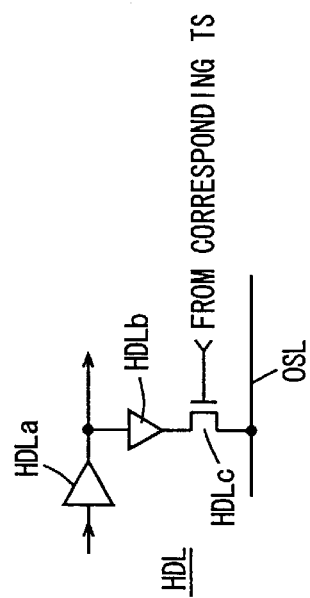
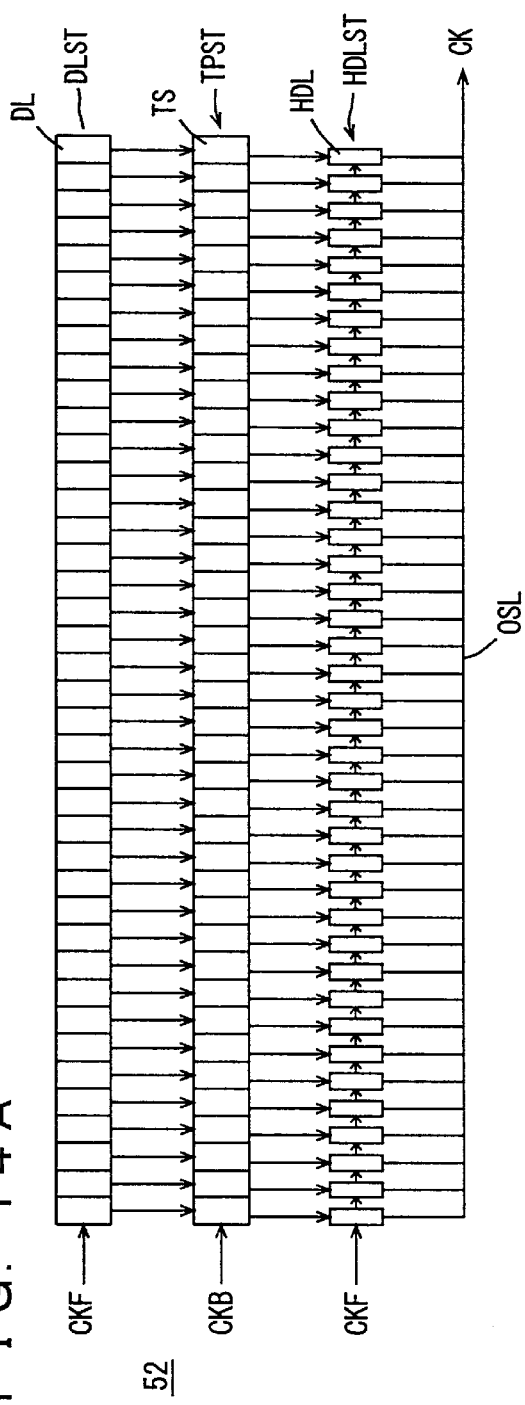
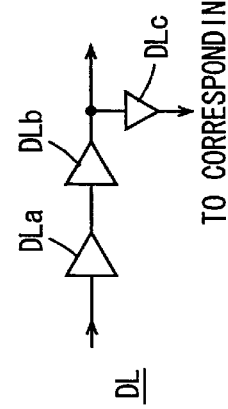
FIG. 14A
FIG. 14B
FIG. 14C (LARGE DELAY)

(SMALL DELAY)

TO OUTPUT BUFFER GROUP
BY 1/2 RETURNING

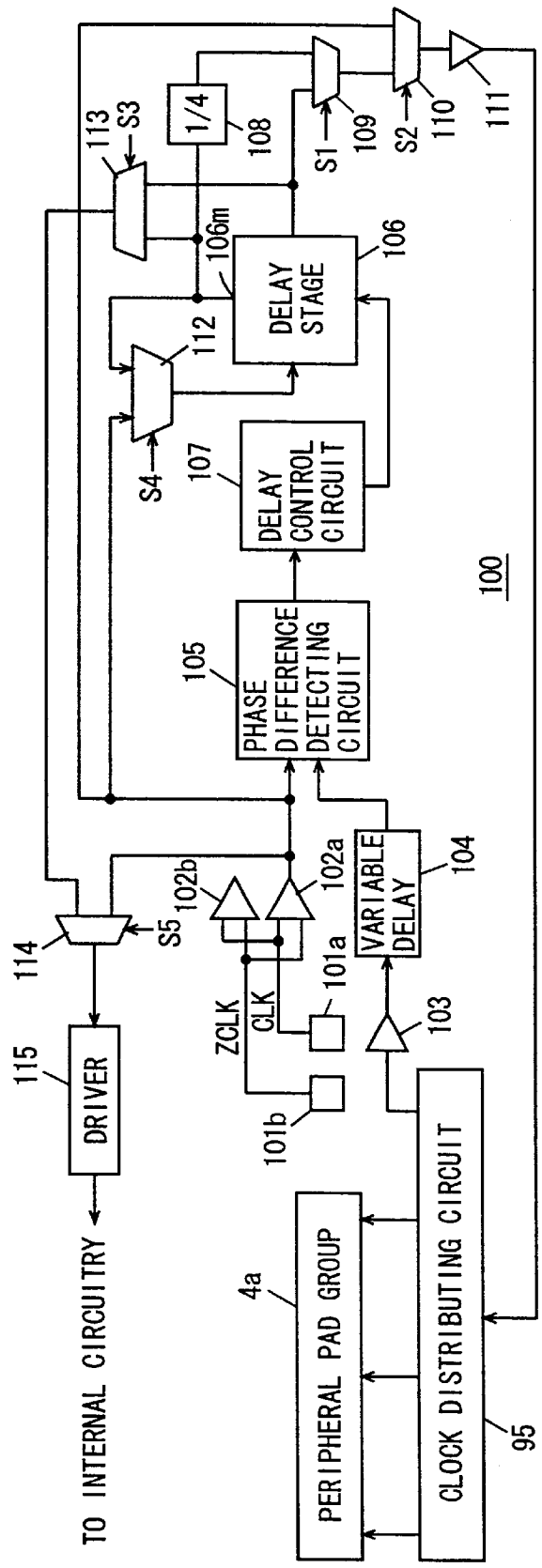
F I G. 2 4

F I G. 25
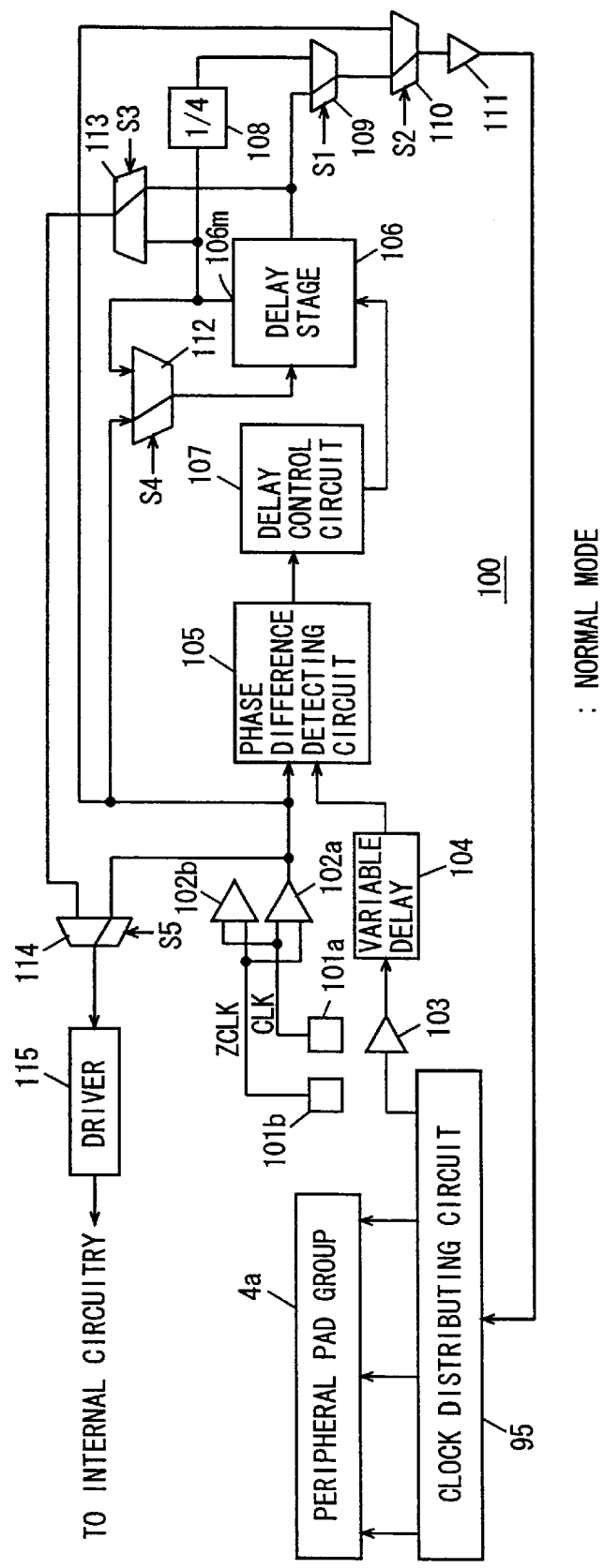

INTERNAL CLOCK GENERATING CIRCUIT FOR CLOCK SYNCHRONOUS SEMICONDUCTOR MEMORY DEVICE

BACKGROUND OF THE INVENTION

1. Field of the Invention

The present invention relates to a semiconductor circuit device and, more specifically, to a configuration for distributing an internal clock signal in a circuit device operating in synchronization with the clock signal. More specifically, the present invention relates to a configuration for distributing an internal clock signal in a clock synchronous semiconductor memory device in which taking of an external signal and data and output of data are performed in synchronization with an externally applied clock signal.

2. Description of the Background Art

FIG. 32 schematically represents an overall configuration of a convention al clock synchronous semiconductor memory device. Referring to FIG. 32, the clock synchronous semiconductor memory device includes a memory array 900 having a plurality of memory cells arranged in a matrix of rows and columns; a synchronizing circuit 902 receiving an externally applied clock signal EXCLK and generating an internal clock signal INCLK synchronized with the external clock signal EXCLK; an address input circuit 904 taking in an externally applied address signal AD in synchronization with the internal clock signal INCLK from synchronizing circuit 902 and generating an internal address signal; a control signal input circuit 906 taking an external command ΦC in synchronization with the internal clock signal INCLK and generating an internal control signal; a control circuit 908 generating various control signals necessary for a designated operation mode in accordance with the internal control signal from control signal input circuit 906; a cell selecting circuit 910 operating under the control of control circuit 908, and selecting a memory cell in memory cell array 900 in accordance with the internal address signal applied from address input circuit 904; and a data input/output circuit 912 operating under the control of control circuit 908 and performing data input/output to and from the memory cell selected by cell selecting circuit 910 in synchronization with internal clock signal INCLK.

The command signal φC includes a plurality of external control signals such as a row address strobe signal ZRAS, a column address strobe signal and a write enable signal ZWE, and by a combination of states of the plurality of external control signals at a rising edge of the internal clock signal INCLK, a command designating an operation mode is formed.

FIG. 33 is a timing chart representing an operation of the clock synchronous semiconductor memory device shown in FIG. 32. In the following, the operation of the clock synchronous semiconductor memory device shown in FIG. 32 will be described with reference to FIG. 33.

In a cycle preceding a cycle #a of external clock signal EXCLK, an active command is applied and in memory array 900, memory cells corresponding to an addressed row are driven to and held at a selected state.

In the clock cycle #a, the command signal φC is set to a prescribed state, and a write command designating a data write is applied. In the clock cycle #a, in synchronization with a rise of external clock signal EXCLK, address input circuit 904 takes in the external address signal AD and generates an internal address signal. Data input/output circuit 912 takes in externally applied write data d0 in synchronization with the external clock signal EXCLK in accordance with the write command. Cell selecting circuit 910 selects a memory cell in accordance with the address signal applied from address input circuit 904.

In successive clock cycles starting at clock cycle #a, write data d1, d2 and d3 are taken in, respectively in synchronization with the rise of the external clock signal EXCLK. The write data d0 to d3 are written to memory cells selected by the cell selecting circuit 910 of memory array 900 in a prescribed sequence. The number of data written or read successively when a command is applied is referred to as a burst length. FIG. 33 represents an example of a data writing operation when the burst length is 4.

In a cycle #b of external clock signal EXCLK, the command signal φC is set to a prescribed state and a read command designating a data read is applied. In accordance with the read command, address input circuit 904 takes in an external address signal AD in synchronization with a rise of external clock signal EXCLK and generates an internal address signal. Cell selecting circuit 910 selects an addressed memory cell of memory array 900, and data of the selected memory cell is applied to data input/output circuit 912. A certain time period is necessary from the selection of the memory cell by cell selecting circuit 910 until transfer of data of the selected memory cell to data input/output 912. In a cycle preceding the cycle #c of external clock signal EXCLK, valid data is output from data input/output circuit 912, the read data q0 is established at a rising edge of external clock signal EXCLK in the clock cycle #c and sampled by an external device. Thereafter, data of the burst length are read in synchronization with the external clock signal EXCLK successively. The clock cycle period from clock cycle #b to clock cycle #c is generally referred to as CAS latency, and FIG. 33 represents an example of a reading operation where CAS latency is 3.

In a clock synchronous semiconductor memory device such as the one shown in FIG. 32, the external address signal and the command signal are taken in synchronization with external clock signal EXCLK (internal clock signal INCLK). Therefore, it is unnecessary to consider any skew between control signals, and a timing of starting an operation of the internal circuit can be made advanced, enabling high speed access.

Further, since data input/output is also in synchronization with the external clock signal EXCLK, data transfer rate is effectively the same as the rate of the external clock signal EXCLK, and therefore high speed data transfer is realized.

Synchronizing circuit 902 generates the internal clock signal INCLK which is synchronous with the externally applied clock signal EXCLK, and determines the timing of taking signals of address input circuit 904 and control signal input circuit 906. Therefore, in address input circuit 904 and control signal input circuit 906, taking of accurate external signals and generation of internal signals at a faster timing are possible. Further, in data input/output circuit 912, it is possible to input/output data in accordance with the external clock signal EXCLK, and therefore accurate data input/output and high speed data transfer can be realized.

FIG. 34A represents a schematic configuration of the synchronizing circuit shown in FIG. 32. Synchronizing circuit 902 shown in FIG. 34A is formed by a synchronizing circuit having a feed back loop such as a phase locked loop (PLL). Synchronizing circuit 902 adjusts phase of the internal clock signal INCLK such that the externally applied external clock signal EXCLK and the internal clock signal INCLK come to have the same phase. Therefore, as can be seen from FIG. 34B, the internal clock signal INCLK is in phase with the external clock signal EXCLK.

The external control signal and the address signal are generated with the external clock signal EXCLK being a reference. Therefore, in the semiconductor memory device, the command signal φC has extremely small skew with respect to the external clock signal EXCLK (with the direction of signal transfer being the same), and therefore sufficient set up time Ts and sufficient hold time Th are ensured. It should be noted, however, that though synchronizing circuit 902 has a function of making the phase of internal clock signal INCLK matched with external clock signal EXCLK, synchronizing circuit 902 does not have a function of adjusting skew generated n the internal clock signal INCLK is transmitted inside the semiconductor memory device.

FIG. 35A schematically shows a manner of distribution of the internal clock signal from synchronizing circuit 902. In FIG. 35A, the internal clock signal from synchronizing circuit 902 is transmitted to input circuits #ai, #bi and #ci through respective clock transmission lines (signal lines) L1, L2 and L3. The clock transmission lines L1, L2 and L3 have different line capacitances and different line resistances, and hence different signal propagation delays. In FIG. 35A, internal clocks INCLKa, INCLKb and INCLKc are shown respectively to be transmitted to clock transmission lines L1, L2 and L3 from synchronizing circuit 902. Clock transmission lines L1, L2 and L3 have larger signal propagation delays in this order. Input circuit #ai to #ci may be any of input circuits 904, 906 and 912 shown in FIG. 32.

FIG. 35B schematically represents timing relation between the clock signals shown in FIG. 35A and a signal SIG applied to the input circuit. In FIG. 35B, in a cycle #ca of the external clock signal EXCLK, the signal SIG is applied. At this time, when time difference between internal clock signal INCLKa, INCLKb and INCLKc is small and the clock skew is small, it is possible to take the signal SIG into respective input circuits #ai to #ci at a rising edge of external clock signal EXCLK to generate internal signals. The signal SIG represents a group of signals applied to input circuit #ai to #ci, respectively. In this case, however, it is necessary to determine the timing of starting an internal operation, taking into consideration the clock skew, and therefore the timing of starting an internal operation is delayed. If the hold time of the signal SIG is insufficient, it becomes impossible to generate a correct internal signal.

When the external clock signal EXCLK is a high speed clock signal (having high frequency) as represented by the cycle #cb of the external clock signal EXCLK in FIG. 35B, time difference between signal clock signals INCLKa to INCLKc is relatively large, and when the clock skew is large, the signal SIG which is to be taken in at a rising edge of the external clock signal EXCLK cannot be taken with the internal clock signal INCLKc applied to input circuit #ci. Therefore, when the clock skew is large, it is impossible to execute the designated operation. Accordingly, the operation frequency of the semiconductor memory device is determined by the clock skew, which means that high speed operation is not possible. More specifically, when the clock skew occupies a major part of the cycle time of the external clock signal, accurate operation becomes impossible, and hence the operation frequency of the semiconductor memory device is significantly limited by the clock skew.

FIG. 36A schematically represents a configuration of a data output portion of data input/output circuit 912 of FIG. 32. Referring to FIG. 36A, there are a plurality of data output circuits OB#0 to OB#n provided parallel to each other. To these data output circuits OB#0 to OB#n, internal clock signal INCLK is transmitted through a clock transmission line L4 from synchronizing circuit 902. Data output circuits OB#0 to OB#n transfer and output data in synchronization with an internal clock signal INC (INC0 to INCn) applied through clock transmission line L4. There is also a clock skew derived from difference in line length in clock transmission line L4.

FIG. 36B is a timing chart representing an operation of the data output portion of FIG. 36A. Data output circuit OB#0 is nearest to synchronizing circuit 902, clock transmission line L4 thereto is the shortest, and the delay of internal clock signal INC0 with respect to external clock signal EXCLK is the smallest. Data output circuit OB#n is farthest from synchronizing circuit 902, clock transmission line L4 thereto is the longest, and propagation delay is the largest.

Data output circuits OB#0 to OB#n transfer and output data in synchronization with the applied internal clock signals INC0 to INCn at the time of a data read. Therefore, data Q0 output from data output circuit OB#0 attains to the established state at the earliest timing, while data Qn output from data output circuit OB#n attains to the established state at the latest timing.

Accordingly, data output timings of data output circuits OB#0 to OB#n delay because of the delays in internal clock signals INC0 to INCn, and therefore set up times of data Q0 to Qn with respect to the external clock sign al EXCLK become shorter by the delay times of the internal clock signals, and hence output data come to have smaller margins (as the external device samples data at the rising edge of external clock signal EXCLK).

As represented by the dotted line for the data Qn in FIG. 36B, when the clock skew becomes so large that the timing of establishment of data Qn becomes later than the rising edge of the external clock signal EXCLK, accurate data reading is impossible. Therefore, in the data output operation also, operation frequency of data output is determined by the clock skew over the clock transmission line L4, that is, delay time difference among internal clock signals INC0 to INCn. Especially in recent semiconductor memory devices, multiple bits of data such as 16 bits are output, which means that there are larger number of data output circuits OB#0 to OB#n, and hence clock skew over clock transmission line L4 tends to be larger, resulting in the problem that accurate data output in synchronization with the high speed clock signal becomes difficult.

FIG. 37 represents another configuration of a conventional semiconductor memory device. Referring to FIG. 37, in synchronization with the internal clock signal INCLK from synchronizing circuit 920, internal circuits NK#0 to NK#n operate. It is not necessary for these internal circuits NK#0 to NK#n to execute the same processing contents. What is necessary is that in the configuration, prescribed processings are performed, with the operation cycle defined by the internal clock signal INCLK applied through clock transmission line LK. In other words, the semiconductor circuit device may be a general arithmetic processing device.

In such a semiconductor circuit device as shown in FIG. 37 also, the internal clock signal INCLK is transmitted from synchronizing circuit 920 over clock transmission line LK to internal circuits NK#0 to NK#n. Among internal circuits NK#0 to NK#n, the are exists one internal circuit which receives the internal clock signal with minimum delay amount, and one internal circuit which receives the internal clock signal with maximum delay amount. Therefore, in this case also, it is necessary to operate internal circuits NK#0 to NK#n, taking into account the skew of internal clock signal INCLK transmitted over clock transmission line L5, and therefore there is the problem that high speed operation is not possible.

Especially when the semiconductor circuit device is implemented in large scale and the number of circuits connected to clock transmission lines L1 to L5 increases, the load on the clock transmission lines increases accordingly, signal propagation delay over the clock transmission lines increases, and the problem of clock skew becomes more serious. In order to solve the problem of clock skew experienced in the semiconductor circuit devices such as shown in FIGS. 35A, 36A and 37, a configuration have been proposed in which dummy delays for adjusting delay times are arranged in accordance with the amounts of respective clock delays.

FIG. 38 represents an example of a counter measure against clock skew in the conventional semiconductor circuit device. In FIG. 38, internal circuitry is divided into a plurality of internal circuit groups NG#0 to NG#m. For internal circuit groups NG#0 to NG#(m−1), dummy delays DDL#0 to DDL#(m−1) for adjusting delay time are arranged. The internal clock signal INCLK from synchronizing circuit 925 is transmitted over a clock transmission line L6, the internal clock signal is transmitted to internal circuit groups NG#0 to NG#(m−1) through corresponding dummy delays DDL#0 to DDL#(m−1), respectively, and to internal circuit group NG#m, internal clock signal INCLK from clock transmission line L6 is transmitted.

Each of dummy delays DDL#0 to DDL#(m−1) is constituted by an RC delay circuit having a resistor and a capacitor, or a delay circuit employing an inverter, and adapted to have such a delay amount that compensates for the delay time over clock transmission line L6. More specifically, the delay timed of dummy delay DDL#0 provided corresponding to internal circuit group NG#0 provided at a point of minimum delay has approximately the same magnitude as the clock delay derived from a load accompanying the overall clock delay line L6. By contrast, the amount of delay of dummy delay DDL#(m−1) is set to compensate for the delay experienced by the internal circuit group NG#m, which is the maximum amount of delay.

In each of the internal circuit groups NG#0 to NG#m, there are a plurality of internal circuits to which an internal clock signal is applied in common.

In the configuration shown in FIG. 38, it is necessary to provide dummy delays DDL#0 to DDL#(m−1) for internal circuit group NG#0 to NG#(m−1). Accordingly, larger area is occupied by the circuit portion for transmitting the clock signal, which hinders higher degree of integration.

Though dummy delays DDL#0 to DDL#(m−1) are set to have such delay times that compensate for the delay time on the later stage (down stream) side of clock transmission line L6, it is difficult to set an accurate delay time, and it is difficult to provide internal clock signals of the same phase accurately to internal circuit groups NG#0 to NG#m. Further, in each of internal circuit groups NG#0 to NG#m, the applied internal clock signal is distributed to internal circuits contained therein. Here, propagation delay of the clock to each of the internal circuits is not constant, and therefore in each of the internal circuit groups NG#0 to NG#m, there exists clock skew among the internal circuits contained therein.

Further, the problem of lower operation frequency resulting from the skew in internal clock signal described above is experienced not only in the semiconductor integrated circuit device integrated on a single semiconductor chip but also in a configuration in which a plurality of integrated circuit devices are arranged on a board, as the timing of operation of each semiconductor integrated circuit device is offset because of the signal propagation delay over the lines on the board.

SUMMARY OF THE INVENTION

An object of the present invention is to provide a semiconductor circuit device free from any internal clock signal skew.

Another object of the present invention is to provide a semiconductor circuit device provided with a clock distributing circuit allowing application of internal clock signals in phase with each other to various internal circuits.

The semiconductor circuit device in accordance with a first aspect includes a clock generating circuit for generating a clock signal, and a plurality of internal circuits operating in accordance with received clock signals. The plurality of internal circuits are arranged between a first node of a minimum delay physically nearest to the clock generating circuit, and a second node of a maximum delay physically the farthest from the clock generating circuit.

The semiconductor circuit device in accordance with the first aspect further includes a clock distributing circuit having a plurality of nodes arranged in a shape of a tree with a node corresponding to a middle point between the first and second nodes being a starting node, and connected to clock transmission lines extending in opposite directions, and clock drivers arranged corresponding to respective nodes for transmitting the clock signals applied to the corresponding nodes to the corresponding clock transmission lines. The clock distributing circuit transmits the clock signal from the clock generating circuit to the plurality of internal circuits.

The semiconductor circuit device in accordance with a second aspect includes a clock generating circuit for generating a clock signal, and a clock distributing circuit for distributing the clock signal of the clock generating circuit from a nearest point physically nearest to the clock generating circuit to a region providing a farthest point physically the farthest therefrom. The distributing circuit has a plurality of nodes arranged in the shape of a tree, with a middle point between the nearest and the farthest points as a starting node. To each node, a driver for transmitting the applied signal and signal transmission lines extending in directions opposite to each other, having substantially the same delay and receiving the signal from the driver, are connected. The delay of the signal transmission line is monotonously decreased nearer to the distal end of the tree.

The semiconductor circuit device in accordance with a third aspect includes clock generating circuitry for transmitting an internal clock signal synchronized with an externally applied external clock signal, to a looped clock transmission line having a forward path and a backward path. The looped clock transmission line is divided into the forward path and the backward path at a returning point.

The semiconductor circuit device in accordance with the third aspect further includes a feedback path coupled to the middle of the forward path of the clock transmission line for feeding back the internal clock signal transmitted over the forward path to the clock generating circuit. The delay time of the feedback path is substantially equal to the delay time from the middle point of the forward path to the returning point.

The clock generating circuitry includes a circuit for adjusting phase of the internal clock signal such that the signal transmitted over the feedback path has the same phase as the external clock signal.

As the clock transmission line is adapted to have nodes arranged in the shape of a tree, line symmetrical with respect to the middle point between the points of minimum and maximum delays, that is, the nearest and farthest points, for continuous transmission, and the signal transmission lines to respective nodes are adapted to have approximately the same amount of delay, the number of nodes having the same amount of delay is successively increased, and the clock signal is transmitted to the internal circuits at the nearest and the farthest points. The same amount of delay is experienced at nodes at the distal end of the tree, and therefore clock signs with the same delay can be transmitted to respective internal circuits.

Further, a looped clock transmission line is formed and the clock signal is fed back to the clock generating circuitry through a feedback path from the middle point of the forward path, the phase of the clock signal at the returning point is synchronized with the external clock signal, and it becomes possible to generate internal clock signals having symmetrical delays with respect to the clock signal at the returning point. By combining the clock signals of symmetrical nodes, it becomes possible to generate a clock signal having the same phase as the clock signal at the returning point to be applied to the internal circuit, and hence clock skew can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6A is a schematic diagram representing a clock transmitting system in accordance with the first embodiment of the present invention, and FIG. 6B is a schematic diagram representing configuration of the clock distributing circuit of FIG. 6A.

FIG. 11A is a schematic diagram representing a main portion of a semiconductor memory device in accordance with a second embodiment of the present invention, and FIG. 11B is a schematic diagram specifically representing a configuration of the clock generating circuit shown in FIG. 11A.

FIG. 14A schematically represents a configuration of a clock reproducing circuit of FIG. 11A, FIG. 14B represents an exemplary configuration of a delay stage of FIG. 14A, and FIG. 14C represents a configuration of a half delay stage of FIG. 14A.

FIG. 24 is a schematic diagram specifically representing a configuration of a main portion of a semiconductor memory device in accordance with a fifth embodiment of the present invention.

FIG. 25 represents a manner of clock selection in a normal mode of the clock generating circuit shown in FIG. 20.

DESCRIPTION OF THE PREFERRED EMBODIMENTS

Overall Configuration

Figure 1:
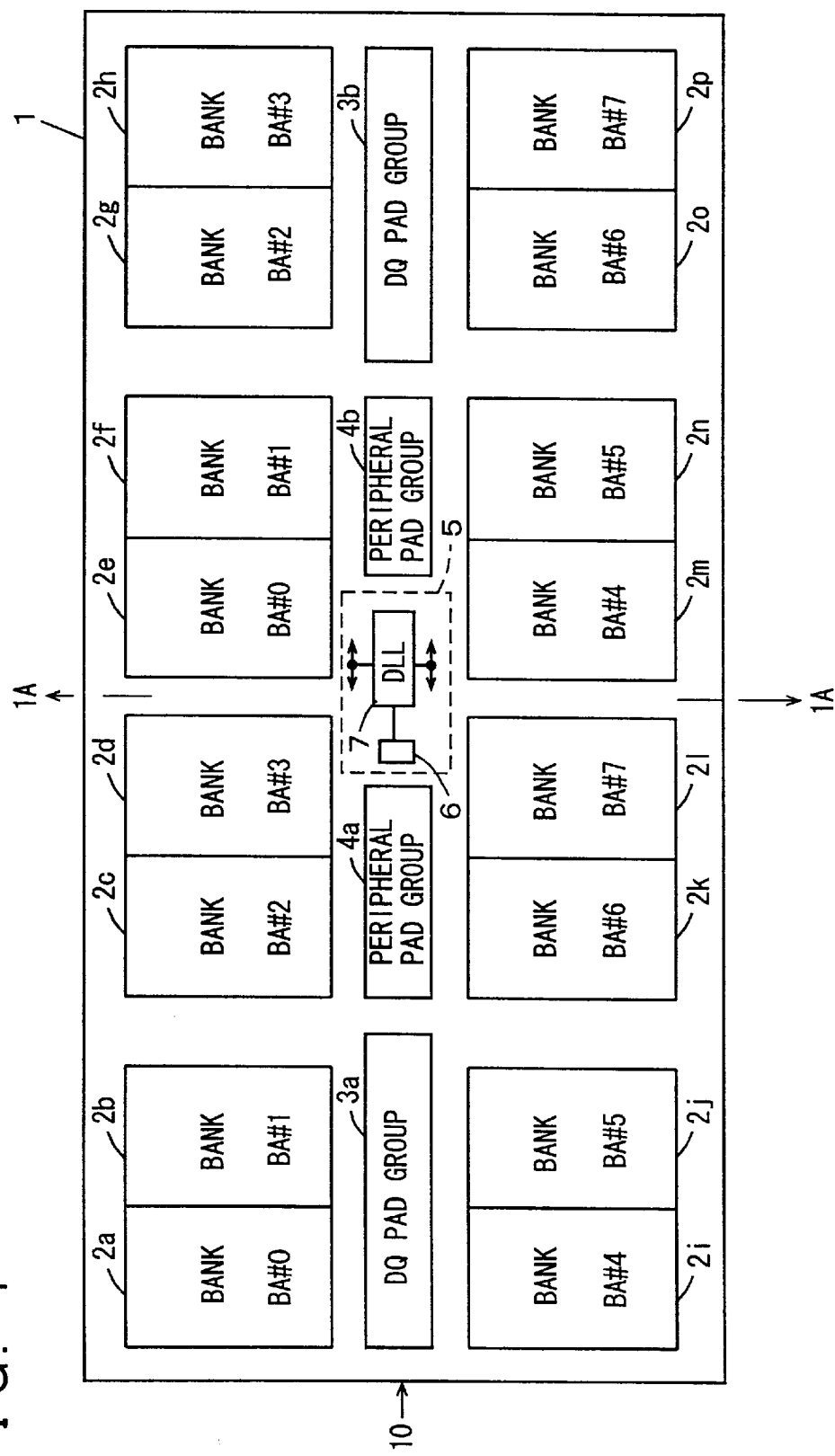
FIG. 1 is a schematic diagram representing an overall configuration of a semiconductor memory device in accordance with a first embodiment of the present invention.

FIG. 1 schematically represents the overall configuration of the semiconductor circuit device to which the present invention is applied. In FIG. 1, a semiconductor memory device is shown as a semiconductor circuit device. Referring to FIG. 1, semiconductor memory device 1 includes 16 memory mats 2a to 2p arranged on both sides of a central region 10 extending along a longer side direction of a chip on which semiconductor memory device 1 is formed. These memory mats 2a to 2p include a memory array in which memory cells are arranged in a matrix of rows and columns, and a row decoder, a word line driver and a column decoder for selecting a memory cell. Of these memory mats 2a to 2p, memory mats 2a and 2e constitute a bank BA#0, memory mats 2b and 2f constitute a bank BA#1, memory mats 2c and 2g constitute a bank BA#2, and memory mats 2d and 2h constitute a bank BA#3.

Further, memory mats 2i and 2m constitute a bank BA#4, memory mats 2j and 2n constitute a bank BA#5, memory mats 2k and 2o constitute a bank BA#6, and memory mats 2l and 2p constitute a bank BA#7. Banks BA#0 to BA#7 can each drive a row of memory cell array to a selected state, independent from each other.

In the central region 10, on outer side in the longer side direction, DQ pad groups 3a and 3b are arranged, in which a plurality of DQ pads (data input/output pads) for data input/output are arranged. Between DQ pad groups 3a and 3b, peripheral pad groups 4a and 4b including address pads and control signal input pads for inputting address signals and control signals are arranged.

In a region between peripheral pad groups 4a and 4b, a control circuit arranging region 5 for arranging a main control circuit is provided. In the control circuit arranging region 5, a clock input pad portion 6 receiving an external clock signal, and a synchronizing circuit 7 for generating an internal clock signal in accordance with the clock signal from clock input pad portion 6 are provided. Here, "pad portion" includes both the pad and a buffer circuit for buffering the signal applied to the pad. A DLL (Delay Locked Loop) is shown as an example of synchronizing circuit 7. An internal clock signal from synchronizing circuit 7 is applied to buffer circuits (especially, input buffer circuits) provided corresponding to respective pads of DQ pad groups 3a and 3b as well as peripheral pad groups 4a:and 4b (the path is not shown).

DQ pad group 3a performs data input/output to and from banks BA#0 to BA#3 and BA#4 to BA#7 on the left side in the region represented by a segment line 1A in FIG. 1, while DQ pad group 3b performs data input/output to and from banks BA#0 to BA#7 on the right side of the segment line 1A. As peripheral pad groups 4a and 4b are arranged near to the central portion of central region 10 and DQ pad groups 3a and 3b are arranged outside thereof on opposing sides, the path for transmitting data of the memory cell can be made shorter. Further, as the main control circuit is arranged in the control circuit arranging region 5, line length from peripheral pad groups 4a and 4b can be made shorter. Further, the transmission lines of control signals from the main control circuit to respective banks (memory mats) can be provided in a symmetrical layout with the control circuit arranging region 5 being the center, so that circuit layout is facilitated. The configuration in which DQ pad groups are arranged outside and peripheral pad groups are arranged inside thereof at the central region 10 is referred to as ODIC (outer DQ inner clock) arrangement.

In the semiconductor memory device 1, internal configuration and lines have symmetrical shape with the segment line 1A being the axis of symmetry. Therefore, in the following description, the configuration of the clock distributing path to DQ pad groups 3 and peripheral pad group 4a on one side will be described. A clock distributing circuit of the same configuration is provided for peripheral pad group 4b and DQ pad group 3b.

Figure 2:
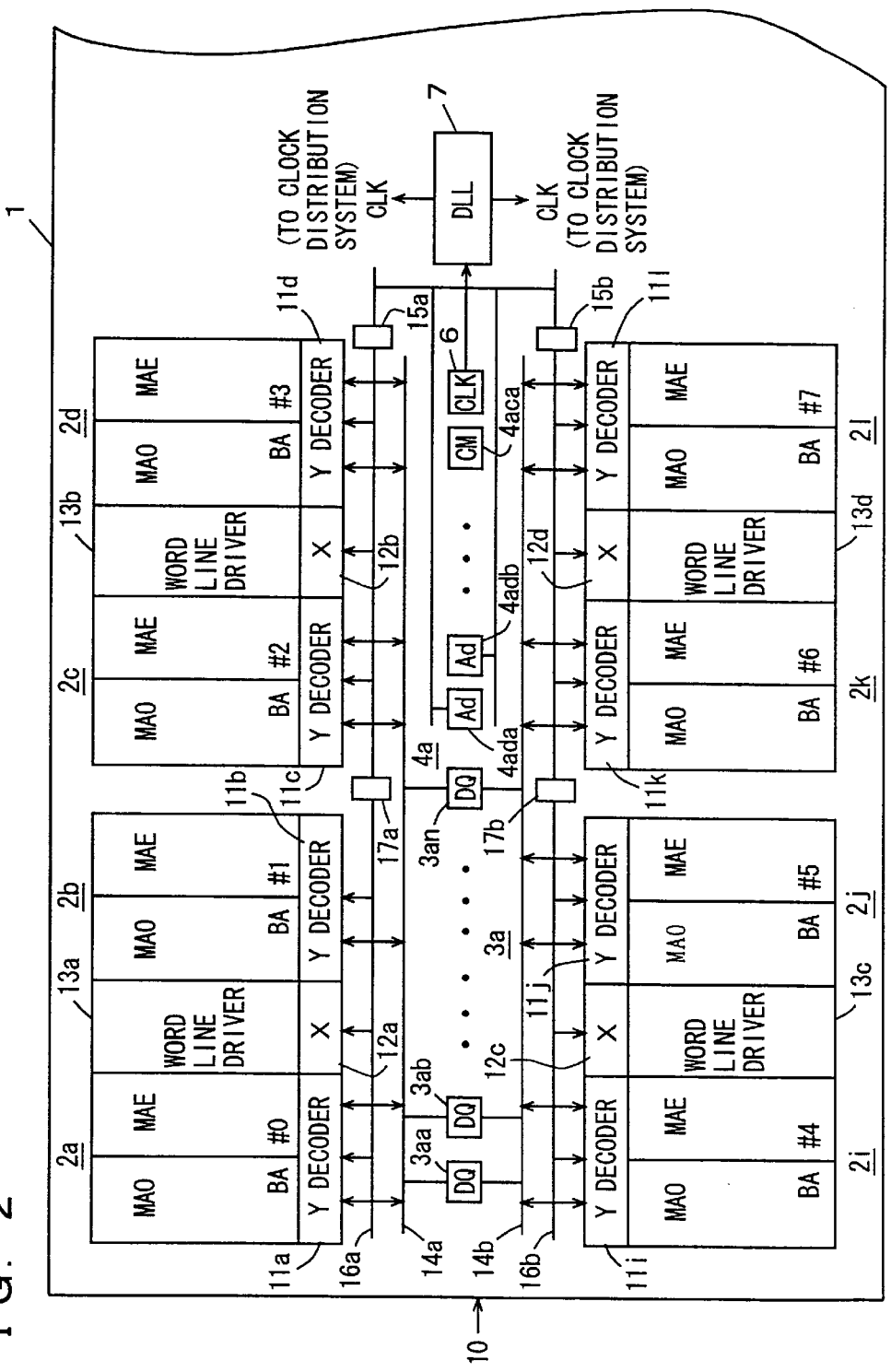
FIG. 2 represents in detail a configuration of a main portion of the semiconductor memory device of FIG. 1.

FIG. 2 is a diagram representing in greater detail the configuration of semiconductor memory device 1 of FIG. 1. FIG. 2 represents the configuration of DQ pad group 3a, peripheral pad group 4a and memory mats 2a to 2d and 2i to 21. The portions of memory mats 2a to 2h and 2m to 2p have similar configuration.

Each of memory mats 2a to 2d and 2i to 2l is divided into blocks MAO of odd-numbered columns and blocks MAE of even-numbered columns. From each of the even-numbered column blocks MAE and odd-numbered column blocks MAO, the same number of columns of memory cells are selected. In accordance with a predecode signal from a column predecoder, not shown, a column is selected in accordance with 2-bit prefetch method. By the division into the even-numbered column blocks and odd-numbered column blocks, the manner of column selection is unified in the even-numbered column blocks and odd-numbered column blocks, whereby data read/write control of the 2-bit prefetch method is simplified. For memory mats 2a to 2d and 2i to 2l, Y decoders (column decoder) 11a to 11d and 11i to 11l for selecting an addressed column from the corresponding to memory blocks MAO and MAE are provided, respectively.

Commonly to memory mats 2a and 2b, a row decoder (X decoder) 12a for decoding a row address signal is provided. Commonly to memory mats 2c and 2d, a row decoder 12b is provided. Commonly to memory mats 2i and 2j, a row decoder 12c is provided. Commonly to memory mats 2k and 2l, a row decoder 12d is provided.

Further, for row decoders 12a to 12d, word line drivers 13a to 13d are provided for driving an addressed row to the selected state, in accordance with a row designating signal from the corresponding row decoder, respectively. Each of the word line drivers 13a to 13d is shared by banks adjacent to itself, and drives a row of the addressed, bank (word line (main/sub word line)) to the selected state.

DQ pad group 3a includes a plurality of DQ pad portions 3aa to 3an for data input/output arranged aligned in the chip central region 10. These DQ pad portions 3aa to 3an are coupled to a data bus 14a for data communication with memory mats 2a to 2d (banks BA#0 to BA#3) extending along the row direction in the central region 10, as well as to a data bus 14b provided commonly to memory mats 2i to 2l (banks BA#4 to BA#7) and extending along the row direction in the chip central region 10.

The peripheral pad group 4a includes address pad portions 4ada, 4adb, . . . receiving an address signal (Ad) and a control input pad portion 4aca receiving an external control signal (command signal CM). These pad portions 4ada, 4adb, . . . , 4aca are also arranged aligned with DQ pad portions 3aa to 3an at the central region 10.

The internal address signals from address pad portions 4ada, 4adb, . . . are transmitted to address buses 16a and 16b through drivers 15a and 15b. Address bus 16a is provided with a repeater 17a at its central portion, and transmits an address signal of a small amplitude transmitted from address bus driver 15a to banks BA#0 to BA#3 at a high speed. Address bus 16b is also provided with a repeater 17b, and transmits the address signal of a small amplitude from address bus driver 15b to banks BA#4 to BA#7. As address signal input pad portions 4ada, 4adb, . . . are provided at the central portion and address signals are transmitted from the central region to each bank through address bus drivers 15a and 15b, all the address bus lines come to have a linear shape, and it becomes possible to transmit address signals at high speed over shorter distance through the buses of the same line length. Because of the same line length, address signal propagation delay is also the same.

The clock signal from clock input pad portion 6 receiving the external clock signal is applied to the synchronizing circuit (DLL) 7. The synchronizing circuit (DLL) 7 transmits a clock signal providing a timing for taking signals to buffer circuits provided in the DQ pad groups 3a and peripheral pad groups 4a arranged in the central region 10, through a clock distributing system, which will be described in detail later.

Figure 3:
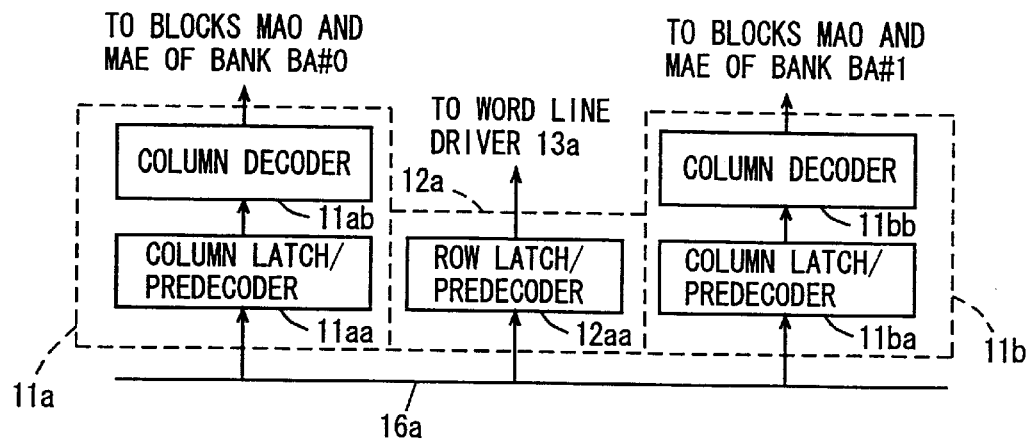
FIG. 3 is a schematic diagram representing a peripheral circuit portion of each bank of the semiconductor memory device shown in FIG. 2.

FIG. 3 is a schematic diagram representing a configuration of portions of Y decoder and X decoder in the memory mats 2a and 2b shown in FIG. 2. Referring to FIG. 3, Y decoder 11a includes a column latch/predecoder 11aa latching and predecoding an address signal on address bus 16a, and a column decoder 11ab further decoding the predecode signal from column latch/predecoder 11aa and outputting a column selecting signal to blocks MAO and MAE of bank BA#0.

Y decoder 11b includes a column latch/predecoder 11ba latching and predecoding an address signal on address bus 16a, and a column decoder 11bb further decoding the predecode signal from column latch/predecoder 11ba and generating a column selecting signal for blocks MAO and MAE of bank BA#1.

X decoder 12a includes a row latch/predecoder 12aa latching and predecoding the address signal on address bus 16a, and applying the predecode signal to word line driver 13a. By the provision of the row latch and the column latch in these decoders allow access bank by bank.

Other memory mats 2c to 2l also have the similar configuration.

Figure 4:
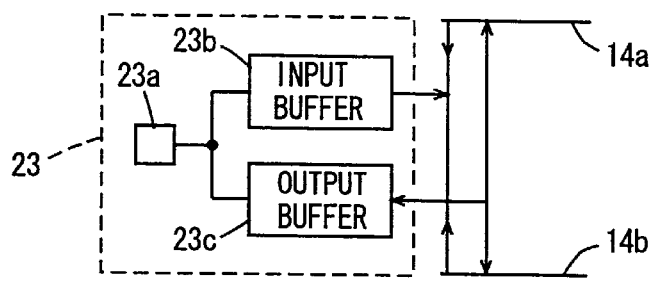
FIG. 4 is a schematic diagram representing a configuration of a DQ pad portion of the semiconductor memory device of FIG. 2.

FIG. 4 schematically represents the configuration of DQ pad portions 3aa to 3an of FIG. 2. Referring to FIG. 4, DQ pad portion 23 (3aa to 3an) includes a pad 23a for electrical connection with the outside, an input buffer 23b for taking and latching the signal applied from pad 23a in synchronization with a clock signal, not shown, and an output buffer 23c for transmitting data to pad 23a in synchronization with the clock signal. Input buffer 23b and output buffer 23c are coupled to data buses 14a and 14b.

Figure 5:
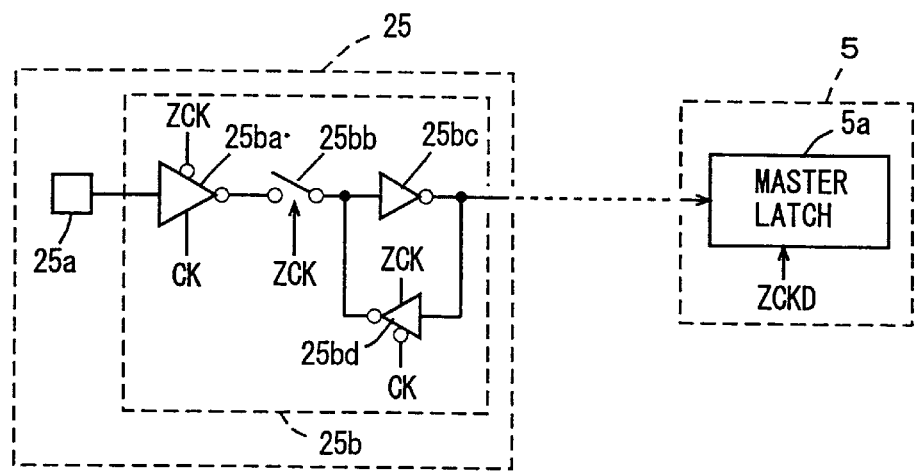
FIG. 5 is a schematic diagram representing a configuration of a signal input pad portion of FIG. 2.

FIG. 5 show an exemplary configuration of the peripheral pad portion (pad portions 4ada, 4adb, . . . 4aca of FIG. 2) included in the peripheral pad group 4a of FIG. 1. Referring to FIG. 5, peripheral pad portion 25 includes a pad 25a receiving an external signal, and an input latch 25b taking and latching the signal applied to pad 25a, in synchronization with the clock signal CK. Input latch 25b includes a tristate inverter 25ba activated when clock signal CK is at the H level, for inverting the signal applied to pad 25a, a transfer gate 25bb which is rendered conductive when a complementary clock signal ZCK is at the H level, for passing an output signal from tristate inverter buffer 25ba, an inverter 25bc inverting the signal from transfer gate 25bb, and a tristate inverter buffer 25bd activated when the clock signal CK is at the L level, for inverting the output signal from inverter 25bc and transmitting the resulting signal to an input portion of inverter 25bc.

Input buffer 25b shown in FIG. 5 takes in an external signal in synchronization with a rise of the clock signal CK, and latches the external signal in synchronization with a fall of the clock signal CK. Input buffer 23b shown in FIG. 4 also has the similar configuration as input buffer 25b of FIG. 5. Here, the clock signal may have opposite polarity for the latching operation.

The signal from peripheral pad portion 25b is applied to a master latch 5a provided at the peripheral circuit arranging region 5 provided at the chip central region. Master latch 5a latches an applied signal in response to a complementary delayed clock signal ZCKD. These clock signals CK are transmitted through the clock distributing circuit from synchronizing circuit (DLL) 7 shown in FIGS. 1 and 2.

First Embodiment

FIG. 6A is a schematic diagram representing a configuration of the clock distributing system in accordance with the first embodiment of the present invention. Referring to FIG. 6A, synchronizing circuit (DLL) 7 receives the clock signal from clock input pad portion 6, generates an internal clock CLK0 through a clock generating node 34 which is a node of minimum delay, and applies the generated clock to clock distributing circuit 30. Clock distributing circuit 30 includes output nodes 31a to 31n and 32a to 132p provided corresponding to input buffers included in DQ pad group 3a and peripheral pad group 4a, respectively, and applies the clock signal through the output nodes to DQ pad group 3a and peripheral pad group 4a.

The clock distributing circuit 30, of which configuration will be described in detail in the following, has nodes arranged in the shape of a tree symmetrical in left and right sides, and clock drivers arranged for respective nodes, so that propagation delays of the clock signal at output nodes 31a to 32p are all made equal to each other. The clock signal output from output node 32p of the clock distributing circuit is applied to synchronizing circuit (DLL) 7 through a feedback path 33. Therefore, the synchronizing circuit (DLL) 7 synchronizes the phase of the clock signal applied to DQ pad group 3a and peripheral pad group 4a with the clock signal applied from clock input pad portion 6. Accordingly, DQ pad group 3a and peripheral pad group 4a operate in accordance with the clock signal not delayed from the external clock signal, and therefore a margin for the input signal is ensured. Further, clock signals from output nodes 31a to 31n and 32n to 32p of the clock distributing circuit 30 are transmitted through signal propagation paths having the same delay time and are in phase with each other, and therefore it is not necessary to take into consideration the skew among the clock signals applied to DQ pad groups 3a and peripheral pad group 4a, whereby operation margin can be enlarged. Further, higher speed of operation is possible.

FIG. 6B is a schematic diagram representing the configuration of clock distributing circuit 30. Referring to FIG. 6B, clock distributing circuit 30 includes a plurality of nodes 36-11, 36-12, 36-21 to 36-24, 36-f1 to 36-fm, 36-fn to 36-ft arranged in the shape of a tree symmetrical in left and right sides with respective clock drivers arranged therefor, with a node 36-0 provided at a position corresponding to the middle point between the clock generating node 34 having the minimum clock delay and a maximum delay node 35 which is the farthest destination of the clock and having the maximum delay, being a starting node. At each of the node arranged in the symmetrical tree, there are a clock transmission line extending in a direction toward the maximum delay node 35 and a clock transmission line returning toward the minimum delay node 34. More specifically, for node 36-0, there are provided clock transmission lines L#1a and L#1b extending in opposite: directions, and transmission lines L#1a and L#1b are adapted to have the same delay amount (that is, adapted to have the same transmission line length). Nodes 36-11 and 36-12 are connected to these transmission lines.

For node 36-11, clock transmission lines L#2a and L#2b are connected, and for node 36-12, clock transmission lines L#2c and L#2d extending in opposite directions are provided. These clock transmission lines L#2a to L#2d are also adapted to have the same delay amount.

At last stage of the tree, that is, at nodes 36-f1 to 36-fm and 36-fn to 36-ft at the distal end, clock transmission lines extending in opposite directions are connected respectively. To node 36-f1, clock transmission lines L#fa and L#fb are connected, and to node 36-fm, clock transmission lines L#fc and L#fd are connected. To node 36-fm, clock transmission lines L#fe and L#ff are connected, and to node 36-fp, clock transmission lines L#fg and L#fh are connected. Tip ends of these clock transmission lines are respectively connected to clock output nodes 31a to 31n and 32a to 32m.

The Magnitudes of clock propagation delay over the clock transmission lines connected to respective nodes are adapted to be the same with each other. The signal propagation delay of the clock transmission line from the starting node 36-0 to the farthest node 31a is adapted to be the same as the magnitude of the clock signal propagation delay from the starting node 36-0 to node 32m adjacent to the minimum delay node 34. Further, respective nodes 31a to 31n and 32a to 32m have the same delay time to clock signal CLK, and there is no clock skew.

Figure 7A:
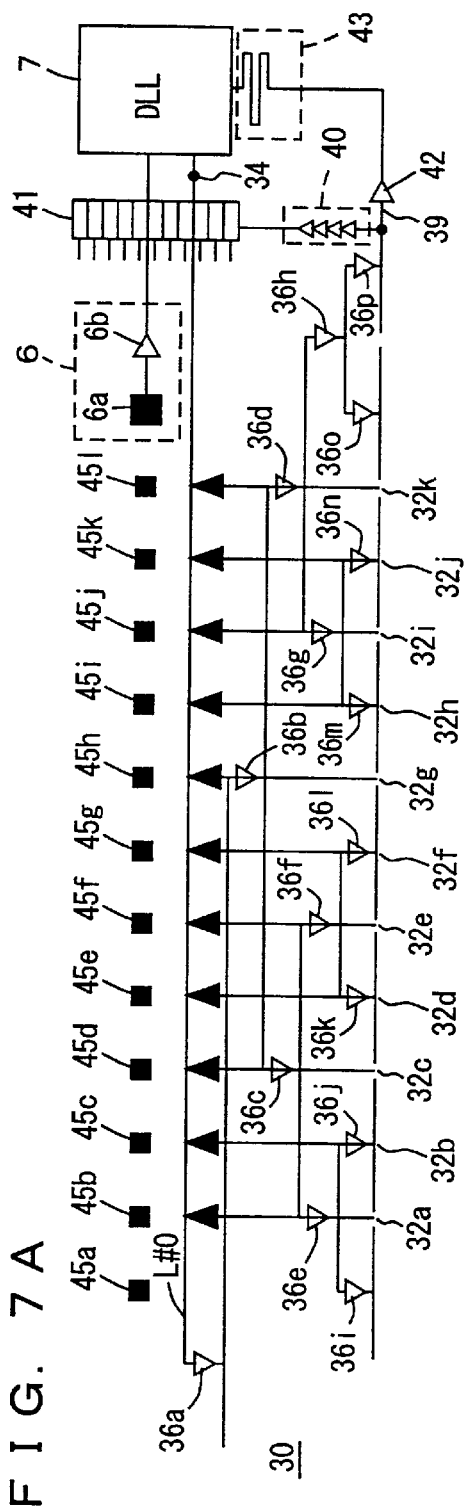
FIG. 7A is a schematic diagram representing a configuration for the peripheral pad groups of the clock distributing circuit shown in FIG. 6A.
Figure 7B:
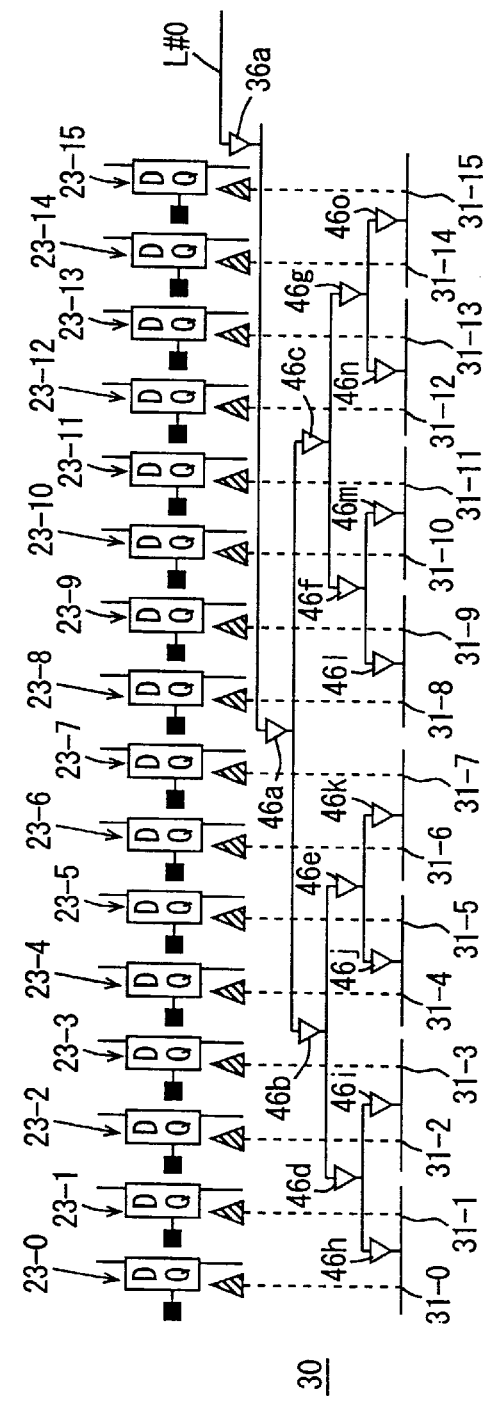
FIG. 7B is a schematic diagram representing a configuration for the DQ pad groups of the clock distributing circuit of FIG. 6A.

FIGS. 7A and 7B represent specific configuration of clock distributing circuit 30 shown in FIGS. 6A and 6B. FIG. 7A represents a configuration of the portion of the clock distributing circuit corresponding to the peripheral pad group 4a including the address and control input pads, and FIG. 7B represents a configuration of a portion of the clock distributing circuit corresponding to the DQ pad group 3a including the DQ pad portions for data input/output.

Referring to FIG. 7A, the internal clock signal generated on clock generating node 34 from synchronizing circuit (DLL) 7 is applied to clock driver 36a provided at the node corresponding to substantially the middle point between the maximum delay node 35 and the minimum delay node 34 at the clock generating point, through clock transmission lines L#0. The output signal from clock driver 36a is transmitted over the clock transmission line for data input/output and a transmission line for transmitting the clock signal for address input and control signal input, extending in opposite directions. In the transmission line from clock driver 36a, a driver 36a is provided corresponding to that node which provides substantially one half the delay of the delay amount between the node for which driver 36a is provided and node 34. Thereafter, similarly, the clock transmission line is divided and the number of nodes is increased. In the tree-shaped node arrangement, in each stage of the tree, a transmission line providing one half the delay amount of the upstream clock transmission line is connected to the output node of each driver. Division of the clock transmission line is repeated until clock output nodes same in number as the number of pad portions 45a to 45l are formed.

In the example of FIG. 7A, the clock transmission line is divided in five stages. Clock drivers 36b to 36p are arranged corresponding to respective nodes. From the end portions of the clock transmission lines connected to drivers 36i to 36n, of the drivers 36i to 36p of the distal end in the tree-shaped node arrangement, clock signals for address and control signal input are output. The clock output nodes 32a to 32k are shown as provided in the regions between adjacent two clock transmission lines. This is because output nodes 32a to 32k are arranged in accordance with the pitch between pad portions 45b to 45l. Each of output nodes 32a to 32k may be so configured as to transmit the clocks from adjacent two clock transmission lines to the corresponding pad portion.

In FIG. 7A, the transmission lines connected to clock drivers 36i to 36p at the distal end of the tree have substantially the same length as the clock transmission lines upstream. In the tree-shaped arrangement of the nodes, it is not always necessary for the clock transmission line downstream to have the delay amount one half that of the upstream clock transmission line. The position of the node at which the clock driver (buffer) is arranged is determined by the RC delay amount of the clock transmission line and the length of the clock tree as a whole. Further, depending on the method of layout of the clock transmission lines, sometimes it may be difficult to turn or fold each node with one half the delay amount. What is necessary is that the tree nodes are so arranged as to make equal the clock delay for respective pad portions. In the arrangement of transmission lines with ½ delay, clock signals can be output from a larger number of nodes.

Accordingly, in FIG. 7A, even when the clock transmission lines connected to nodes 36i to 36n at the distal end of the tree have the same length as the upstream clock transmission lines, there is no problem, provided that the clock transmission lines extending in opposite directions connected to one clock driver have the same delay amount, in the clock transmission lines at the distal ends of the tree. The clock signal on node 36 adjacent to synchronizing circuit (DLL) 7 is fed back to synchronizing circuit (DLL) 7 through buffer 42 and an interconnection line (dummy delay) 43. This configuration will be described later.

Referring to FIG. 7B, output nodes 31-0 to 31-15 of the clock distributing circuit are provided for DQ pad portions 23-0 to 23-15, respectively. In this clock distributing circuit for the DQ pad portions also, a clock driver 46a receiving a signal from clock driver 36*a* through a clock transmission line is provided at substantially the middle point between the node for which driver 36*a* is provided and a node 35 corresponding to the farthest point among the points to which the clock signal is transmitted. The output signal from clock driver 46*a* is turned back over clock transmission lines having the delay amount substantially equal to one half the delay a mount of the clock transmission line between drivers 36*a* and 46*a* and extending in opposite directions to each other. Similarly, for the drivers 46*b* and 46*c* provided for these transmission lines, clock transmission lines having one half the delay amount are connected. Thereafter, the ½ folding is repeated, and the clock transmission lines are divided to reach clock drivers 46*h* to 46*o* at the distal end.

To the output nodes of clock drivers 46*h* to 46*o* of the final stage, clock transmission lines having the same length as the clock transmission line of the preceding stage (upstream) are connected, and output nodes 31-0 to 31-15 are shown to be provided for outputting internal clock signals for data sampling, at the mid point of the clock transmission lines. In this case, there is no problem if the distances between output nodes 31-0 to 31-15 to the corresponding clock drivers 46*h* to 46*o* are the same and the delay times are the same. As in the configuration of the portion of the clock distributing circuit provided for the address and control input pad portion of FIG. 7A, the internal clock signals for data sampling may be output from end portions of the clock transmission lines at the distal end of the tree. In this case, output nodes 31-0 to 31-15 at the distal end of the tree are arranged at the middle portion of the clock transmission lines, and it seems as if the clock transmission lines provided are unnecessarily long. However, the clock transmission lines connected to drivers 46*h* to 46*o* on the final stage of the clock distributing circuit are similarly provided to ensure the same clock delay as that experienced at the address and control input pad portion.

Drivers 46*a* to 46*o* provided at respective divided stages of the clock transmission line divided into five stages have the same transmission characteristic as clock drivers 36*b* to 36*p* of the clock distributing circuit provided for the address and control input buffer portion shown in FIG. 7A. It is possible to ensure the same clock signal propagation delay at the output nodes on the distal end of the tree in the clock distributing circuit.

For example, assume that the clock propagation delay between a nearest node 34, which is the clock generating node, and the farthest node 35 among nodes at which the clock arrives is D. Here, propagation delay between clock driver 36*a* and node 34 is D/2. The delay between clock driver 36*a* and clock driver 36*b* shown in FIG. 7A is D/4. Because of the ½ folding, the delay between clock drivers 36*b* and 36*d* is D/8. The clock delay between clock drivers 36*d* and 36*h* is D/16, and the delay between clock drivers 36*h* and 36*p* is D/32. In the present embodiment, the delay amount from clock driver 36*p* to an end portion of the corresponding clock transmission line is D/32.

In FIG. 7B, the delay from clock driver 36*a* to clock driver 46*a* is D/4, the delay between clock drivers 46*a* and 46*b* is D/8, and the delay between clock drivers 46*b* and 46*d* is D/16. The delay over the clock transmission line between clock drivers 46*d* and 46*h* is D/32, and the clock delay amount from clock driver 46*h* to the node at the distal end of the clock transmission line is D/32. Therefore, in the clock distributing circuit, the nodes arranged in the shape of a tree are branched in symmetry to transmission lines having the same amount of delay, and therefore every clock output node has the same amount of clock delay. Accordingly, it becomes possible to perform data input/output and external address and control signal input, using an internal control signal without any clock skew.

The phase of the external clock signal applied to clock input by the portion 6 and the clock signal applied through clock distributing circuit 30 to DQ pad group 3*a* and peripheral pad group 4*a* will be described.

To the synchronizing circuit (DLL) 7, the external clock signal is applied from clock input pad portion 6. Clock input pad portion 6 includes a clock input pad 6*a*, and a clock input buffer 6*b* for buffering the signal applied to pad 6*a*. Synchronizing circuit (DLL) 7 receives a clock signal on a node 39 nearest to the synchronizing circuit (DLL) 7 of clock distributing circuit 30, and makes the clock signal on node 39 in phase with the clock signal applied from clock input buffer 6*b*. More specifically, it makes the phase of internal clock signal applied to DQ pad group 3*a* and peripheral pad group 4*a* to be equal to the phase of the clock signal input through clock input buffer 6*b*. Accordingly, in order to ensure the same signal propagation delay between clock input buffer 6*b* and synchronizing circuit (DLL) 7, a replica buffer 42 having the same propagation characteristic as clock input buffer 6*b* is provided at node 39, and a dummy delay 43 is provided at an interconnection line portion transmitting the output signal from replica buffer 42 to synchronizing circuit (DLL) 7. Dummy delay 43 adjusts the line length, so as to realize the same line delay as that experienced in the path from clock input buffer 6*b* to synchronizing circuit (DLL) 7, between replica buffer 42 and synchronizing circuit (DLL) 7.

An address main latch circuit 41 latches an address signal transmitted from the address pad portion included in the peripheral pad portion, and transmits it to each bank. The address pad portion takes and latches the applied signal substantially at a rise of the external clock signal and transmits the signal to address main latch circuit 41. There is a line delay from the address pad portion to address main latch circuit 41. In order to compensate for the line delay, a delay circuit 40 for delaying the clock signal from the output node of driver 36*p* by a prescribed time period is provided, and after the signal latched by the address pad portion is transmitted to main latch circuit 41, address main latch circuit 41 surely latches the transferred address (see FIG. 5).

Figure 8:
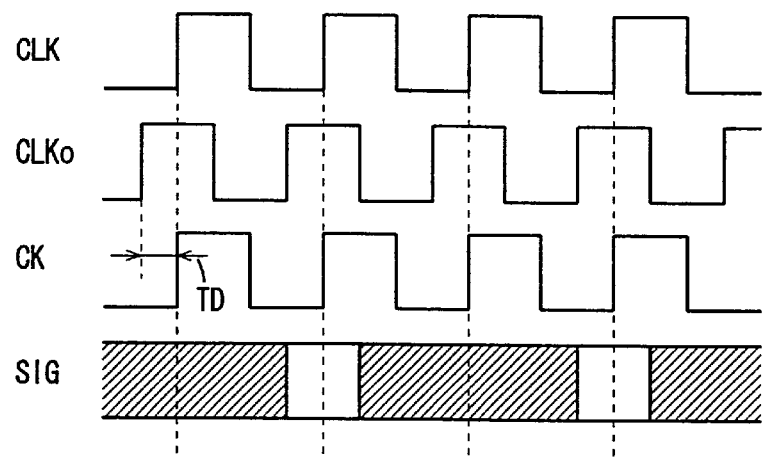
FIG. 8 represents phase relation between the external clock signal and the internal clock signal at the clock generating portion shown in FIG. 7A.

FIG. 8 is a timing chart representing an operation of synchronizing circuit (DLL) 7 shown in FIG. 7A. As can be seen from FIG. 8, the synchronizing circuit (DLL) makes the phases of the external clock signal CLK and fed back clock signal CK match each other.

Therefore, the clock signal CLKo output from synchronizing circuit (DLL) 7 to clock generating node 4 comes to be a clock signal farther advanced in phase than external clock signal CLK. The time period corresponding to the phase difference between the clock signals CLKo and CK corresponds to the delay time TD provided by the clock distributing circuit 30. The external address signal and a control signal SIG are applied from an external control unit, with the external clock signal CLK used as a reference. As the external signal SIG is taken by using the internal clock signal CK which is in phase with the external clock signal CLK, the external signal can be taken in at an accurate timing. Further, the clock signals CK applied to respective input buffers are in phase with each other and free of any clock skew. Therefore, there is not any skew in the timings of generating internal signals derived from the clock skew, and hence stable operation is possible.

Further, address main latch circuit 41 (corresponding to master latch 5*a* of FIG. 5) latches the signal with a delayed clock signal CK applied to the input buffer, and therefore the address signal is latched by the address input buffer, transferred to the central arranging region from the pad portion and thereafter, latched in accordance with the clock signal, whereby accurate latching operation is realized.

In the configuration of input buffer 25 shown in FIG. 5, when the internal clock signal CK attains to the H level, an external signal is taken in, an internal signal is generated and when the clock signal CK attains to the L level, latching state is attained. Therefore, the internal signal is set to the established state at a timing a little later than the rise of internal clock signal CK. In order to prevent this, a configuration may be used in which the buffer is set to the through state when the internal clock signal CK is at the L level and set to a latch state when the clock signal CK is at the H level (which is realized by inverting the logic of the clock of the input buffer circuit shown in FIG. 5). Other configurations are also possible.

Figure 9A:
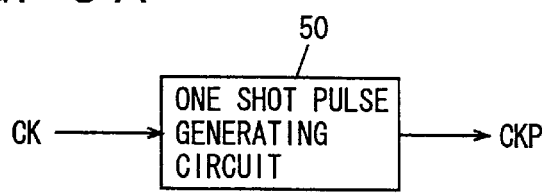
FIG. 9A represents a configuration of a clock generating portion for an input buffer.

FIG. 9A represents a configuration of the clock generating portion for controlling the input buffer. Referring to FIG. 9A, a one shot pulse generating circuit 50 for generating a one shot pulse signal CKP in response to the internal clock signal CK is provided. This circuit is provided corresponding to the output node of each distal end of the tree.

Figure 9B:
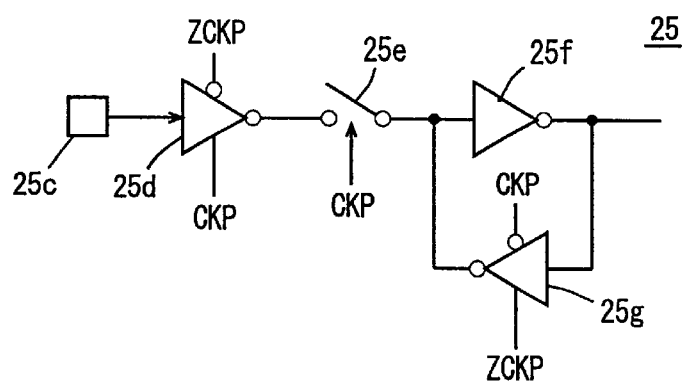
FIG. 9B represents a configuration of an input pad portion included in the peripheral pad groups of FIG. 6A.

FIG. 9B represents a configuration of the input buffer receiving the pulse signal CKP. In FIG. 9B, input buffer 25 has substantially the same configuration as that shown in FIG. 5 and simply receives the pulse signal CKP in place of internal clock signal CK. More specifically, input buffer 25 includes a tristate inverter buffer 25d which operates when the pulse signal CKP is at the H level and inverts a signal (for example, an address signal) applied to pad 25c; a transfer gate 25e rendered conductive when the pulse signal CKP is at the H level and transmitting an output of tristate inverter buffer 25d, an inverter 25f inverting the signal applied from transfer gate 25e, and a tristate inverter buffer 25g activated when the control pulse signal CKP is at the L level, for inverting the output signal from inverter 25f and transmitting the resulting signal to an input portion of inverter 25f.

Figure 9C:
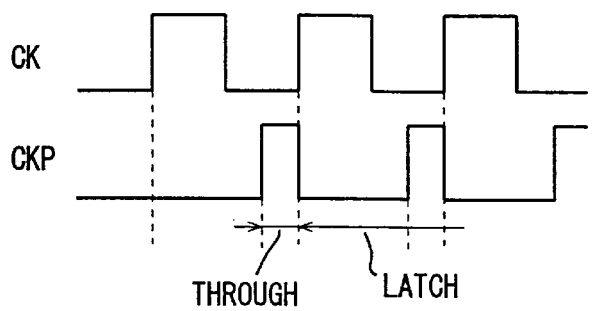
FIG. 9C is a diagram of signal waveforms representing an operation of the input pad portion of FIG. 9B.

FIG. 9C is a diagram of signal waveforms representing an operation of the circuit shown in FIGS. 9A and 9B. The control pulse signal CKP from one shot pulse generating circuit 50 is set to the active state when the internal clock signal CK is at the L level, and falls to the L level when the internal clock signal CK attains to the H level.

Therefore, in the input buffer shown in FIG. 9B, when the internal clock signal CK is at the L level and control pulse signal CKP is at the H level, the signal applied to pad 25c is inverted by tristate inverter buffer 25d and transmitted to transfer gate 25e. In this state, transfer gate 25e is maintained at the conductive state. When the clock signal CK rises to the H level, control pulse signal CKP attains to the L level in response, tristate inverter buffer 25d attains to the output high impedance state, while transfer gate 25e is rendered non-conductive and tristate inverter buffer 25g operates, establishing the latch state.

Therefore, when the configuration shown in FIGS. 9A and 9B is utilized, it is possible to generate an internal signal with the input buffer set to the latch state, in response to the rising edge of the internal clock signal CK. As the tristate inverter buffer 25d is set to the operable state and the signal is transmitted through transfer gate 25e to inverter 25f before the rise of internal clock signal CK, the internal signal can be set to the established state at an earlier timing.

Figure 10A:
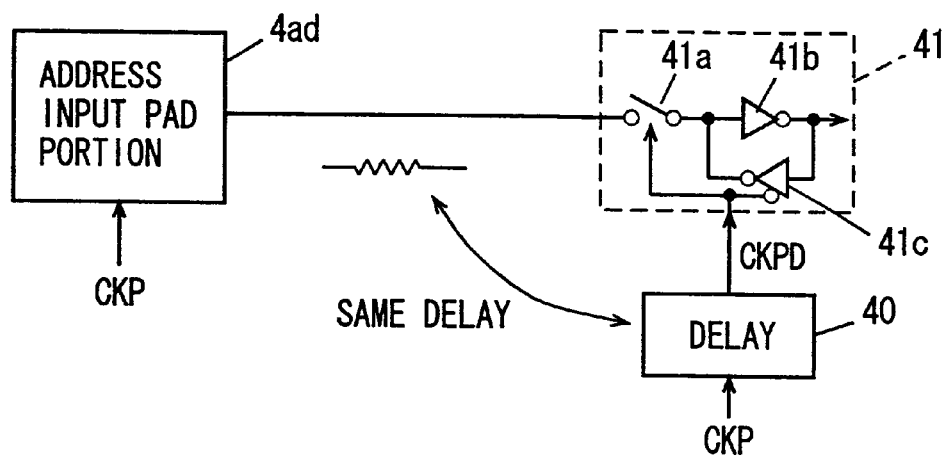
FIG. 10A schematically shows a signal propagation circuit for a main control latch circuit provided at a central portion from an input pad portion included in the peripheral pad groups.

FIG. 10A is a schematic diagram representing a configuration of the address main latch circuit. Referring to FIG. 10A, address main latch circuit 41 includes a transfer gate 41a which is rendered conductive when a delayed control pulse signal CKPD applied from a delay circuit 40 is at the H level. An output signal from transfer gate 41a is latched by an inverter 41b and a tristate inverter buffer 41c. Tristate inverter buffer 41c is set to the operable state when the delayed control clock signal CKPD is at the L level. Therefore, address main latch circuit 41 is set to the through state when the delayed control pulse signal CKPD is at the H level, and set to the latch state when the delayed control pulse signal CKPD is at the L level. Delay circuit 40 provides substantially the same delay time as the delay time of the, line between address input pad portion 4ad and address main latch circuit 41.

Figure 10B:
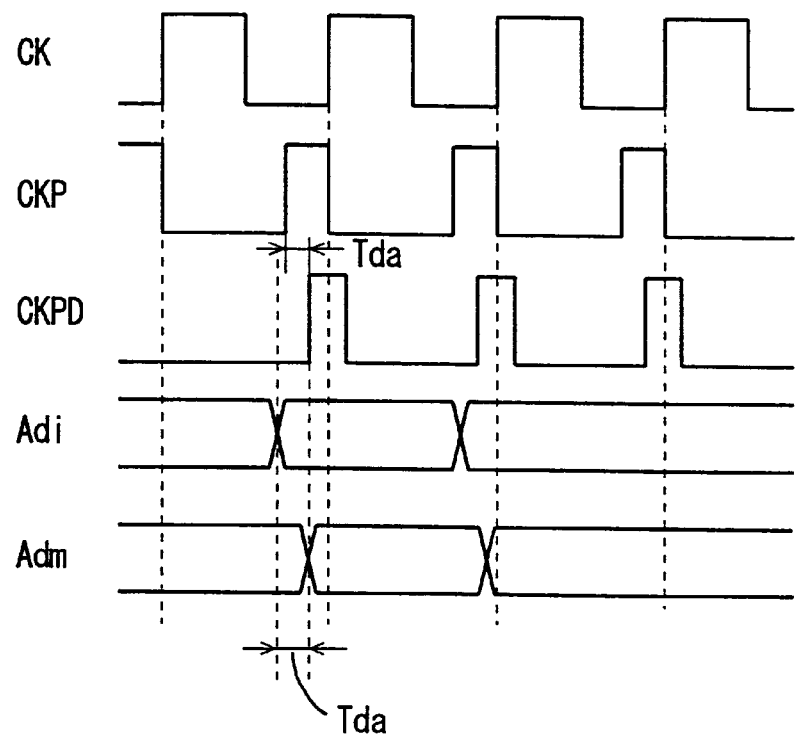
FIG. 10B is a diagram of signal waveforms representing an operation of the circuit portion shown in FIG. 10A.

As can be seen from FIG. 10B, when delayed control pulse signal CKP is at the H level, address input pad portion 4ad takes in and outputs the address signal applied to the input pad. The address signal from address input pad portion 4ad is transmitted to address main latch circuit 41 delayed by a prescribed time period Tda. At this time, the delayed control pulse signal CKPD from delay circuit 40 is also delayed by a prescribed time period. Therefore, when the address signal Adm applied to address main latch circuit 41 attains to the established state, delayed control pulse signal CKPD attains to the H level, transfer gate 41a is rendered conductive and the address signal is transmitted to the inside. When the delayed control pulse signal CKPD attains to the L level, transfer gate 41a is rendered non-conductive, and the applied address signal Adm is latched. Therefore, when the address signal Adi output from address input pad portion 4ad is transmitted to address main latch circuit 41 with the delay time of Tda, the applied address signal can be taken in accurately, as the address main latch circuit 41 is controlled by the delayed control pulse signal CKPD generated by delaying the control pulse signal CKP by the same delay time Tda.

Therefore, even when the distance from the address input pad and to the address main latch circuit arranged in the peripheral circuit arranging region are provided in the middle of the central region is long, it is possible to accurately take in, latch and transmit the applied address signal to each bank, because of the delay circuit 40.

As described above, according to the first embodiment of the present invention, as the clock propagation path is provided by nodes arranged in the shape of a tree with each node having a divided path, the clock can be transmitted accurately with the timings of internal signals for respective circuits matching with each other, and it becomes possible to take in external signals and to generate internal signals at the same timing without any clock skew. Therefore, higher speed of operation and stable operation are realized.

The one shot pulse generating circuit for generating the control pulse signal CKP may be formed, for example, by a delay circuit delaying the clock signal CK by a prescribed time period and an NOR gate receiving the output from the delay circuit and the internal clock signal CK.

Second Embodiment

FIG. 11A is a schematic diagram representing a configuration of a clock distributing circuit in accordance with a second embodiment of the present invention. In the example of FIG. 11A also, address/control input pad portions 51a to 51n are arranged aligned in the central region between banks, and at outside thereof, DQ pad portions 53p to 53w for data input/output are arranged. Adjacent to a clock input pad 6a arranged in the central region, a clock generating circuit 50 is arranged. Clock generating circuit 50 generate a clock signal at a clock generating node NFG, using an external clock signal CLK applied to clock input pad 6a as a reference signal. The clock propagation path from clock generating circuit 50 has a lop returning portion. The clock transmission line is formed in a loop having a forward path FP and a backward path BP, with a farthest point of clock signal transmission NFF being the returning point. The delay of the clock signal at the clock generating node NFG is almost 0, and the farthest node NFF which is the returning point is the node with maximum delay. On the forward path FP of the clock transmission line, nodes NFa to NFn, NFp, NFq, . . . , NFu, NFv and NFw are arranged corresponding to respective pad portions 51a to 51n and 53p to 53w.

On the backward path BP of the clock transmission line, nodes NBa, NBm, NBn, NBp, NBq, . . . , NBu, NBv and NBw are arranged opposing to respective nodes on forward path FP. The forward path FP and backward path BP are arranged substantially linear, and nodes NF and NB opposing to each other on the forward path FP and backward path BP serve as nodes providing delays symmetrical in time with respect to returning node NFF. More specifically, when the clock signal on returning node NFF is considered a reference, the delay time experienced at node NFu and the delay time experienced at node NBu have the same absolute value.

On forward path FP, a clock driver 57a is provided at a node NFM which provides a delay amount approximately one half the delay amount generated between the clock generating node NFG and returning node NFF. A feedback loop 55 is provided at the output of clock driver 57a, extending in the direction toward clock generating circuit 50. Feedback path 55 has a returning portion 55a, and therefore, the feedback path 55 comes to have such line length that provides substantially the same delay as the clock propagation delay from node NFM to returning node NFF on the forward path FP.

Clock generating circuit 50 generates an internal clock signal on clock generating node NFG such that the phase of the external clock signal CLK applied from clock input pad 6a matches the phase of the clock signal returned through feedback path 55. A node 55b on feedback path 55 corresponds to the returning node NFF in terms of time. Therefore, clock generating circuit 50 generates the internal clock signal such that the external clock signal CLK and the clock signal at returning node NFF are in phase with each other. corresponding to pad portions 51a to 51n and 53b to 53w, clock reproducing circuits 52a to 52n and 52p, 52q, . . . , 52u, 52v and 52w combining clock signals on corresponding nodes of the forward and backward paths to generate internal clock signals are provided. Clock generating circuit 50 makes the phase of the clock signal on returning node NFF match with the phase of the external clock signal CLK. Therefore, when the central middle phase of the signals on the nodes arranged opposing to each other on the forward and backward paths FP and BP is found, a clock signal synchronized with the external clock signal CLK is generated. Accordingly, clock signals in phase with the external clock signal can be applied to pad portions 51a to 51l and 53p to 53w.

FIG. 11B is a schematic diagram representing an exemplary configuration of clock generating circuit 50 shown in FIG. 11A. In FIG. 11B, DLL is used as the synchronizing circuit. Referring to FIG. 11B, clock generating circuit 50 includes: a clock input buffer 6b receiving a clock signal from, pad 6a; a replica buffer 50a having the same signal propagating property as clock input buffer 6d and receiving a clock signal on node 55b; a dummy delay 50b delaying an output signal on replica buffer 50a; a phase difference detecting circuit 50c for detecting a phase difference between a signal applied through dummy delay 50b and the clock signal from clock input buffer 6b; a charge pump circuit 50d performing charge pumping operation in accordance with the output signal from phase difference detecting circuit 50c to generate a control voltage; and a delay stage 50e delaying a clock signal from clock input buffer 6b in accordance with the control voltage from charge pump circuit 50d and generating an internal clock signal CK0 at clock generating node NFG.

In the configuration of clock generating circuit 50 shown in FIG. 11B, internal clock signal CK0 is output to clock generating node NFG such that external clock signal CLK applied to clock internal pad 6a and the clock signal applied to feedback node 55b are in phase with each other. In order that the phases match exactly, the signal propagation delay from feedback node 55b to phase difference detecting circuit 50c and the signal propagation delay from clock input pad 6a to phase difference detecting circuit 50c are made equal by replica buffer 50a and dummy delay 50b.

The signal propagation delay from feedback node 55b to node NFM is the same as the signal propagation delay from node NFF to returning node NFM. Clock buffers 57a to 57n all have the same signal propagation delay. Therefore, the phase of the clock signal at feedback node 55b is the same as the phase of the clock signal at returning node NFF, and hence the clock signal at returning node NFF is phase-synchronized with the external clock signal CLK.

Figure 12:
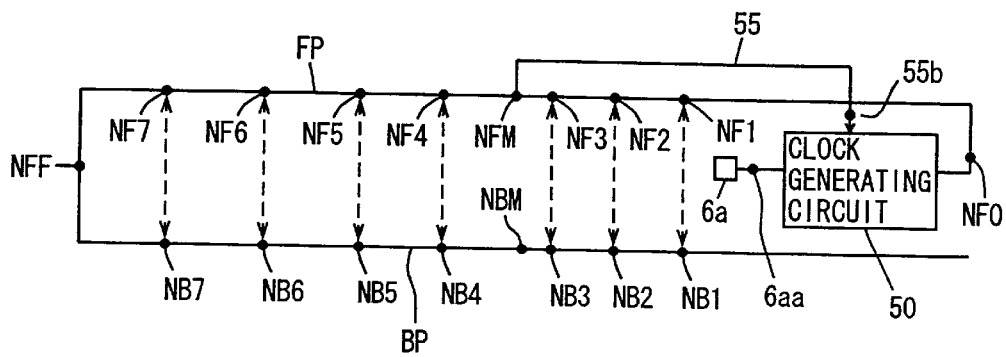
FIG. 12 represents a specific arrangement of the clock transmission line of FIG. 11A.

FIG. 12 represents a specific arrangement of nodes on the forward path FP and backward path BP of the clock transmission line. Referring to FIG. 12, on forward path FP of the clock transmission line, nodes NF1 to NF7 are arranged, and on the backward path BP, nodes NB7 to NB1 are arranged. The nodes NF1 to NF7 and NB7 to NB1 are arranged opposing to each other, at positions symmetrical in time, with returning node NFF being the center.

Now, consider that the signal propagation delay from clock generating node NF0 (corresponding to node NFG) to node NF1 on the forward path FP is twice the signal propagation delay between each of nodes NF1 to NF7.

Figure 13:
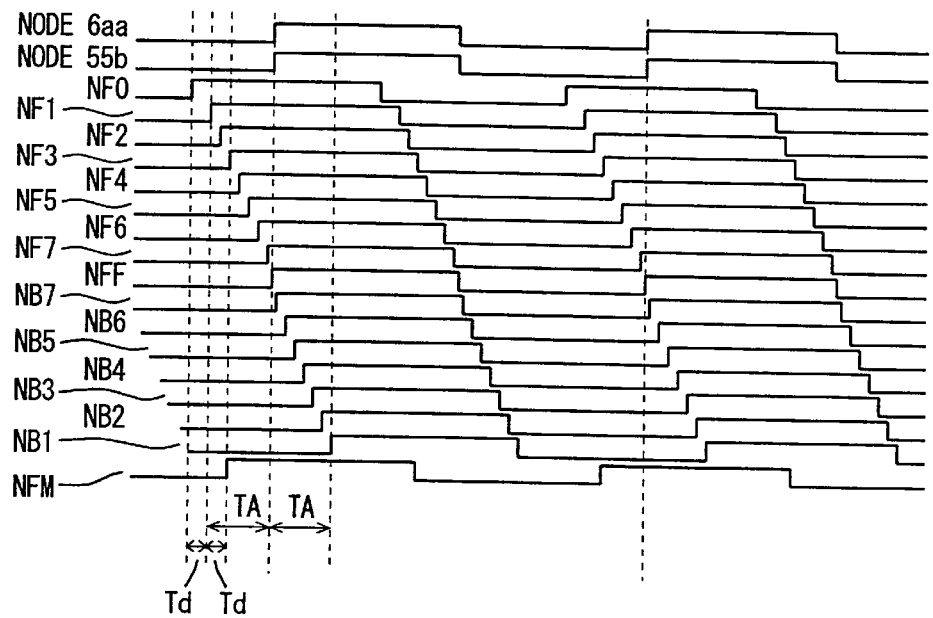
FIG. 13 represents waveforms of clock signals at respective nodes of FIG. 12.

FIG. 13 is a diagram of waveforms representing clock signal waveforms at respective nodes in the node arrangement of FIG. 12. As can be seen from FIG. 12, clock generating circuit 50 generates an internal clock signal on clock generating node NF0 such that the clock signal on node 6aa adjacent to clock input pad 6a has the same phase as the clock signal on feedback node 55b. Therefore, the clock signal on node NF0 is advanced in phase to the clock signal on node 6aa. The clock signal is transmitted over the forward path FP of the clock transmission line, and as the clock signal proceeds through nodes NF1 to NF7, the phase of the clock signal is delayed. The phase of the clock signal on returning node NFF matches the phase of the clock signal on node 6aa. On the backward path BP, with the returning node NFF being the reference, the clock signal has its phase further delayed. Nodes NB7 to NB1 on backward path BP are arranged opposing to nodes NF7 to NF1 on the forward path FP, and arranged at positions symmetrical in time with the returning point NFF being at the middle.

Therefore, as can be seen from FIG. 13, the absolute value of the difference between the phase of the clock signal on node NF1 and the phase of the clock signal on node 6aa is equal to the absolute value of phase difference between the clock signal on node NB1 and the clock signal on node 6aa.

More specifically, absolute value of time difference TA between a rising edge of the clock signal on nodes NB1 to NB7 on the forward path FP and a rising edge of the clock signal on returning node NFF is equal to the absolute value TA of time difference between a rising edge of the clock signal on corresponding nodes NF1 to NF7 on the returning path and the clock signal on returning node NFF. Therefore, when the clock signals on pair of corresponding nodes are combined and a signal of a central phase is generated, every combined clock signal has the same phase as the clock signal on returning node NFF. The internal clock signals of the central phase are generated by clock reproducing circuit 52a to 52w provided corresponding to the pad portions respectively. Accordingly, clock signals in phase with each other are applied to respective pad portions.

FIG. 14A is a schematic diagram representing a configuration of clock reproducing circuit 52. Referring to FIG. 14A, clock reproducing circuit 52 includes: a :delay chain DLST having a plurality of delay stages DL receiving and delaying clock signals CLF on corresponding nodes of the forward path FP; a tap chain TPST including tap stages TS provided corresponding to delay stages DL of delay chain DLST respectively, outputting a signal for selecting a corresponding delay stage DL of a delay chain DLST, in accordance with a time difference between a clock signal CKB of a corresponding node on the returning path and a clock signal CKF on a corresponding node of the going line; and a half delay chain HDLST having cascaded half delay stages HDL of which amount of delay is one half that of delay stage DL, in accordance with a delay stage designating signal from tap chain TPST, transmitting a signal on the corresponding half delay stage HDL to a clock output line OSL. The half delay chain HCLST delays the clock signal CKF on the corresponding node of the forward path.

FIG. 14B is a schematic diagram representing a configuration of the delay stage DL included in the delay chain DLST shown in FIG. 14A. Referring to FIG. 14B, the delay stage DL includes cascaded delay buffers DLa and DLb each delaying an applied clock signal by a prescribed delay time, and a buffer circuit DLc transmitting a signal output from delay buffer DLb to a corresponding tap stage TS. The delay time of buffer circuit DLc is negligible as compared with the delay times of delay buffers DLa and DLb.

FIG. 14C is a schematic diagram representing a configuration of half delay stage HDL of FIG. 14A. Referring to FIG. 14C, the half delay stage HDL includes a delay buffer HDLa delaying an applied clock signal by a prescribed time period, a buffer circuit HDLb transmitting an output signal from delay buffer HDLa, and a transfer gate HDLc rendered conductive in accordance with a delay stage designating signal applied from the corresponding to tap stage TS for transmitting the output signal from buffer circuit HDLb to output signal line OSL. Buffer circuit HDLb and transfer gate HDLc may be formed by one tristate buffer. Delay buffer HDLa has the same delay time as delay buffers DLa and DLb. Therefore, delay stage DL has the delay time of twice that of half delay stage HDL.

Figure 15A:
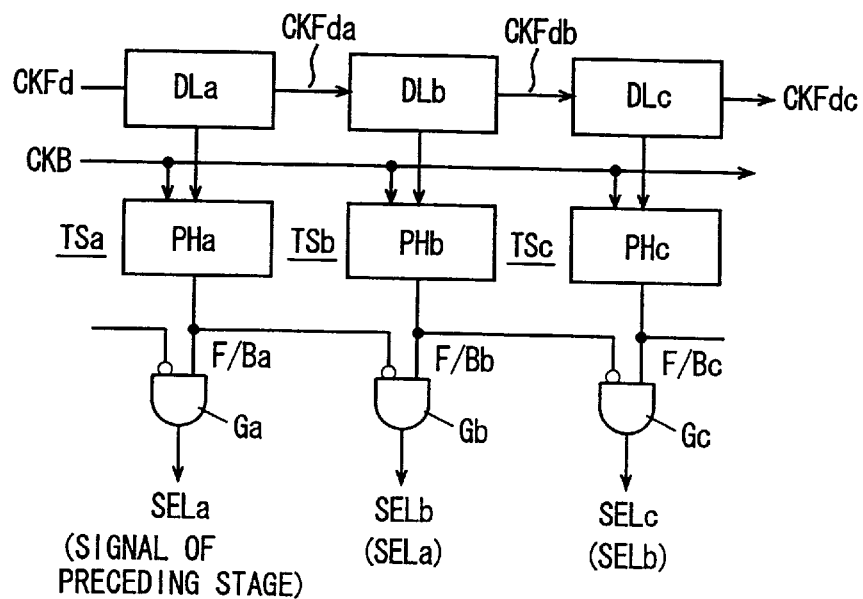
FIG. 15A schematically represents a configuration of a tap delay chain of FIG. 14A.

FIG. 15A is a schematic diagram representing a configuration of the tap stage shown in FIG. 14A. FIG. 15A represents tap stages TSa, TSb and TSc provided corresponding to delay stages DLa, DLb and DLc. Each of tap stages TSa to TSc includes a phase comparing stage PH (PHa to PHc) comparing phases of a delayed clock signal CKFd (CKFda to CKFdc) output from the corresponding delay stage DL (DLa to DLc) and the clock signal CKB on the corresponding node of the backward path, and a gate circuit G (Ga to Gc) receiving an output signal from the corresponding phase comparator PH (PHa to PHc) and an output signal of the phase comparator of the preceding stage. Phase comparator PH (PHa to PHc) outputs a signal at the L level when the phase of the clock signal from the corresponding delay stage DL (DLa to DLc) is advanced than the corresponding clock signal CKB on the returning line, and when the phase is matching or when the phase of the clock signal from the corresponding delay stage is behind the phase of the clock signal CKB, outputs a signal at the H level.

Each of the gate circuits G (Ga to Gc) drives, when the output signal of the corresponding phase comparator is at the H level indicating that the phase of the clock signal CKB is advanced than the delayed clock signal CKFd of the corresponding delay stage and the output signal from the phase comparator of the preceding stage is at the L level indicating that the phase of the delayed clock signal CKFd is advanced than the clock signal CKB, the corresponding selecting signal SEL (SELa to SELc) to the selected state of H level.

The clock signal CKB is applied commonly to each of the tap stages TS of tap chain TPST (see FIG. 14A) through a driver circuit. Therefore, in the tap chain TPST, the delay of clock signal CKB is considered almost negligible.

Figure 15B:
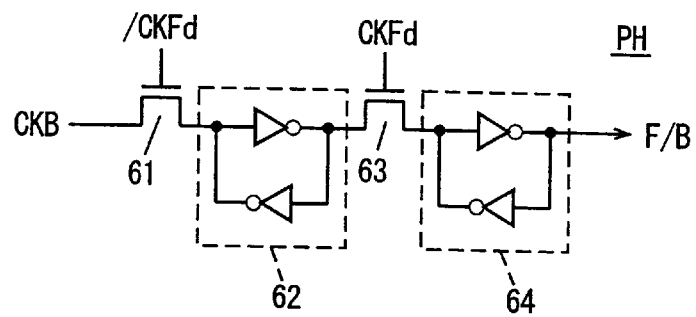
FIG. 15B represents an exemplary configuration of a phase detecting circuit of FIG. 15A, and FIGS. 15C and 15D are timing charts representing the operation of the phase detecting circuit of FIG. 15B.

FIG. 15B shows an exemplary configuration of phase comparator PH shown in FIG. 15A. The phase comparator includes: a transfer gate 61 responsive to a complementary delayed clock signal/CKFd at the H level, for transmitting the clock signal CKB; an inverter latch 62 latching the clock signal applied through transfer gate 61; a transfer gate 63 responsive to the delayed clock signal CKFd at the H level for transmitting the signal latched by inverter latch 62; and an inverter latch 64 latching the signal applied through transfer gate 63 and outputting a phase detecting signal F/B.

In the configuration of the phase comparator PH shown in FIG. 15B, when the delayed clock signal CKFd is at the H level, transfer gate 61 is rendered non-conductive, to establish latch state. In this state, transfer gate 63 is rendered conductive and transmits the signal from inverter latch 62 to inverter latch 64. When the delayed clock signal CKFd is at the L level, transfer gate 61 is rendered conductive to transmit the clock signal CKB to inverter latch 62. Therefore, phase comparator PH is set to the latch state at a rising edge of clock signal CKFd, and takes, latches and transfers the clock signal CKB applied when the clock signal CKFd is at the L level FIGS. 15C and 15D are timing charts representing an operation of the phase comparator shown in FIG. 15B.

Figure 15C:
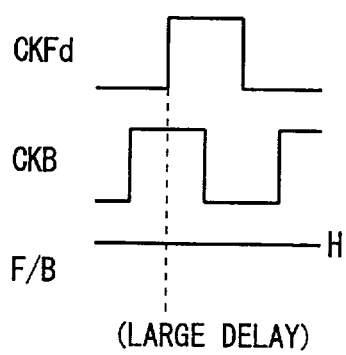

As can be seen from FIG. 15C, if the clock signal CKB is advanced in phase than delayed clock signal CKFd, the clock signal CKB at the H level is taken through transfer gate 61 at a rising edge of delayed clock signal CKFd and latched by inverter latch 62. In response to a rise of the delayed clock signal CKFd, transfer gate 63 is rendered conductive, and outputs the signal latched by inverter latch 62. Therefore, in this state, phase detection signal F/B is at the H level. As delayed clock signal CKFd is lagged in phase behind clock signal CKB, it represents that the delay amount in the delay stage is too large.

Figure 15D:
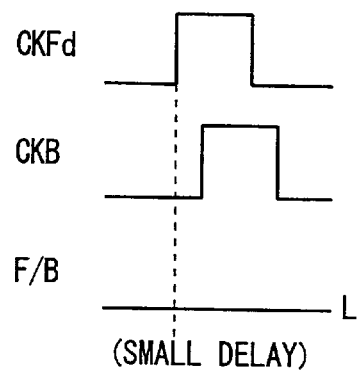

By contrast, as can be seen from FIG. 15D, if the delayed clock signal CKFd is advanced in phase than clock signal CKB, the clock signal CKB at the L level is transmitted through transfer gate 61 to inverter latch 62 when the delayed clock signal CKFd is at the L level. When delayed clock signal CKFd rises to the H level, transfer gate 61 is rendered non-conductive, and the L level signal is latched by inverter latch 62.

Therefore in synchronization with the rise of delayed clock signal CKFd, transfer gate 63 is rendered conductive, and transmits the signal latched by inverter latch 62 to inverter latch 64. In this state, therefore, the phase detection signal F/B is maintained at the L level. When the delayed clock signal CKFd is advanced in phase than clock signal CKB, it means that the delay amount in the delay stage of the delayed clock signal CBFd is insufficient.

Therefore, by detecting a stage at which the phase detection signal F/B makes a transition from L to H level by using gate circuits Ga to Gc shown in FIG. 15A, it is possible to detect a delay stage where the delayed clock signal CKFd and clock signal CKB are in phase with each other.

In the delay chain DLST shown in FIG. 14A, when the number of the stage where the delayed signal and the clock signal are in phase with each other is detected, the corresponding delay stage is selected in half delay chain HDSLT. In the half delay chain HDSLT, the delay time of delay stage is one half that of the delay stage DL in the delay chain DLST. Therefore, a clock signal having the delay time one half that of the delay chain DLST is output from the half delay chain. Accordingly, a clock signal having a central phase can be generated.

Figure 16:
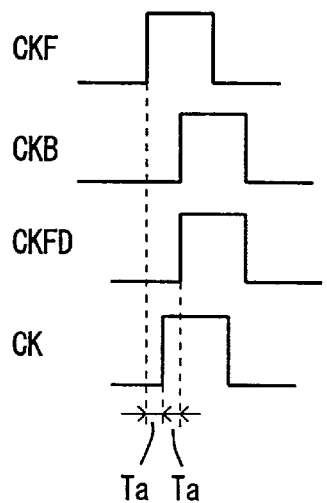
FIG. 16 is a diagram of signal waveforms representing an operation of the clock re producing circuit of FIG. 14A.

More specifically, as can be seen from FIG. 16, when the phase difference (delay time) between the clock signal CKF on the forward path and the corresponding clock signal CKB on the backward path is 2·Ta, the delayed clock signal CKFd is in phase with the clock signal CKB, and hence it has the delay time of 2·Ta with respect to the clock signal CKF on the forward path. The half delay chain generates a clock signal having the delay time which is one half the delay time 2·Ta of the delayed clock signal CKFd. Therefore, the clock signal CK from the clock reproducing circuit can still be a signal having a central phase between clock signals CKF and CKB.

In the configuration of FIG. 15A, a tap stage where phase detection signal F/B makes a transition from L to H level is detected, and a tap stage corresponding to the phase detection signal at the H level at this transition point is detected. Conversely, a tap stage corresponding to an L level detection signal at the transition point may be selected. The reason for this is that when clock signals CKB and CKFd are the same in phase, the phase difference detecting signal may possibly be set to the L level. Either of these configurations may be selected, dependent on the characteristics of the phase comparator PH (considering the delay of transfer gate) (the manner of detecting the transition point is represented in parenthesis for each selection signal in FIG. 15A).

As described above, in accordance with the second embodiment of the present invention, the clock transmission line is formed in a loop with the farthest point among the points to which the clock reaches being a returning point, and internal clock signals are generated to be applied to internal circuits based on the clock signals on corresponding nodes on the forward and backward paths. Therefore, all the internal clock signals are made to have the same phase, so that internal circuits can be operated without the need of considering clock skew, and therefore a semiconductor circuit device operating stably at high speed can be obtained.

Third Embodiment

Figure 17:
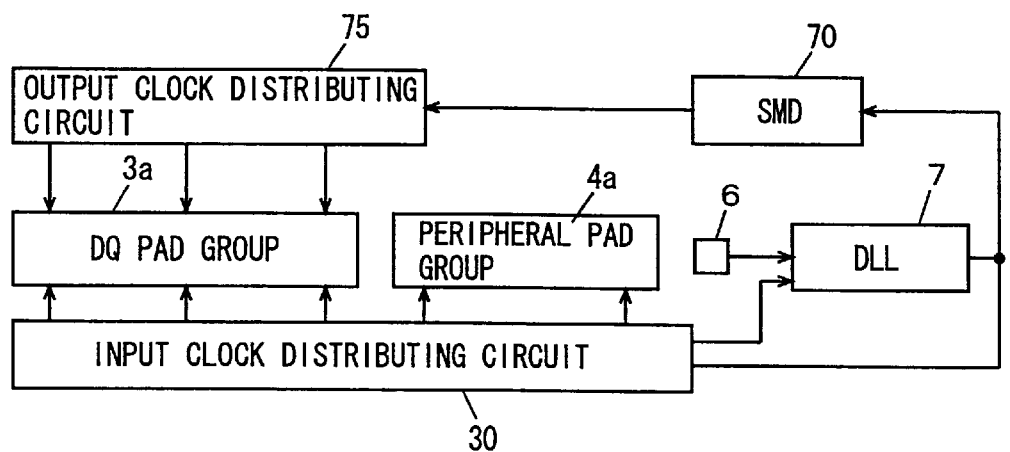
FIG. 17 schematically represents a configuration of a main portion of the semiconductor memory device in accordance with a third embodiment of the present invention.

FIG. 17 is a schematic diagram representing a configuration of a main portion of the semiconductor memory device in accordance with a third embodiment of the present invention. The configuration of FIG. 17 includes an output synchronizing circuit (SMD: synchronous mirror delay) 70 receiving an internal clock signal from synchronizing circuit (DLL) 7, and an output clock distributing circuit 75 delaying the clock signal from output synchronizing circuit (SMD) 70 and transmitting the delayed signal to a data output buffer included in DQ pad group 3a. Except for these points, they configuration is the same as the first or second embodiment. The clock signal from synchronizing circuit (DLL) 7 is applied to input buffers included in DQ pad group 3a and input buffers included in peripheral pad group 4a through input clock distributing circuit 30.

Output synchronizing circuit (SMD) 70 compares a difference between an output signal from synchronizing circuit (DLL) 7 and an output clock signal preceding by 2 or 3 clock cycles the output signal, and adjusts the phase of the output signal such that the difference is always constant.

The output clock distributing circuit 75 has nodes (clock drivers) arranged in the shape of a tree as in the first embodiment described above, and provides output clock signals having the same delay time to output buffers included in DQ pad group 3a. The output buffer transfers data in synchronization with the clock signal.

Figure 18:
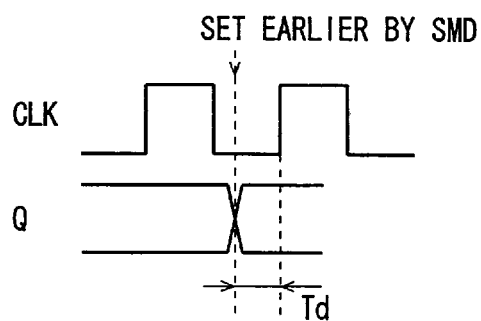
FIG. 18 is a diagram of signal waveforms representing an operation of a clock transmitting system of FIG. 17.

Output synchronizing circuit (SMD) 70 makes the phase of the output clock signal to the output buffer included in DQ pad group 3a advanced than that of the internal clock signal to the input buffer. Therefore, output data Q from DQ pad group 3a attains the established state with a set up time of Td with respect to external clock signal CLK, as can be seen from FIG. 18. Output data Q is sampled by an external controller or a processor, not shown. When the external controller or the processor samples the data Q transferred in synchronization with a rising edge of the external clock signal CLK, it is necessary to take into account the propagation delay time of output data Q the processor or the control unit, and therefore it is necessary to output data Q at an earlier timing (external clock signal CLK is output from the controller or the processor).

As to the input data, the input data and the external clock signal are transmitted to the semiconductor memory device along the same direction, and therefore what is necessary is to consider the delay caused by the skew on the signal lines. Therefore, the input data and the external clock signal CLK reaches the semiconductor memory device substantially at the same timing. As to the output data, the external clock signal and the output data are transferred in opposite directions, and therefore it is necessary to take into account the propagation delay time of output data Q. Therefore, the data output timing is set earlier by using output synchronizing circuit (SMD) 70. The external control or processor samples the data Q transferred from the semiconductor memory device in synchronization with external clock signal CLK with sufficient margin.

Figure 19:
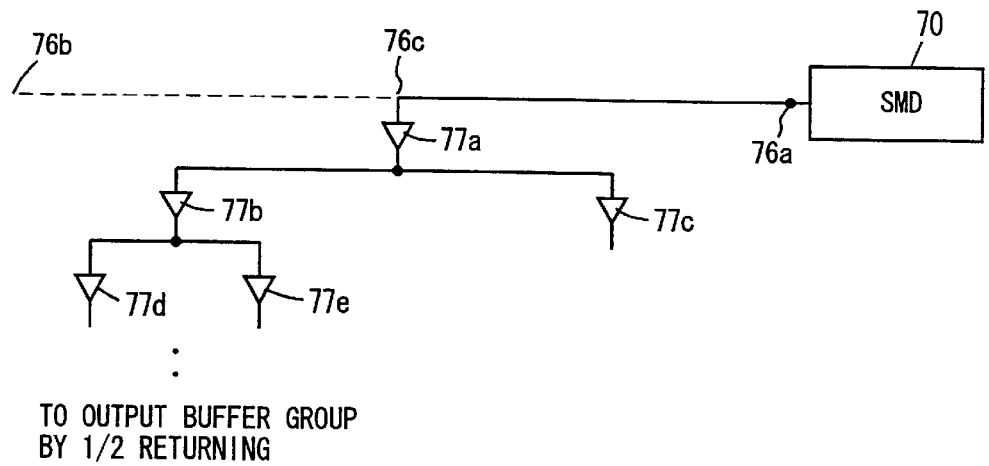
FIG. 19 schematically represents a configuration of an output clock distributing circuit shown in FIG. 17.

FIG. 19 is a schematic diagram representing a configuration of the output clock distributing circuit shown in FIG. 17. Referring to FIG. 19, a clock propagation path is formed to a middle point 76c (where the delay amount is ½) between a clock generating node 76a and the farthest point 76b of clock transmission, from the output synchronizing circuit (SMD) 70. A clock driver 77a is arranged at node 76c and transmits a signal at high speed with large driving capability. From driver 77a, there are provided transmission lines of the same delay amount toward the farthest point and the nearest point (clock generating node), and at end portions of these transmission lines, clock drivers 77b and 77c are arranged. Clock transmission lines extending in opposite directions are connected to an output node of clock driver 77b, and at end portions of these lines, clock drivers 77d and 77e are connected. In the similar manner, for clock drivers 77d and 77e, branches of clock transmission lines are formed successively in ½ folding configuration, and clock signals are transmitted to output buffer group. In a corresponding region of clock driver 77c, only the address signal and control signal input buffer is provided, and there is not a path for transmitting the output clock signal. Clock driver 77c has identical characteristic as clock driver 77b, and is provided to make equal the amount of delay of the clock transmission lines extending in opposite directions and connected to clock driver 77a.

When the configuration of output clock distributing circuit 75 is utilized as. shown in FIG. 19, branched clock transmission lines having the same amount of delay can be formed at each clock branching node, and therefore the same delay amount is ensured for the output buffers. Accordingly, data output can be done at the same timing.

Figure 20:
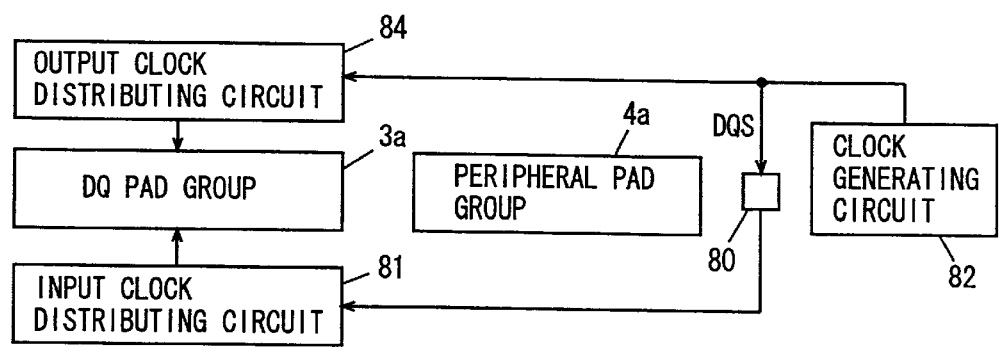
FIG. 20 schematically shows a configuration of a main portion of a semiconductor memory device in accordance with a fourth embodiment of the present invention.

As described above, according to the third embodiment of the present invention, the clock signal for data output is formed in a system different from the dock signal for data input. Therefore, the timing of data output can be set independent from the timing of data input, allowing an external controller or a processor to sample the transferred data in synchronization with the external clock with sufficient margin, whereby system reliability is improved Fourth Embodiment FIG. 20 is a schematic diagram representing a configuration of a main portion of the semiconductor memory device in accordance with a fourth embodiment of the present invention. The configuration of FIG. 20 is provided for DQ pad group 3a and includes an input clock distributing circuit 81 generating an internal clock signal controlling activation/inactivation of an input buffer included in DQ pad group 3a in accordance with a data input/output strobe signal DQS from a data input/output strobe signal input pad 80, a clock generating circuit 82 generating an internal clock signal in accordance with an external clock signal, not shown, and an output clock distributing circuit 84 delaying by a delay tree (a group of nodes arranged in the shape of a tree) the internal clock signal from clock generating circuit 82 and applying the delayed signal to output buffers included in DQ pad group 3a.

The internal clock signal from clock generating circuit 82 has its delay adjusted and thereafter, is output as the data output strobe signal DQS through a pad 80, signaling external controller or processor of an output of a valid data.

Figure 21:
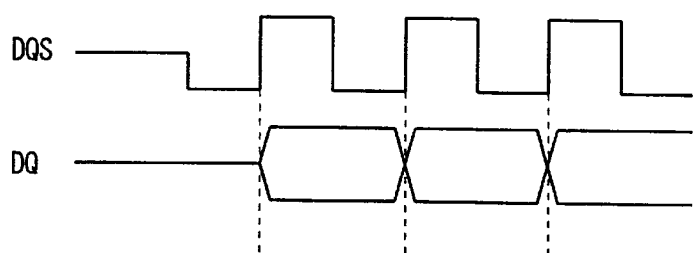
FIG. 21 is a diagram of signal waveforms related to a function of a data input/output strobe signal of FIG. 20.

FIG. 21 represents timing relation between data input/output strobe signal DQS and the input/output data. When there is no data input/output, the data input/output strobe signal DQS is set to the high impedance state. When the valid data is input, data is output or input in accordance with a cycle defined by the data input/output strobe signal DQS. It is possible for the external controller or the processor to know the exact timing of taking the transfer data, as read data DQ is transmitted in the cycle defined by the data input/output strobe signal DQS. At the time of data input, it is possible to take the applied input data accurately, by setting the input buffer included in DQ pad group 3a active/inactive in accordance with the data input/output strobe signal DQS.

In the configuration shown in FIG. 20, in DQ pad group 3a, therefore, input clock distributing circuit 81 takes the input data applied externally, in accordance with the data input/output strobe signal DQS. Though not explicitly shown in FIG. 20, the internal clock signal from clock generating circuit 82 is applied to the input buffers included in peripheral pad group 4a.

Figure 22:
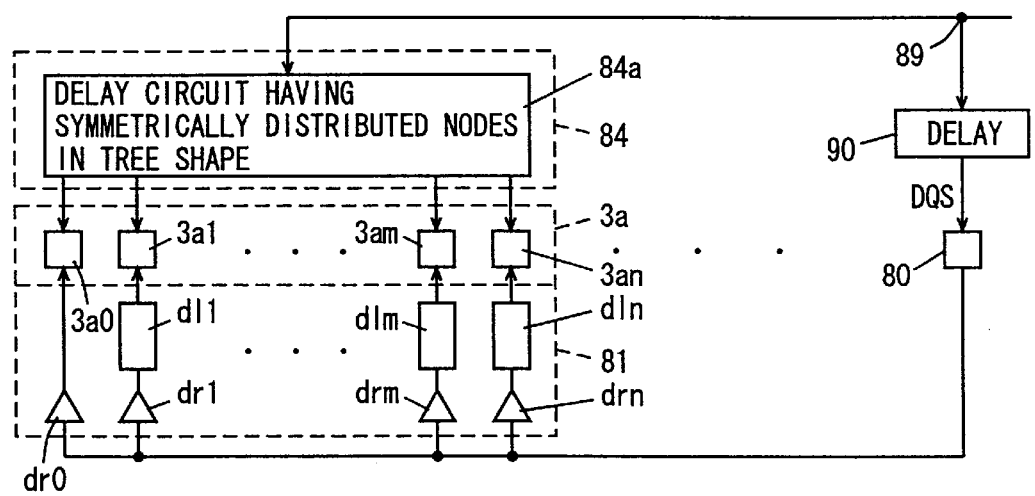
FIG. 22 is a schematic diagram representing a configuration of a clock distributing circuit shown in FIG. 20.

FIG. 22 is a schematic diagram representing a configuration of input clock distributing circuit 81 and output clock distributing circuit 84 shown in FIG. 20. Referring to FIG. 22, input clock distributing circuit 81 includes clock drives DR0 to DRn provided corresponding to DQ pad portions 3a0 to 3an of DQ pad group 3a, respectively, and delay elements dl1 to dln provided corresponding to clock drivers DR1 to DRn, delaying an applied signal by a prescribed time period and applying the delayed signal to input buffers included in the corresponding DQ pad portions, respectively. Delay times of delay elements dl1 to dln are made shorter as the distance from the pad 80 receiving data input/output strobe signal DQS becomes longer.

At an output portion of clock driver DR0, delay element is not provided. The delay elements dl1 to dln are formed by an inverter or a line, and compensate for the deviation in the delay time experienced by the corresponding input buffers, respectively. In DQ pad group 3a, DQ pad portions 3a0 to 3an are arranged aligned in line (as is particular in the LOC configuration), and therefore a configuration may be employed in which the delay elements dl1 to dln are adapted to have successively decreasing delay times, in accordance with the pitch between the input/output buffers. Clock drivers DR0 to DRn are coupled to pad 80 through a clock transmission line arranged extending linearly, in FIG. 22.

Output clock distributing circuit 84 includes a delay circuit 84a having symmetrically distributed nodes in a tree shape, receiving a clock signal applied to node 89 from clock generating circuit 82, delaying the received signal by a prescribed time period and applying the delayed signal to output buffers included in DQ pad portions 3a0 to 3an. The configuration of delay circuit 84a having symmetrically distributed nodes in tree shape is the same as that described with reference to the first embodiment. By the provision of nodes in ½ folding configuration, symmetrical clock transmission lines are formed, and clock signals having the same delay time can be transmitted to output buffers. To pad 80, the clock signal on node 89 is applied through a delay circuit 90, and a signal providing the timing of output of valid data is output to the external controller or the processor. Therefore, the delay time of the delay circuit 90 is made equal to the sum of the delay time over the clock transmission line from node 89 to the input of delay circuit 84a, and the delay time experienced in the delay circuit 84a having the symmetrically distributed nodes in tree shape. Accordingly, a signal having the same phase as the internal clock signals applied to output buffers included in DQ pad portions 3a0 to 3an is applied to pad 80.

Figure 23A:
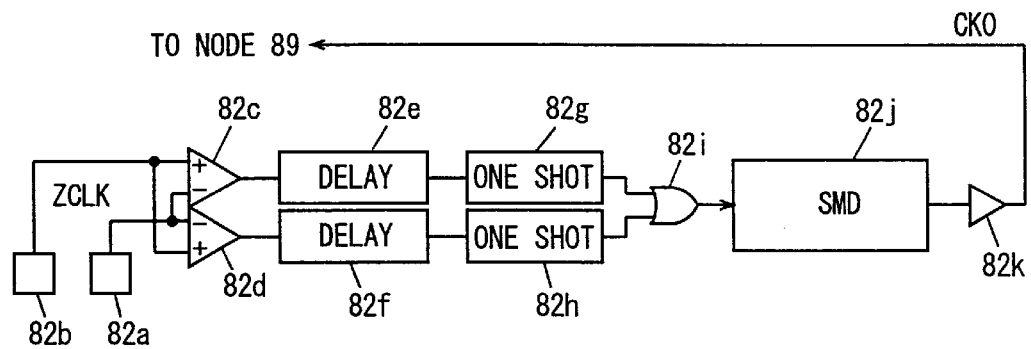
FIG. 23A represents a specific configuration of the clock generating circuit shown in FIG. 20.

FIG. 23A is a schematic diagram representing a configuration of clock generating circuit 82 shown in FIG. 20. Referring to FIG. 23A, clock generating circuit 82 includes: buffers 82c and 82d for complimentarily and differentially amplifying complementary clock signals CLK and ZCLK respectively applied to clock input pads 82a and 82b; a delay circuit 82e for delaying an output signal of buffer 82c by a prescribed time period; a delay circuit 82f delaying an output signal of buffer 82d by a prescribed time period; a one shot pulse generating circuit 82g responsive to a rise of the output signal of delay circuit 82e for generating a one shot pulse signal; a one shot pulse generating circuit 82h responsive to a rise of the output signal of delay circuit 82f for generating a one shot pulse signal; an OR circuit 82i calculating a logical sum of output signals of one shot pulse generating circuits 82g and 82h; a synchronizing circuit (SMD) 82a generating clock signals synchronized in phase in accordance with an output signal from OR circuit 82*i*; and a replica buffer 82*k* buffering an output signal from synchronizing circuit 82*j* and transmitting the resulting signal to node 89 (see FIG. 22).

Figure 23B:
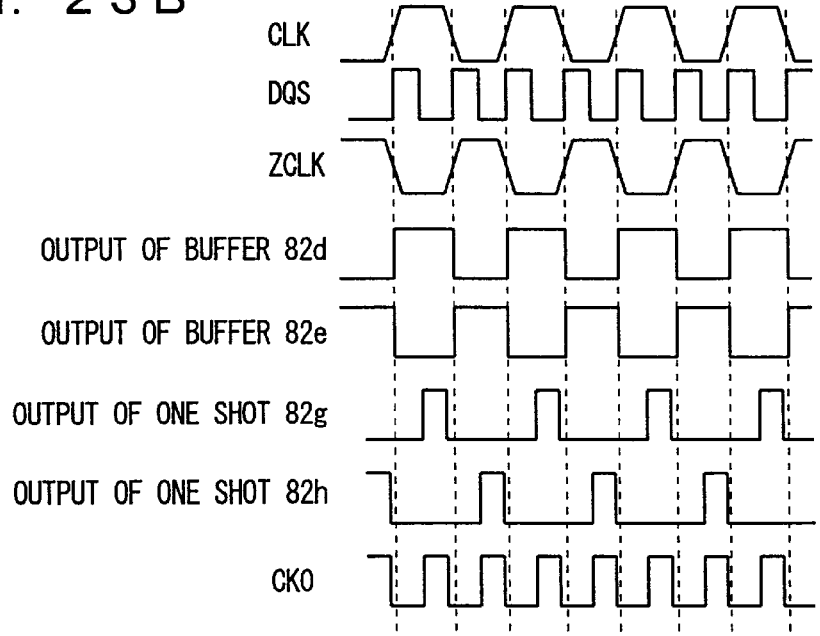
FIG. 23B is a diagram of operational waveforms thereof.

Replica buffer 82*k* has the same signal propagation characteristic as buffers 82*c* and 82*d*, and provides the same delay time. Delay circuits 82*e* and 82*f* have the same delay time as delay circuit 90. Therefore, the internal clock signal CK0 is output such that the clock signal applied to clock input pads 82*a* and 82*b* match in phase with the data input/output strobe signal DQS applied to pad 80 shown in FIG. 22. An operation of the clock generating circuit shown in FIG. 23A will be described with reference to a diagram of signal waveforms of FIG. 23B.

Clock input buffers 82*c* and 82*d* have the configurations of differential amplifiers, and compare complementary clock signals CLK and ZCLK. Therefore, signals making transitions in synchronization with a crossing portion (crossing of rise and fall) of complementary clock signals CLK and ZCLK are output. One shot pulse generating circuits 82*g* and 82*h* generate one shot pulse signals having a prescribed pulse width, when a signal applied through delay circuits 82*e* and 82*f* rises. The output signals from one shot pulse generating circuits 82*g* and 82*h* are applied through OR circuit 82*i* to synchronizing circuit (SMD) 82*j*.

Synchronizing circuit 82*j* receives the signal applied from OR circuit 82*i* and generates an output signal with the phase of the present cycle adjusted such that the output signal preceding by 2 or 3 clock cycles is in phase with the output signal of the present cycle. Therefore, a signal of matching phase is constantly output as internal clock signal CK0 through replica buffer 82*k*. The internal clock signal CK0 is adjusted such that the external clock signal CLK and the data input/output strobe signal DQS applied to pad 80 of FIG. 22 are in phase with each other. Therefore, it is possible to generate the data input/output strobe signal DQS in synchronization with the external clock signal CLK, and further, the output buffers included in DQ pad group 3*a* also perform data output operations at the same timing.

As described above, according to the fourth embodiment of the present invention, even when the data input/output strobe signal is used, a clock delay net is formed by utilizing nodes arranged in the shape of a tree, and the internal clock signal is transmitted through the clock delay net and output as the data input/output strobe signal. Therefore, data output at an accurate timing is possible.

For the input buffers, the data input/output strobe signal has its delay time adjusted in accordance with the distance from the data input/output strobe signal input pad to each respective input buffer pad, whereby it is possible to perform data input in accordance with the data input/output strobe signal at an accurate timing.

From the synchronizing circuit (SMD), a clock signal having a frequency of twice the frequency of external clock signal CLK is output, providing starting and sampling timings of valid data. Here, double data rate transfer clocks may be output, for transferring data at the rising and falling edges of the clock signal CLK. In this case, new data is transferred at each rise of clock signal CK0.

Further, by adjusting synchronizing circuit 82*j*, it is possible to perform data output, by setting the output buffers included in the DQ pad group to the active state at an earlier timing than the external clock signal CLK.

Fifth Embodiment

FIG. 24 is a schematic diagram representing a configuration of a main portion of the semiconductor memory device in accordance with the fifth embodiment of the present invention. In FIG. 24, a configuration of a clock generating circuit 100 applying an internal clock signal to peripheral pad group 4*a* through a clock distributing circuit 95 is shown. The peripheral pad group 4*a* receives external address signals and command signals. In clock distributing circuit 95, nodes are arranged symmetrically in the shape of a tree, providing a branched delay propagation path, which is similar in configuration as that of the first embodiment.

Clock generating circuit 100 includes: buffers 102*a* and 102*b* receiving externally applied clock signals CLK and ZCLK complementary to each other through input pads 101*a* and 101*b*; a replica buffer 103 having the same signal propagation characteristic as buffers 102*a* and 102*b*, receiving a clock signal generated at a node nearest to clock generating circuit 100 of clock distributing circuit 95; a variable delay circuit 104 delaying an output signal from replica buffer 103; a phase difference detecting circuit 105 detecting phase difference between an output signal from buffer 102*a* and an output signal from variable delay circuit 104; a delay stage 106 delaying an applied signal; and a delay control circuit 107 adjusting an amount of delay of delay stage 106 in accordance with an output signal from phase difference detecting circuit 105.

Buffers 102*a* and 102*b* have the configuration of differential amplifiers (see FIG. 23A), detect a crossing portion of complementary clock signals CLK and ZCLK, and generate clock signals making transitions at the crossing points. The internal clock signal generated inside and the clock signals CLK and ZCLK applied externally to clock input pads 101*a* and 101*b* have different amplitudes and different rise/fall times. Variable delay circuit 104 of which delay time is variable is used for adjusting these characteristic to ensure the same timings.

The clock generating circuit 100 further includes: a frequency dividing circuit 108 dividing the frequency of an output signal of a delay stage 106*m* at the center of delay stage 106 by 4; a multiplexer 109 selecting one of an output signal from delay stage 106 and an output signal from frequency dividing circuit 108 in accordance with a selecting signal S1; a multiplexer 110 selecting one of an output signal from buffer 102*a* and an output signal from multiplexer 109 in accordance with a selecting signal S2; a clock driver 111 buffering the signal applied from multiplexer 110 and transmitting the resulting signal to clock distributing circuit 95 with large driving capability; a multiplexer 112 selecting one of an output signal from buffer 102*a* and an output signal from an output node 106*m* at the middle stage of delay stage 106 in accordance with a selecting signal S4 and applying the selected signal to an input portion of delay stage 106; a multiplexer 113 selecting one of the output signal from output node 106*m* at the middle stage of delay stage 106 and an output signal from delay stage 106 in accordance with a selecting signal S3; and a multiplexer 114 selecting one of an output signal from multiplexer 113 and the output signal of buffer 102*a* in accordance with a selecting signal S5 and applying the selected signal to a driver 115. Multiplexers 109, 110, 112, 113 and 114 include a tristate inverter buffer for selecting a signal.

Delay stage 106 includes an even number of stages of inverters. Therefore, when an output of a delay element in the middle of (at the center of) the delay stage 106 is selected in accordance with the selecting signal S4, a ring oscillator consisting of an odd number of stages of inverters is formed (which configuration will be described later). Therefore, in this case, delay stage 106 starts free-running oscillation, of which oscillation frequency is controlled by a delay control circuit 107. The output node 106*m* of the delay element at the center of delay stage 106 is selected in order to make equal the delay time provided by the preceding stages of the delay stage 106 with the delay time in one period of the clock signal when the delay stage 106 operates as a ring oscillator (in a ring oscillator, a delay time of twice the number of inverter stages is generated in the input clock signal and the output clock signal).

The clock signal selected by multiplexer 114 is applied to various internal circuits through driver 115 having a large driving force. The internal circuits include a circuit for controlling write/read, a circuit for defining a circuit burst length period for row selection, and a command decoder generating an internal operation designating signal by decoding an internal command signal.

When the semiconductor memory device is fully synchronous circuitry, the internal circuits all operate in synchronization with the clock signal. Therefore, the internal circuit may differ dependent on the internal configuration of the semiconductor memory device.

Further, in the clock generating circuit, the address signal and the command signal applied to peripheral pad portion 4*a* are taken at a rising edge of the clock signal CLK. The setting, however, may vary dependent on the specification of the chip, and therefore there are various modifications. Though complementary external clock signals CLK and ZCLK are applied, the application of signals may also differ dependent on chip specification. The complementary clock signal may not be used. The operation of the clock generating circuit of FIG. 24 will be described in the following.

FIG. 25 shows a manner of connection of the clock generating circuit in a normal operation mode. In the normal operation mode, multiplexer 109 selects the output signal from delay stage 106 in accordance with the selecting signal S1, and multiplexer 110 selects the output signal from selector 109 in accordance with the selecting signal S2 and applies it to a clock driver 111 having a large driving capability.

Further, multiplexer 113 selects and applies to multiplexer 114 the output signal of delay stage 106 in accordance with the selecting signal S3, and multiplexer 112 selects the output signal of clock input buffer 102*a* in accordance with the selecting signal S4. Multiplexer 114 selects and applies to driver 115 the output signal of clock input buffer 102*a* in accordance with the selecting signal S5. Driver 115 transmits the applied clock signal to internal circuitry with large driving power.

In the normal operation mode, delay stage 106 has its amount of delay adjusted under the control of delay control circuit 107, and delays and outputs the output signal of clock buffer 102 applied through multiplexer 102. Therefore, clock generating circuit 100 operates as a DLL. Clock distributing circuit 95 transmits the clock signal applied through multiplexers 109 and 110 and clock driver 111, to input buffers included in peripheral pad group 4*a*. Phase difference detecting circuit 105 detects a phase difference between the output signal of clock input buffer 102*a* and the output signal of variable delay circuit 104, and adjusts the amount of delay of delay stage 106 through delay control circuit 107 so that the phase difference attains 0.

Clock input buffer 102*a* and replica buffer 103 have the same signal propagation characteristic. Variable delay circuit 104 provides substantially the same amount of delay as the amount of delay over the signal propagation path from clock input pad 101*a* to clock input buffer 102*a* and over the signal propagation path from clock input buffer 102*a* to phase difference detecting circuit 105. Therefore, the signal applied to clock input buffer 102*a*, that is, the external clock signal CLK and the clock signal applied from clock distributing circuit 95 to replica buffer 103 come to have the same phase. The signal applied from clock distributing circuit 95 to the replica buffer 103 is the signal from the clock signal output node provided at the nearest position in the clock generating circuit, which is in phase with the clock signal applied to the input buffers included in the peripheral pad group 4*a*. Therefore, in the arrangement shown in FIG. 25, the external clock signal CLK and the clock signals applied to the input buffers included in the peripheral pad group 4*a* from clock distributing circuit 95 come to have the same phase. Multiplexer 114 selects and applies to driver 115 the clock signal from clock input driver 102*a*. Therefore, the internal circuitry such as the control circuit operates in synchronization with the external clock signal applied from driver 115. The circuits included in the internal circuitry generate various control signals using the clock signal applied from clock driver 115 as a basic timing signal.

The external clock signal CLK and the clock signals applied to the input buffers included in the peripheral pad group 4*a* from clock distributing circuit 95 are in phase with each other, and therefore there is no problem even if the external clock signal CLK is applied to the internal circuitry through clock input buffer 102*a*, multiplexer 114 and clock driver 115.

Figure 26A:
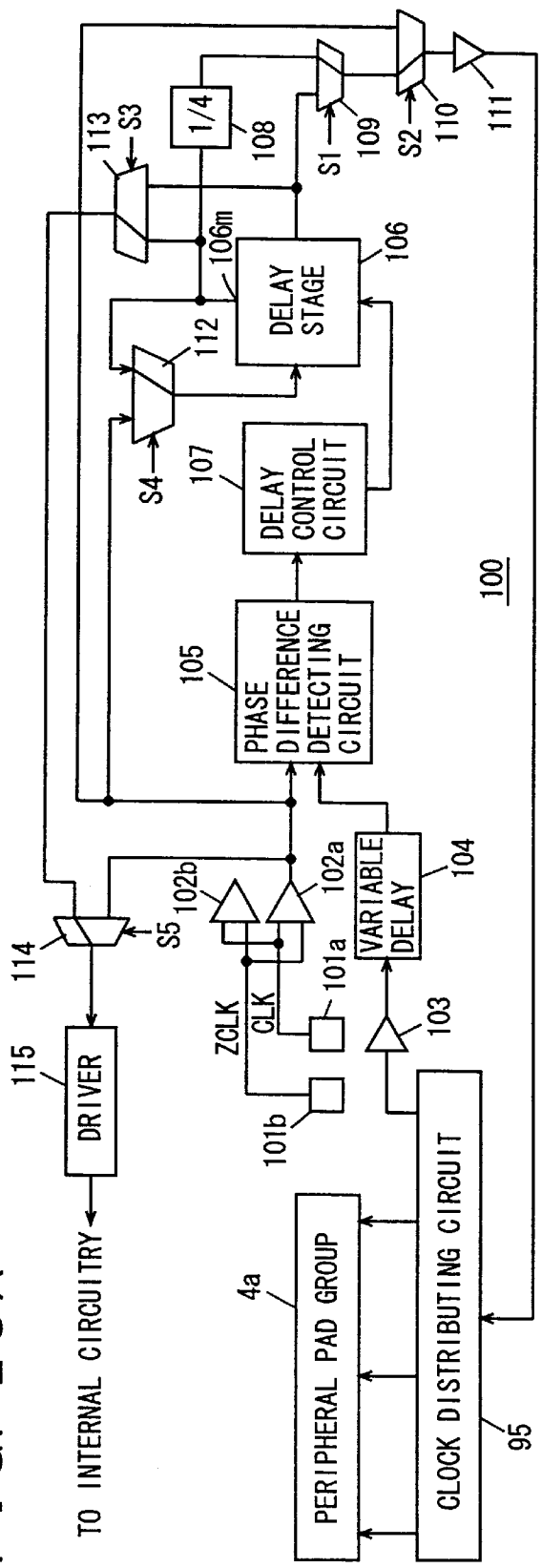
FIG. 26A represents a manner of clock selection in a test mode of the clock genera ting circuit shown in FIG. 20.

Referring to FIG. 26A, the manner of connection of the clock generating circuit in the test mode will be described. In the test mode, multiplexer 109 selects the output signal from frequency-dividing circuit 108, and multiplexer 110 selects the output signal from multiplexer 109. Further, multiplexer 112 selects and transmits to an input portion of delay stage 106 the output signal from output node 106*m* of the delay element at the center of the delay stage 106, in accordance with the selecting signal S4. Multiplexer 113 selects and applies to multiplexer 114 the output signal from output node 106*m* of the delay element at the center of delay stage 106, in accordance with the selecting signal S3. Multiplexer 114 selects and applies to clock driver 115 the clock signal applied from multiplexer 113 in accordance with the selecting signal S5.

In the connection arrangement of the multiplexers, delay stage 106 has a signal at output node 106*m* of the central delay element fed back to an input portion through multiplexer 112, whereby one ring oscillator is formed.

Figure 26B:
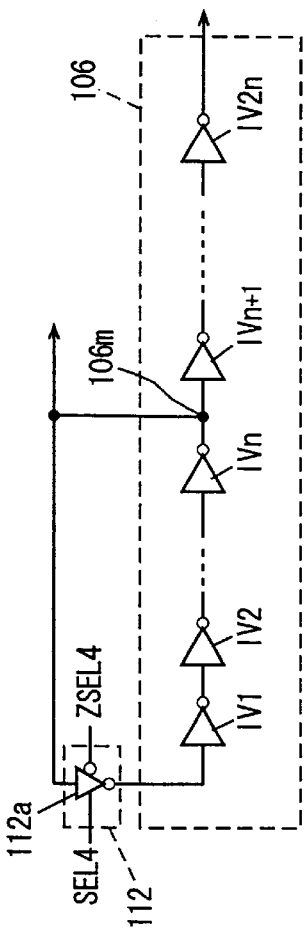
FIG. 26B represents connection of a delay stage of FIG. 26A.

FIG. 26B represents a manner of connection of delay stage 106 in the test operation mode. Referring to FIG. 26B, delay stage 106 includes cascaded 2*n* inverters IV1 to IV2n. The output node 106*m* of the central delay elements IVn is connected to an input of tristate inverter buffer 112*a* included in multiplexer 112. Tristate inverter buffer 112*a* is rendered operative in the test operation mode in accordance with the selecting signal SEL4, and the tristate inverter buffer inverts the signal at node 106*m* and transmits the inverted signal to the input portion of inverter IV1 in the first stage of the delay stage 106. Operational current of inverters IV1 to IV2n of delay stage 106 is adjusted under the control of delay control circuit 107, so that the delay amount thereof is adjusted. Accordingly, as node 106*m* is connected to the input portion of inverter IV1 of initial stage by means of multiplexer 112, odd stages of inverters including inverters IV1 to IVn and tristate inverter buffer 112*a* are connected in a ring, providing a ring oscillator. By selecting the node 106*m* at the central portion, it becomes possible to make equal the phase difference between an input signal and an output signal when the delay stage 106 operates as a DLL, with the phase difference between an input signal and an output signal when the delay stage 106 operates as a ring oscillator.

The signal from node 106m of delay stage 106 is divided for example, by 4 by the frequency dividing circuit 108 so that the signal has one-fourth times the frequency. The frequency-divided clock signal is applied through multiplexers 109 and 110 to clock driver 111. Clock distributing circuit 95 operates the buffers included in the peripheral pad group 4a at the same frequency as the frequency-divided clock signal. Phase difference detecting circuit 105 adjusts the amount of delay of delay stage 106 by means of delay control circuit 107 so that the phase difference between signals applied to the input portion thereof attains 0. Therefore, the clock signal output from node 106m of delay stage 106 has its phase adjusted such that the external clock signal CLK and the clock signals applied to the input buffers included in the peripheral pad group 4a from clock distributing circuit 95 have the same phase.

The signal from node 106m of delay stage 106 is applied through multiplexers 113 and 114 to clock driver 115. Therefore, the internal circuitry operates in accordance with the clock signal having four times the frequency of the external clock signal CLK. Therefore, even when a tester for testing a semiconductor memory device operating at 30 MHz is used as an external test apparatus, the inside of the semiconductor memory device operates in accordance with the clock signal of 120 MHz. Therefore, it is possible to test a semiconductor memory device operating at high speed by using a tester which has been used for low speed semiconductor memory devices.

In the arrangement of FIG. 26A, the signals from multiplexers 113 and 114 and from node 106m of delay stage 106 are selected and applied to clock driver 115. The clock signal from node 106m of delay stage 106 is advanced in phase than external clock signal CLK. Therefore, in this case, a delay tree having the same delay time as the delay time over the path of clock driver 111 and clock distributing circuit 95 may be connected to driver 115 in the test mode.

Further, when such a configuration that multiplexer 114 selects the output signal of multiplexer 113 in the normal operation mode and in the test operation mode is adopted, a signal synchronized in phase with the external clock signal can be applied as a basic clock signal providing the basic timing of control signal to the internal circuitry, by applying a signal to clock driver 115 through the same delay tree in the normal operation mode and in the test operation mode.

Further, as multiplexer 114 has such a structure that one of the output signal from clock input buffer 102a and the clock signal from multiplexer 113 is selected, adjustment of delay of the internal clock signal relative to the external clock signal CLK and measurement of operation timing margin are possible. The same is true for multiplexer 110 selecting a signal from clock input buffer 102a in accordance with the selecting signal S2, and measurement of operation timing margin of the internal circuitry with respect to the external clock signal CLK is possible.

A clock generating circuit having the DLL configuration is used and modified into PLL configuration in the test mode. This is because when the PLL configuration is used, the range of locking is fixed, and therefore it is not possible to constantly obtain an oscillation frequency corresponding to both 30 MHz and 120 MHz, for example. When a DLL is used, what is necessary is mere the phase adjustment of the external clock signal CLK, and it is possible to generate an internal clock signal in accordance with the frequency of the external clock signal CLK.

The output signal from node 106m of delay stage 106 has four times the frequency of external clock signal CLK, and converted to the clock signal of ¼ times frequency by frequency divider 108. Therefore, in the clock distributing circuit 95, the clock signal with the same frequency as the external clock signal CLK is provided to enable input of the control signals and address signals. On the other hand, in the internal circuits, a frequency of four times that of the external clock signal CLK is selected and applied through multiplexers 113 and 114. Therefore, even when the external test apparatus generates necessary signals at the same timing as in testing low speed memory devices, the semiconductor memory device operates at a frequency faster of four times, and therefore it is possible to test the high speed semiconductor memory device by using a low speed test apparatus.

As described above, according to the fifth embodiment of the present invention, the clock signals applied to the clock generating circuit and to the internal circuits are changed for the normal operation mode and the test operation mode. Therefore, it is possible to operate internal circuits in accordance with the operation frequency of the external test apparatus, and therefore it becomes possible to test a semiconductor memory device operating at a high speed by a low speed test apparatus.

As to the selecting signals defining the connection path of the multiplexers, a configuration can be used in which logic states of selecting signals S1 to S5 are selected fixedly in the test mode period by an internal control circuit (such as a command register) in accordance with a test mode designating signal, when the test mode is designated by the test mode designating signal.

Sixth Embodiment

Figure 27:
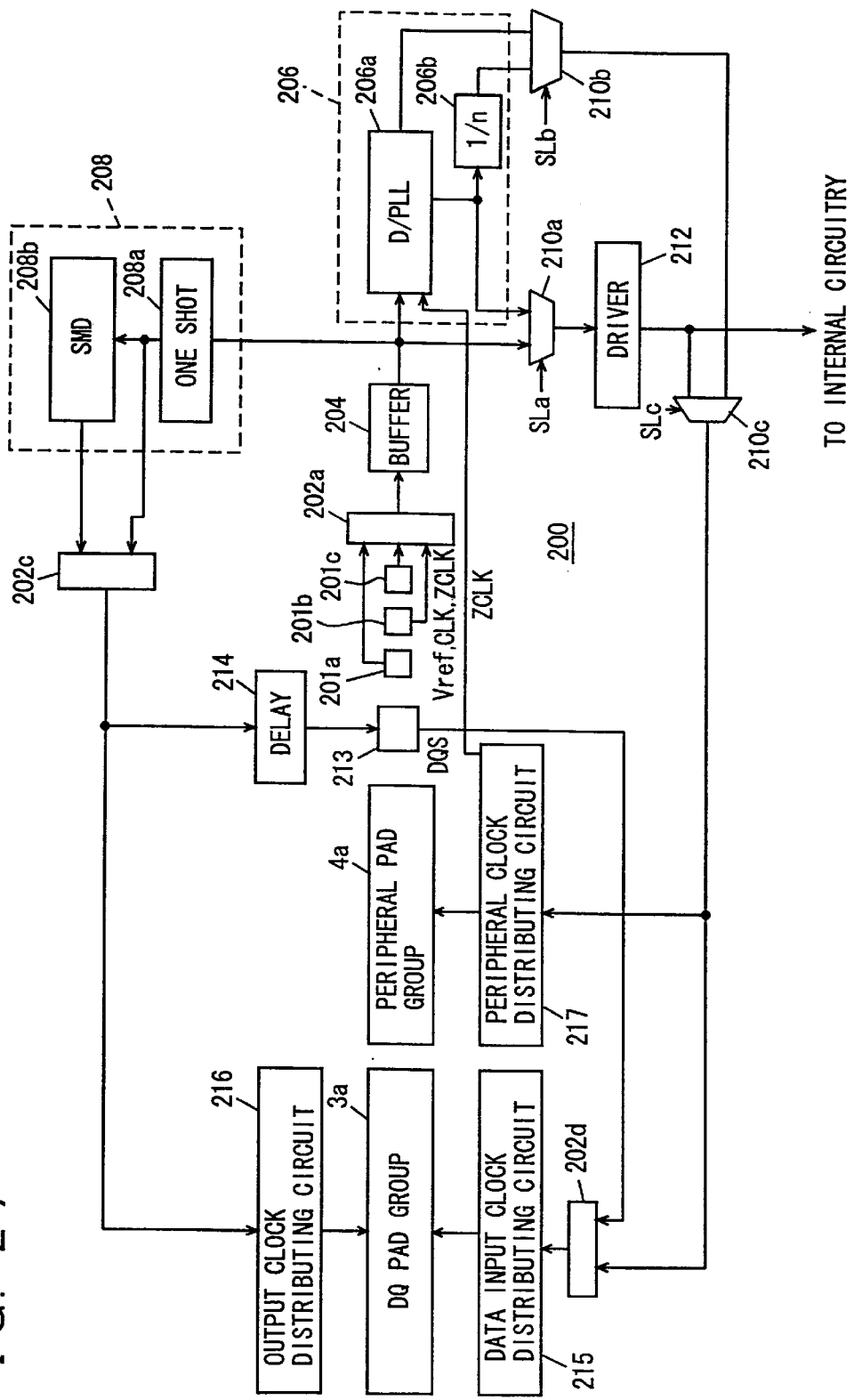
FIG. 27 is a schematic diagram representing a configuration of a main portion of the semiconductor memory device in accordance with a sixth embodiment of the present invention.

FIG. 27 represents a configuration of a main portion of a semiconductor memory device in accordance with a sixth embodiment of the present invention. Referring to FIG. 27, a clock generating portion 200 includes: a selector 202a receiving a reference voltage Vref applied to a pad 201a and clock signals CLK and ZCLK complementary to each other applied to pads 201b and 201c, respectively, for setting the clock to a single clock or differential clocks; a clock input buffer 204 for generating a clock signal in accordance with a signal/voltage applied from a selector 202a; an input clock generating circuit 206 generating an input clock signal in accordance with the clock signal from clock input buffer 204; and an output clock generating circuit 208 generating a data output clock signal in accordance with the clock signal from clock input buffer 204.

Input clock generating circuit 206 includes a synchronizing circuit 206a set to DLL or PLL in accordance with the operation mode, and a frequency dividing circuit 206b for dividing a frequency of the oscillating signal by n when the synchronizing circuit 206a operates as a PLL as described with reference to the fifth embodiment above. Output clock generating circuit 208 includes a one shot pulse generating circuit 208a generating a one shot pulse signal in synchronization with a rise of the clock signal from buffer 204, and a synchronizing circuit (SMD) 208b performing, synchronizing operation in accordance with the pulse signal from one shot pulse generating circuit 208a.

Clock generating portion 200 further includes: a multiplexer 210a for selecting one of the clock signal output from clock input buffer 204 and the frequency-multiplied clock signal output from synchronizing circuit 206a, in accordance with a selecting signal SLa; a multiplexer 210b selecting one of the output signal from frequency dividing circuit 206b and an output signal from a delay stage (DLL) of synchronizing circuit 206a in accordance with a selecting signal SLb; a clock driver 212 generating an internal clock signal transmitted to the internal circuitry with a large driving power, in accordance with the output signal from multiplexer 210a; and a multiplexer 210c selecting one of the output signal from clock driver 212 and the clock signal from multiplexer 210b in accordance with a selecting signal SLc. In the normal, operation mode, multiplexer 210a selects and applies to driver 212 the clock signal from clock input buffer 204, and in the test operation mode, selects and applies to clock driver 212 the frequency-multiplied clock signal from synchronizing circuit 206a.

In the test mode, multiplexer 210b selects the signal from frequency dividing circuit 206b, and in the normal operation mode, selects the clock signal from synchronizing circuit 206a (see the fifth embodiment).

The clock generating portion 200 further includes: a selector 202c selecting one of two different clock signals from output clock generating circuit 208; a delay circuit 214 delaying the clock signal from selector 202c by a prescribed time period and applying the delayed signal to a pad portion 213 for inputting/outputting data input/output strobe signal; and a selector 202d selecting one of the clock signal from multiplexer 210c and the data input/output strobe signal DQS applied from pad portion 213, and applying the selected signal to a data input clock distributing circuit 215 provided for the input buffer of DQ pad group 3a. The clock signal output from selector 202c is also applied to an output clock distributing circuit 216 providing al clock signal to the output buffers included in the DQ pad group 3a. The clock signal from multiplexer 210c is also applied to a peripheral clock distributing circuit 217 providing a clock signal to the input buffers included in the peripheral pad group 4a. Clock distributing circuits 215, 216 and 217 have the configuration described with respect to the first to fourth embodiments above.

Connection paths of selectors 202a, 202c and 202d are set fixedly in accordance with the specification/standard of the semiconductor memory device. The manner of connection of selectors 202a, 202c and 202d may be fixedly set by hard wires, or the connection path may be electrically switched by selecting connection of bonding wires to the pads. When the semiconductor memory device is used with the high speed clock signal or low speed clock signal, the manner of clock generation by the input/output clock generating circuits 206 and 208 is switched by utilizing the selectors 202a, 202b and 202d, dependent on presence/absence of the influence of skew among clock signals in the input/output buffer portion. Therefore, unnecessary current consumption is prevented and optimal operation in accordance with the clock frequency used is realized. Further, one chip can accommodate a plurality of different external clock signals.

Figure 28:
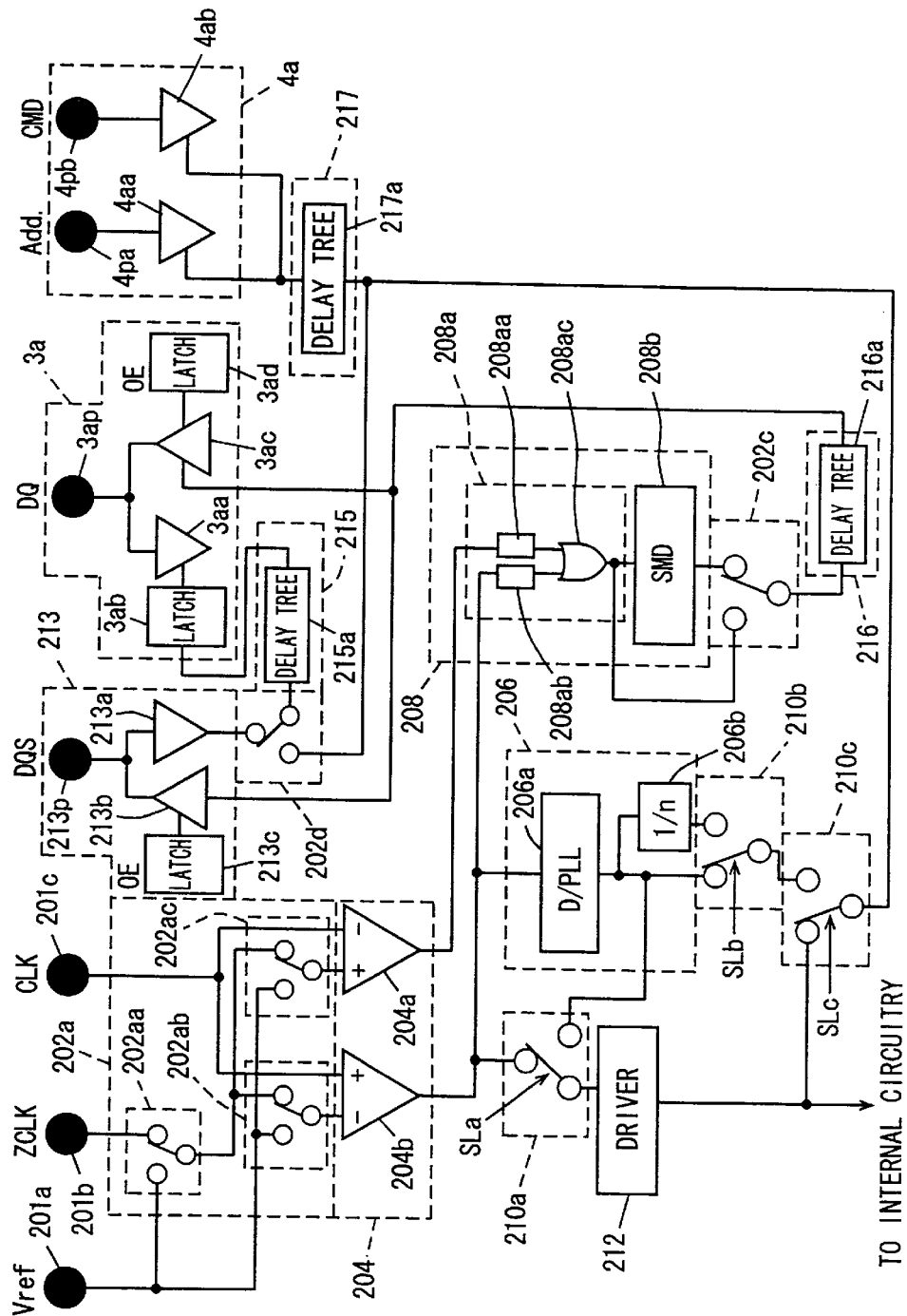
FIG. 28 specifically represents the configuration of FIG. 27.

FIG. 28 represents in greater detail the configuration of the clock generating portion shown in FIG. 27. Referring to FIG. 28, selector 202a includes a selecting circuit 202aa selecting one of the reference voltage Vref applied to pad 201a and the clock signal ZCLK applied to pad 201b; a selecting circuit 202ab selecting one of the output signal/voltage of selecting circuit 202aa and the reference voltage Vref; and a selecting circuit 202ac selecting one of the output signal from selecting circuit 202ab and the reference voltage Vref. The clock signal CLK applied to pad 201c and the clock signal ZCLK applied to pad 201b are complementary to each other. Dependent on whether the internal operation timing is determined by using the complementary clock signals CLK and ZCLK or the internal operation timing is defined by using only the clock signal CLK, the connection paths of selecting circuits 202aa to 202ac included in the selector 202a are determined. At the time of mounting the chip, the system in which the semiconductor memory device is used is defined. Therefore, connection paths of these selecting circuits 202aa to 202ac are set fixedly. Reference voltage Vref is used as a voltage for determining the H level/L level of clock signals CLK and ZCLK.

Clock input buffer 204 includes a differential amplifying circuit 204a receiving the clock signal CLK from pad 201c at a negative input and the output signal from selecting circuit 202ac at a positive input, and a differential amplifying circuit 204b receiving the clock signal CLK at a positive input and the output signal from selecting circuit 202ab at a negative input. As differential amplifying circuits 204a and 204b are used as a buffer, even when the clock signal CLK has a small amplitude, it is possible to determine the high level/low level using the reference voltage Vref and to generate a clock signal defining an accurate internal operation timing.

One shot pulse generating circuit 208a of output clock generating circuit 208 includes a pulse generating circuit 208aa generating a one shot pulse in response to a rise of the output signal of differential amplifying circuit 204a, a pulse generating circuit 208ab generating a one shot pulse signal in synchronization with a rise of the output signal of differential amplifying circuit 204b, and an OR circuit 208ac receiving output signals of the pulse generating circuits 208aa and 208ab. Differential amplifying circuits 204a and 204b perform differential amplifying operations in mutually complementary manner, and mutually complementary signals are generated from differential amplifying circuits 204a and 204b. Accordingly, the pulses generated from pulse generating circuits 208aa and 208ab are pulse signals synchronized with the rise and fall of the clock signal CLK, and therefore the output signal from OR circuit 208ac comes to have twice the frequency of the clock signal CLK. The output signal from OR circuit 208ac is applied to synchronizing circuit (SMD) 208b and selector 202c.

The pad portion 213 for input/output of data input/output strobe signal includes a pad 213b for inputting/outputting data input/output strobe signal DQS, a buffer 213a receiving the data input/output strobe signal DQS applied to pad 213p, and an output buffer 213b activated when an output enable signal OE latched in a latch 213c is activated, for transmitting the clock signal applied through a delay tree 216a to pad 213p. An output signal from input buffer 213a is applied to selector 202d.

In DQ pad group 3a, a configuration of a portion related to one DQ pad 3ap is represented. DQ pad group 3a includes: a latch 3ab latching a clock signal applied through a delay tree 215a of a prescribed path included in data input clock distributing circuit 215; an input buffer 3aa activated/inactivated in accordance with the latched signal in latch circuit 3ab for taking a signal applied to pad 3ap; an output buffer 3ac buffering internal data and transmitting to pad 3ap in synchronization with a clock applied through a delay tree 216a of a prescribed path included in output clock distributing circuit 216; and a latch 3ad latching the output enable signal OE to set the buffer 3ac to the operative state.

In the configuration shown in FIG. 28, the clock signal is applied through delay tree 216a included in output clock distributing circuit 216a to data input/output strobe pad portion 213 and to DQ pad portion 3a. The reason for this is that DQ pad 3ap and data input/output pad 213p are arranged adjacent to each other, and the time difference between the clocks thereto is of negligible magnitude. In FIG. 27, peripheral pad portion 4a is arranged between the pad portion 213 receiving the data input/output strobe signal DQS and DQ pad group 3a, and time difference between clock signals is not negligible, and therefore a delay circuit 214 is provided. Here, for simplicity of drawings and description, DQ pad 3ap and data input/output strobe signal input pad 213p are shown being arranged adjacent to each other.

The peripheral pad group includes a pad 4pa receiving an address signal Add, a pad 4pb receiving a command signal CMD, and input buffers 4aa and 4ab activated in synchronization with an internal clock signal applied through a delay tree 217a of a prescribed path included in the peripheral clock distributing circuit 217 for taking signals applied to pads 4pa and 4pb. The clock signal from selector 210c is transmitted to peripheral clock distributing circuit 217.

By selectively setting the connection path of the selector and of the multiplexers, clock distribution can be set in accordance with operation mode and operation environment of the semiconductor memory device. The manners of connection will be described in the following.

1: Manner of External Clock Signal

When external clock signals ZCLK and CLK complementary to each other are both used, selecting circuit 202aa selects the clock signal ZCLK applied to pad 201b, and selecting circuits 202ab and 202ac both select an output signal of selecting circuit 202aa, that is, the complementary external clock signals ZCLK. The clock signal CLK applied to pad 201c is distributed to clock input buffers 204a and 204b. Therefore, in this manner of connection, complementary clock signals making transitions in synchronization with the crossing portion between clock signals CLK and ZCLK are output from differential amplifying circuits 204a and 204b.

When selecting circuit 202aa selects the reference voltage Vref applied to pad 201a, selecting circuits 202ab and 202ac also select the reference voltage Vref. In this case, complementary internal clock signals are generated based on comparison between clock signal CLK and reference voltage Vref Therefore, by the manner of connection of the selecting circuits 202aa to 202ac, it becomes possible to cope with a system using a single clock signal CLK and a system using complementary clock signals CLK and ZCLK.

Selecting circuits 202ab and 202ac are provided for surely selecting the reference voltage Vref and complementary clock signal ZCLK, and the selecting circuits 202ab and 202ac are not indispensable.

2: Low Speed Operation

As can be seen from the connection paths of the selectors and multiplexers in FIG. 28, in an initial state (default state), the semiconductor memory device is designated to be in a low speed operation mode. In this state, multiplexer 210a selects and applies to clock driver 212 the output signal of clock input buffer 204b. Multiplexer 210b selects the output signal of synchronizing circuit (D/PLL) 206a. Selector 210c selects an output clock signal from clock driver 212. Selector 202c selects and applies to output clock distributing circuit 216 the output signal of synchronizing circuit (SMD) 208b. Selector 202d selects the output signal of input buffer 213a included in the input pad portion 213 for the data input/output strobe signal.

When selector 202d selects the output signal of input buffer 213a, input buffer 3aa included in DQ pad portion 3a executes the data input operation, in accordance with the external data input/output strobe signal DQS. This state corresponds to the configuration in which the DQ pad portion performs both data input and data output. When a pad portion for data input and a pad portion for data output are provided separately as the DQ pad portion, selector 202d selects the internal clock signal from selector 210c. In the configuration of a DQ common data input/output pad portion, connection path of selector 202d is set to accurately latch an external write signal (so as to prevent collision of data input and data output).

In the connection path shown in FIG. 28, the clock signal from clock driver 212 is selected by selector 210c and applied through a delay tree 217a to peripheral pad portion 4a. The clock signal generated by input clock generating circuit 206 is not used. More specifically, DLL is set to the inactive state. When the clock signal CLK applied to the semiconductor memory device has a relatively low frequency and there is sufficient operation margin. Thus even if there is an offset in timings of input signals derived from a clock skew in the input buffers, it is possible for the internal circuits to operate stably with sufficient margin. Therefore, in this state, operation of the synchronizing circuit (DLL) for ensuring accurate synchronizing operation of the input buffer is unnecessary. As to data output, the clock signal from synchronizing circuit (SMD) 208b is selected by selector 202c and applied to output buffers 3ac and 213b. It is possible for the external controller or the processor to sample data at an accurate timing.

3: Low Speed Mode 2

Figure 29:
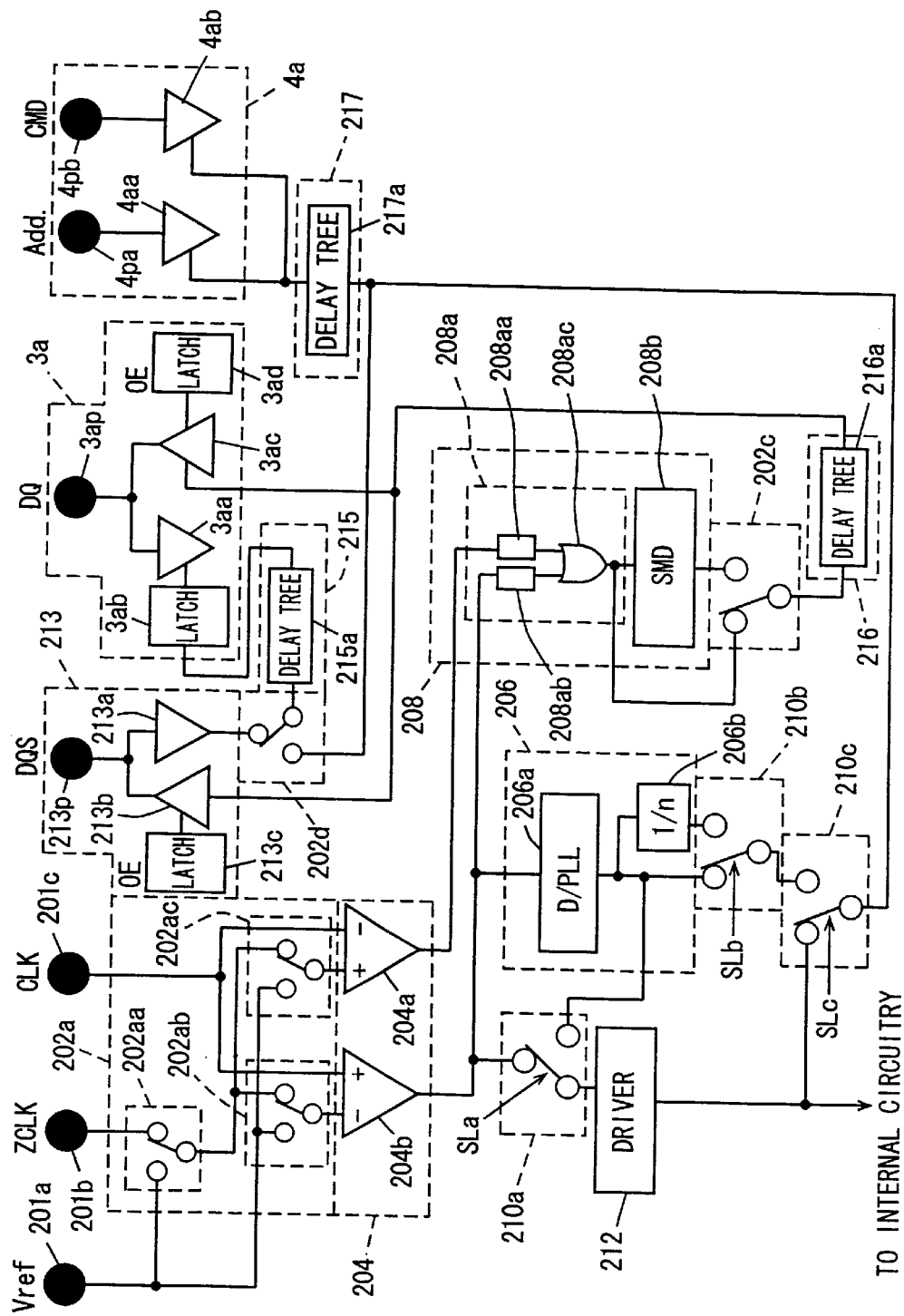
FIG. 29 represents a second manner of clock selection of the clock generating circuit shown in FIG. 28.

FIG. 29 shows another manner of clock selection in the low speed mode. Referring to FIG. 29, the selector 202c provided for output clock generating circuit 208 selects the output signal of OR circuit 208ac. Except for this point, the manner of clock selection is the same as that of FIG. 28. In the manner of clock selection shown in FIG. 29, the input of the external address signal ADD and the command signal CMD is performed in accordance with the clock signal from clock driver 212. Selector 202c selects the output signal of one shot pulse generating circuit 208a, and data output of data output buffer 3ac is in synchronization with the clock signals from clock input buffers 204a and 204b. Data input/output strobe signal DQS is generated in accordance with the output signals from clock input buffers 204a and 204b.

When the semiconductor memory device is operating at a low speed and the clock signal CLK has a low frequency, there is a sufficient operation margin with respect to the data output. Further, from the output of data by the semiconductor memory device until taking of the data by the external control unit or the processor, there is a relatively large margin. Therefore, in this case, the operation synchronizing circuit (SMD) 208b is not operated, and the data output timing is defined by the internal clock signal, that is, the external clock signal. Accordingly, for a low speed operation which is almost free from any problem caused by the clock skew, data input/output and input of external signals are performed in accordance with the external clock signal.

4: High Speed Mode

Figure 30:
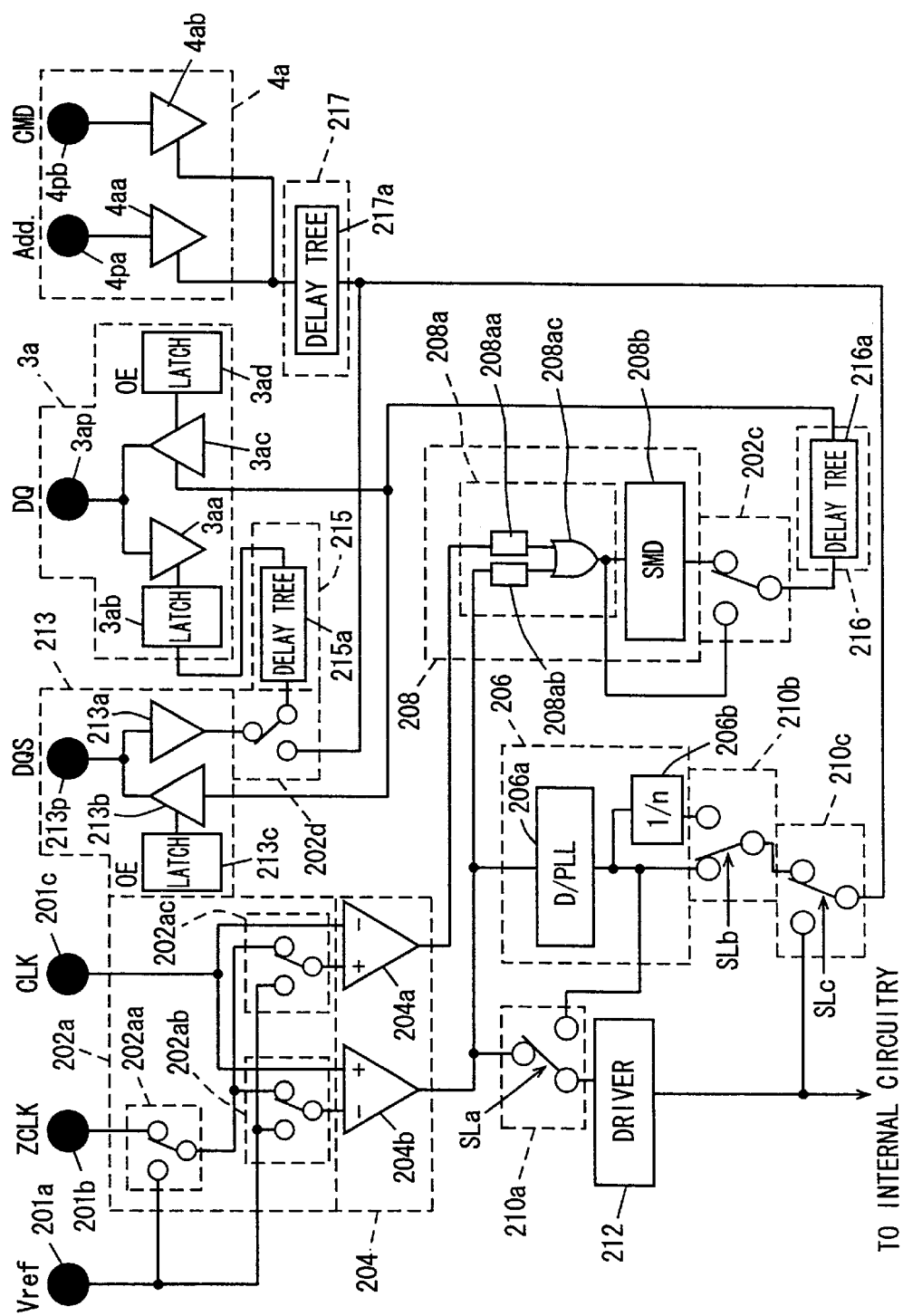
FIG. 30 represents a manner of clock selection in a high speed mode of the clock generating circuit shown in FIG. 28.

FIG. 30 shows a manner of clock selection in the high speed mode. As can be seen from FIG. 30, the clock signal from input clock generating circuit 206 is selected by multiplexer 210b and selector 210c, and operation timing of input buffers 4aa and 4ab of peripheral pad group 4a is determined. When separated DQ for data input/output configuration is used, selector 202d is set to select the clock signal from input clock generating circuit 206 selected by selector 210c.

In the input clock generating circuit, the synchronizing circuit (DLL) operates and generates a clock signal synchronized with the external clock signal. Therefore, clock skew is not generated in the input buffers, and therefore external signals can be taken in at an accurate timing. Specifically, when the clock signal CLK has high frequency and the influence of skew is significant, the internal clock signal from the synchronizing circuit (DLL) 206a is used for input of external signals.

For data output, the clock signal generated by the output synchronizing circuit (SMD) 208b is selected by selector 202c, and applied to input/output pad portion 213 and DQ pad group 3a through output clock distributing circuit 216. Therefore, it is possible to operate these output buffers at the same timing, and hence data can be output at high speed without any influence of skew.

When the external controller or the processor takes the data at the same timing as the external clock signal, it is possible to start data output operation several ns (nano seconds) before with respect to the external clock signal when the clock signal output from output synchronizing circuit (SMD) 208b is utilized. Therefore, it is possible for the external control unit or the processor to take the data at an accurate timing even in high speed operation.

5: Test Mode

Figure 31:
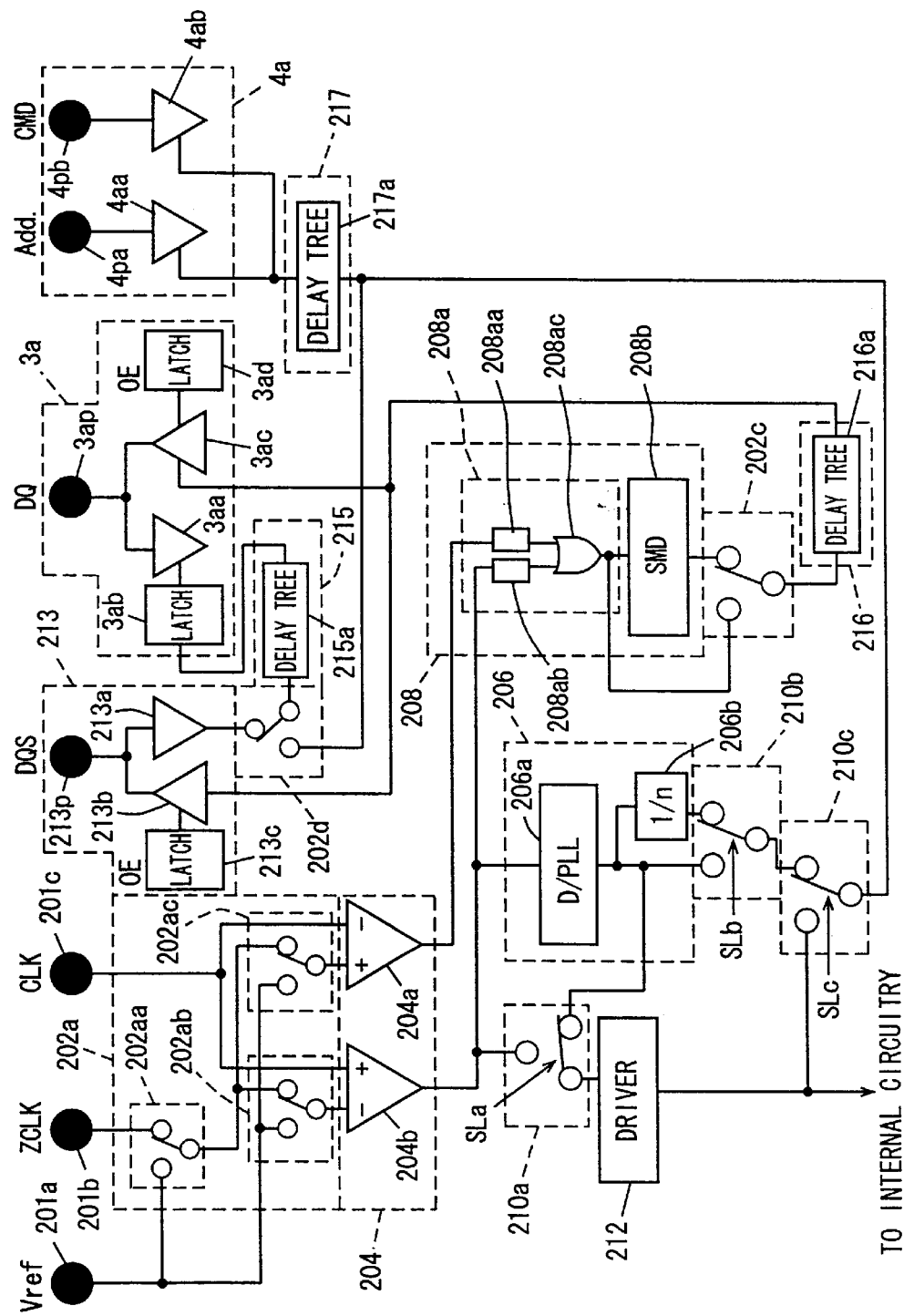
FIG. 31 represents a manner of clock selection in the test mode of the clock generating circuit shown in FIG. 27.
Figure 32:
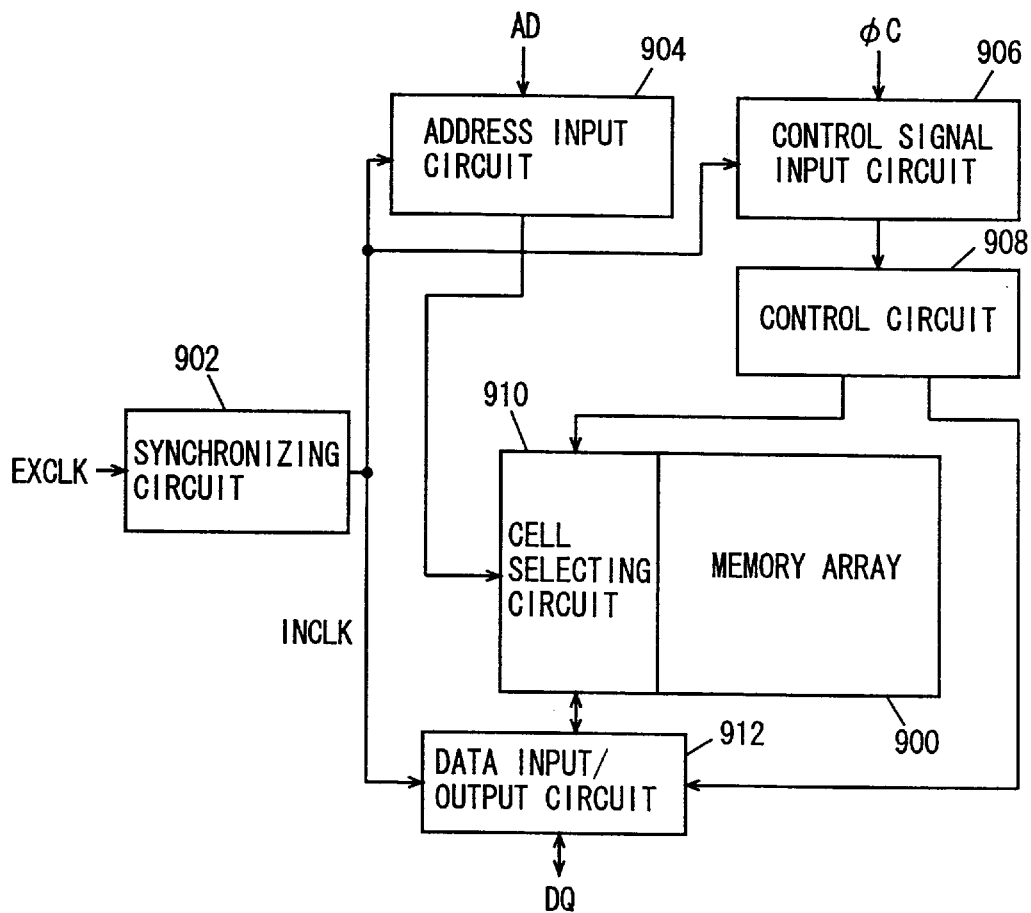
FIG. 32 is a schematic diagram representing an overall configuration of a conventional semiconductor memory device.
Figure 33:
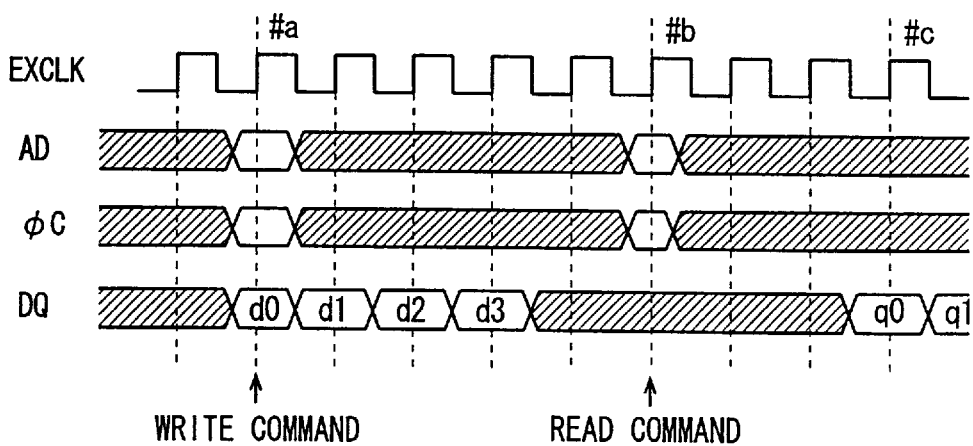
FIG. 33 is a timing chart representing an operation of a conventional synchronous semiconductor memory device.
Figure 34A:
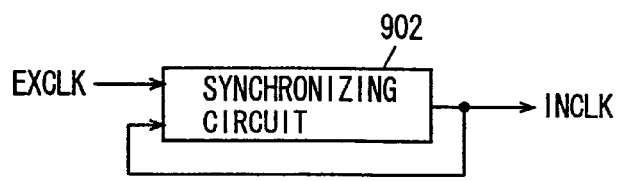
FIG. 34A represents a configuration of a conventional internal clock generating circuit.
Figure 34B:
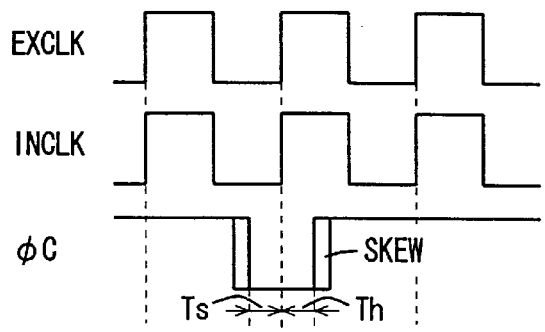
FIG. 34B is a timing chart representing an operation of the clock generating circuit shown in FIG. 34A.
Figure 35A:
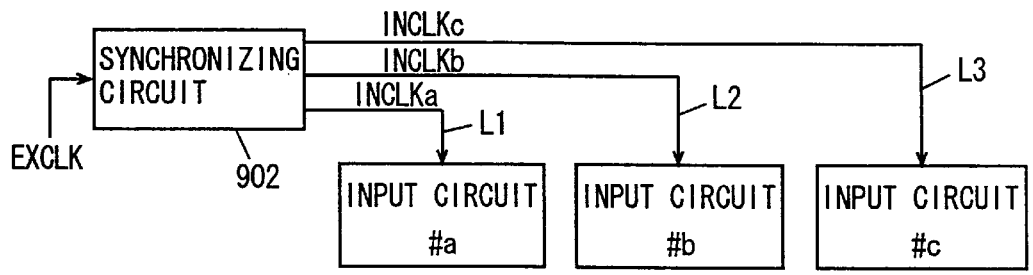
FIG. 35A represents another configuration of a conventional semiconductor circuit device.
Figure 35B:
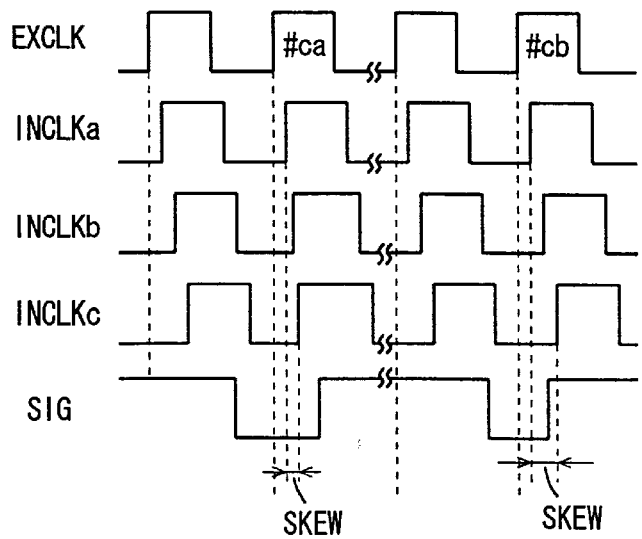
FIG. 35B is an illustration related to a problem of the circuit shown in FIG. 35A.
Figure 36A:
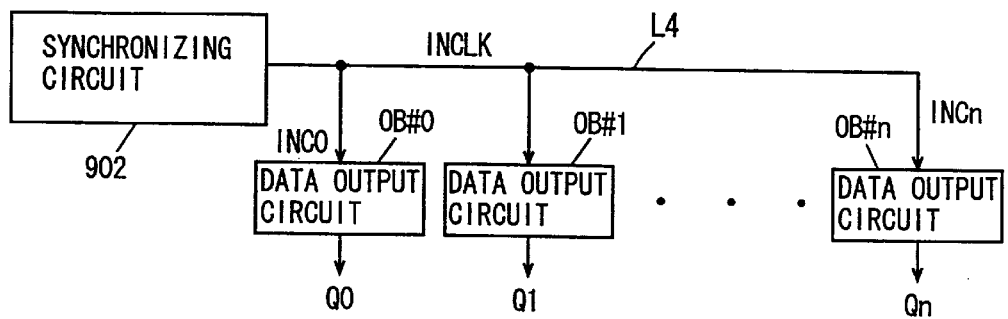
FIG. 36A schematically represents a configuration of an output portion of a conventional semiconductor circuit device.
Figure 36B:
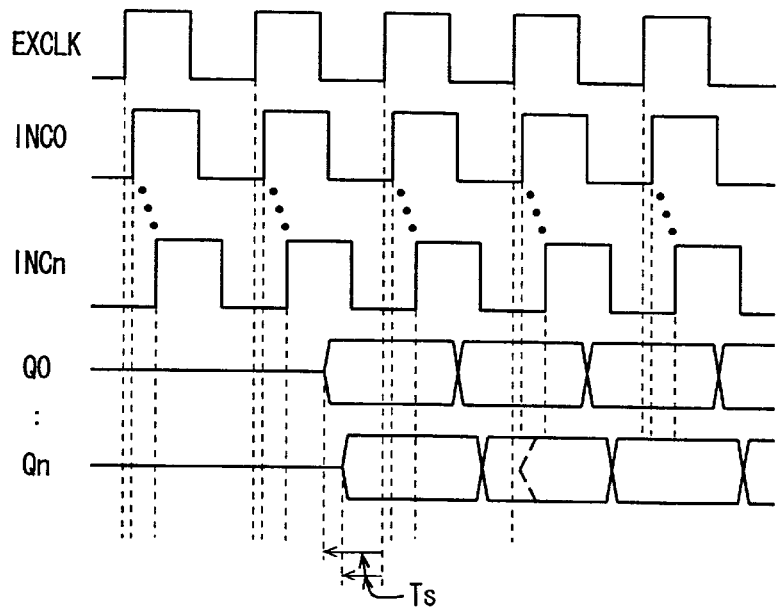
FIG. 36B represents an operation timing of the circuit shown in FIG. 36A.
Figure 37:
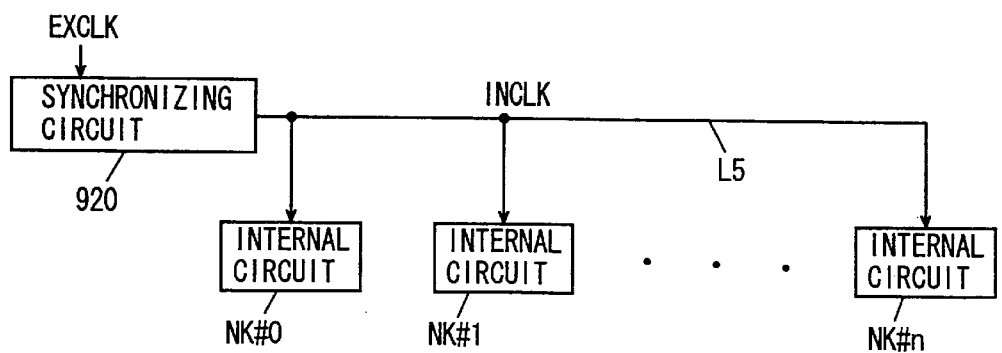
FIG. 37 schematically represents another configuration of a conventional semiconductor circuit device.
Figure 38:
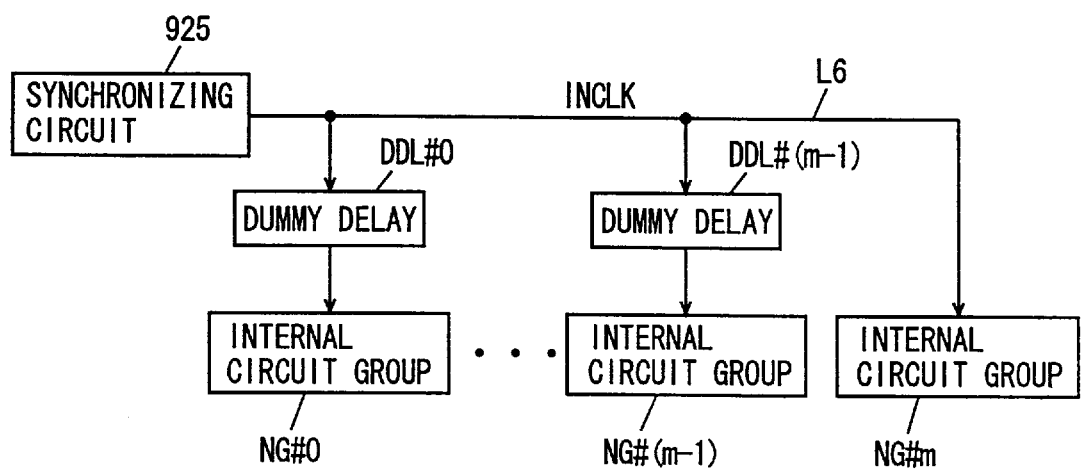
FIG. 38 schematically represents a configuration of a further clock generating device of the conventional semiconductor circuit device.

FIG. 31 shows the manner of clock selection in the test operation mode. As can be seen from FIG. 31, in the test operation mode, multiplexer 210a selects an output signal of the synchronizing circuit (D/PLL) and applies the signal to clock driver 212 in accordance with the selecting signal SLa, while multiplexer 210b selects the output signal of frequency dividing circuit 206b in accordance with the selecting signal SLb. As in the high speed mode, selector 210c selects the output signal of multiplexer 210b in accordance with the selecting signal SLc and applies the selected signal to input clock distributing circuit 217. On the other hand, selector 202c selects and applies to output clock distributing circuit 216 the output signal of synchronizing circuit (SMD) 208b.

In the test operation mode, synchronizing circuit (D/PLL) generates a signal having n times the output frequency of the frequency dividing circuit, and applies the generated signal to clock driver 212 through multiplexer 210a. Data input/output and taking of external signals are performed in accordance with the clock signal from frequency dividing circuit 206b. Therefore, data input/output and input of external signals are performed in accordance with the external clock signal CLK, while internal circuits operate at n times the frequency of the external clock signal CLK, utilizing clock driver 212.

Selector 202c may be configured to select the output signal of OR circuit 208ac in the test mode in accordance with the selecting signal.

As described above, according to the sixth embodiment of the present invention, the manner of clock selection can be set optimally in accordance with the operation environment in which the semiconductor memory device is used. Therefore, a semiconductor memory device which can cope with a plurality of different operation environments can be realized by one chip.

Other Applications

Though a semiconductor memory device has been described as an example of the semiconductor circuit device in the embodiments above, the present invention is applicable to any configuration in which an internal clock signal is generated in synchronization with an external clock signal and internal circuits operating at the same timing in synchronization with the internal clock signal are included. A synchronous integrated circuit device performing signal input/output in synchronization with a clock signal can be realized by applying a clock signal without any clock skew to the input/output buffers.

As described above, according to the present invention, the clock signal is transmitted through a clock propagation path arranged in a symmetrical tree shape, and therefore all internal circuits receive clock signals at the same timing without any phase difference. Therefore, a semiconductor circuit device operating stably without any influence of the clock skew can be realized.

Further, as a clock propagation line is formed as a loop having a forward path and a backward path with a returning point being a reference and internal clock signals are generated based on clock signals on corresponding nodes with the returning point being the reference, clock signals without any clock skew can be transmitted to internal circuits.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor circuit device, comprising:

clock generating circuitry for transmitting an internal clock signal synchronous with an externally applied external clock signal to a loop-shape clock transmission line having a forward path and a backward path, said loop-shape clock transmission line being divided into said forward path and said backward path at a returning point; and a feedback path coupled to a middle point on the forward path of said loop-shape clock transmission line for feeding back the internal clock signal being transmitted over said forward path to said clock generating circuitry, signal propagation delay of said feedback path being substantially equal to signal propagation delay from the middle point of said forward path to said returning point;

said clock generating circuitry including a circuit for adjusting a phase of said internal clock signal such that the internal clock signal transmitted through said feedback path and said external clock signal are in phase with each other.

2. The semiconductor circuit device according to claim 1, further comprising:

a clock input buffer receiving said external clock signal for application to said clock generating circuitry; and a replica buffer having a same configuration of said clock input buffer, provided on said feedback path for receiving the internal clock signal transmitted over said feedback path for application to said clock generating circuitry.

3. The semiconductor circuit device according to claim 1, further comprising:

a clock input circuit receiving said external clock signal for transmission to said clock generating circuitry; and a replica circuit provided on said feedback path, having substantially the same signal transmission characteristic as said clock input circuit, for applying a signal applied through said feedback path to said clock generating circuitry.

4. The semiconductor circuit device according to claim 1, wherein said returning point is a point providing a propagation delay of substantially half a propagation delay of a whole of said loop-shape clock transmission line.

5. The semiconductor circuit device according to claim 1, wherein said loop-shape clock transmission line transmits a clock signal to a plurality of internal circuits, and said returning point is provided corresponding to one of said plurality of internal circuits, said one being physically the farthest from said clock generating circuitry.

6. The semiconductor circuit device according to claim 1, further comprising circuitry for generating a second internal clock signal by combining internal clock signals on a node on the forward path and a node on the backward path provided at mutually symmetrical positions with respect to said returning point.

7. The semiconductor circuit device according to claim 5, further comprising:
   a plurality of first nodes provided on said forward path corresponding to said plurality of internal circuits;
   a plurality of second nodes arranged at positions symmetrical to the respective first nodes with respect to said returning point; and
   a plurality of clock reproducing circuits provided corresponding to pairs of the first and second nodes positioned at mutually symmetrical positions on said forward path and said backward path, for generating and applying to corresponding internal circuits second internal clock signals each having a central phase between internal clock signals of corresponding first and second nodes.

8. A semiconductor circuit device, comprising:
   clock generating circuitry for generating a clock signal;
   a plurality of internal circuits each operating in accordance with an applied clock signal, said plurality of internal circuits being arranged in a region between a first node of a minimum delay physically nearest to said clock generating circuitry and a second node of maximum delay physically farthest from said clock generating circuitry; and
   a clock distributing circuit including (i) a plurality of nodes arranged in a form of a tree with a node corresponding to a middle point between the first and second nodes being a starring node, each node connected to clock transmission lines extending in mutually opposite directions and (ii) clock drivers arranged corresponding to respective nodes for transmitting an applied clock signals to corresponding clock transmission lines, for transmitting the clock signal from said clock generating circuitry to said plurality of internal circuits, wherein said clock generating circuitry includes:
      a clock buffer circuit for receiving an externally applied external clock signal to produce a first internal clock signal according to the external clock signal;
      a phase comparator for comparing in phase the first internal clock signal and a feedback clock signal fed back from the clock distributing circuit;
      a delay stage for delaying a received clock for outputting;
      a delay control circuit according to an output signal of said phase comparator for adjusting a delay amount of said delay stage such that a phase difference between the first internal clock signal and the feedback clock signal becomes substantially zero;
      a frequency divider for receiving a middle signal having a delay amount of half a whole delay amount of said delay stage from said delay stage to frequency-divide the middle signal by a predetermined factor,
      a first selector responsive to a first selecting signal for selecting one of said first internal clock signal and said middle signal for application to said delay stage; and
      a first selecting circuit responsive to an operation mode designating signal for selecting one of an output signal of said frequency-divider and an output of said delay stage to generate a second internal clock signal as said clock signal.

9. The semiconductor circuit device according to claim 8, wherein said clock generating circuitry further includes
   a second selector for selecting one of said middle signal and the output signal of the delay stage in accordance with a second selecting signal;
   a third selector for selecting one of the first internal clock signal and an output signal of said second selector for application to internal circuitry as a timing control signal.

10. The semiconductor circuit device according to claim 8, wherein said first selecting circuit includes
   a second selector for selecting one of an output signal of said delay stage and an output signal of said frequency-divider in accordance with a second selecting signal included in said operation mode designating signal, and
   a third selector for selecting one of an output signal of said second selector and said first internal clock signal in accordance with a third selecting signal included in said operation mode designating signal.

11. The semiconductor circuit device according to claim 8, further comprising
   a replica buffer for providing the feedback clock signal with a delay substantially the same as a delay of said first internal clock signal relative to the external clock signal.

12. The semiconductor circuit device according to claim 8, wherein said feedback clock signal is fed back from a node physically nearest to said clock generating circuitry among said plurality of nodes.

13. The semiconductor circuit device according to claim 8, wherein said clock generating circuitry further comprises
   a pulse generator responsive to a transition of said first internal clock signal for generating a one-shot pulse signal, and
   a phase synchronizing circuit for successively delaying said one shot pulse signal to select a delayed one shot pulse signal locked in phase with the one-shot pulse signal for outputting as another clock signal.

14. A semiconductor device comprising:
   an internal clock generating circuitry for generating an internal clock signal in accordance with an external clock signal;
   a clock tree arranged on a common semiconductor substrate on the internal clock generating circuitry and including a plurality of nodes for distributing the internal clock signal from a starting point to terminal points;
   an internal control signal generator provided corresponding to a terminal point of said plurality of terminal points and responsive to a clock signal at the terminal point for generating an internal control signal for controlling an internal operation;
   said internal clock generating circuitry receiving a clock signal at a predetermined terminal point of the terminal points to adjust a phase difference between the external clock signal and the received clock signal for generating said internal clock signal.

15. The semiconductor device according to claim 14, wherein said internal clock signal is transmitted from a minimum delay point to a maximum delay point, said starting point is at a middle point between said maximum delay point and said minimum delay point, said nodes of the clock tree are arranged in a plurality of stages, and each stage includes a branching node for a starting node to a succeeding stage, said branching node being located at a middle point between a corresponding starting node and the maximum delay point.

16. The semiconductor device according to claim 14, wherein said internal clock generating circuitry includes a clock buffer for receiving and buffering the externally applied external clock signal, and an internal clock generator receiving an output clock signal to generate said internal clock signal, said internal clock generator receives the clock signal through a replica circuit having a common transmission characteristics as said clock buffer to compare the received clock signal and the output clock signal received from the clock buffer.

17. The semiconductor device according to claim 14, wherein the node of the each stage of said clock tree is provided with a clock driver for buffering a received clock signal.

18. The semiconductor device according to claim 14, further comprising an internal signal latch circuit for latching an externally applied input signal in response to said internal control signal.

19. The semiconductor device according to claim 18, wherein said internal clock signal generating circuitry includes a feedback circuit having a same transfer characteristics as a signal transmission delay from the terminal point to a corresponding internal signal latch circuit, for transferring the clock signal at the predetermined terminal point, and an internal clock generating circuit receiving the external clock signal and an output clock signal from the feedback circuit for adjusting a phase difference between the external clock signal and the receiver output signal to generate the internal clock signal.

20. A semiconductor memory device comprising:

signal input circuitry for receiving an input signal and generating an internal signal;

latch circuitry for receiving and latching said internal signal; and control signal generating circuitry for generating an input control signal controlling taking in of said input signal by said input circuitry and a latch control signal controlling latching operation of said latch circuitry in accordance with a basic signal, said control signal generating circuitry including an adjusting circuit for compensating for a time difference between taking in of said input signal by said input circuitry and latching of said internal signal by said latch circuitry, wherein said adjusting circuit comprises delay circuitry for delaying said input control signal, by a time period corresponding to a signal propagation time of said internal signal from said input circuitry to said latch circuitry, to generate said latch control signal.

21. A semiconductor memory device comprising:

signal input circuitry for receiving an input signal and generating an internal signal;

latch circuitry for receiving and latching said internal signal; and control signal generating circuitry for generating an input control signal controlling taking in of said input signal by said input circuitry and a latch control signal controlling latching operation of said latch circuitry in accordance with a basic signal, said control signal generating circuitry including an adjusting circuit for compensating for a time difference between taking in of said input signal by said input circuitry and latching of said internal signal by said latch circuitry, wherein said adjusting circuitry comprises a delay circuit for adjusting a phase difference between said input control signal and said latch control signal.

22. A semiconductor device comprising:

adjusting circuitry for adjusting a phase difference between an external clock signal applied to an external clock input node and a feed back internal clock signal at a feed back clock node fed back from a predetermined internal clock mode receiving an internal clock signal, and generating a reference internal clock signal and a pro-external clock signal; and internal clock generating circuitry for generating said internal clock signal synchronized with said external clock signal in accordance with said reference clock signal and said pro-external clock signal;

said adjusting circuitry adjusting said phase difference such that a propagation delay of the external clock signal between the external clock input node and an input of said internal clock generating circuitry is made equal to a propagation delay of the feed back clock signal between the predetermined internal clock node and the input of the internal clock generating circuitry.

23. The semiconductor device according to claim 22, wherein said adjusting circuitry comprises:

an external clock buffer circuit for buffering said external clock signal applied to said external clock input node to generate said pro-external clock signal, and an internal clock buffer circuit being the same in configuration and size with said external clock buffer and arranged between said feed back clock signal input node and an input of said internal clock signal generating circuitry, for buffering said feed back internal clock signal.

24. The semiconductor device according to claim 23, further comprising a delay circuit formed of an interconnection line patterned into a predetermined layout form and connected between said internal clock buffer circuit and said input of said internal clock signal generating circuitry.

25. The semiconductor device according to claim 23, wherein said internal clock generating circuitry comprises, at said input, a phase comparison circuit for comparing phases of received clock signals.

26. The semiconductor device according to claim 22, wherein said predetermined internal clock node is a node on an internal clock signal transmitting line transmitting said internal clock signal from said internal clock signal generating circuitry to internal circuitry, and said internal clock is fed back through a feed back line connected between said predetermined internal clock node and said feed back clock node and arranged separately from said internal clock signal transmitting line.

27. The semiconductor device according to claim 26, wherein said predetermined internal clock node is a node at a mid-point between a physically farthest point from said internal clock signal generating circuitry of said internal clock transmitting line and said internal clock signal generating circuitry.

* * * * *